(12) United States Patent
Wakamoto

(10) Patent No.: US 11,387,160 B2
(45) Date of Patent: Jul. 12, 2022

(54) SEMICONDUCTOR APPARATUS, POWER MODULE AND POWER SUPPLY

(71) Applicant: ROHM CO., LTD., Kyoto (JP)

(72) Inventor: Keisuke Wakamoto, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 46 days.

(21) Appl. No.: 16/868,176

(22) Filed: May 6, 2020

(65) Prior Publication Data

US 2020/0266120 A1    Aug. 20, 2020

Related U.S. Application Data

(63) Continuation of application No. PCT/JP2018/030602, filed on Aug. 20, 2018.

(30) Foreign Application Priority Data

Nov. 21, 2017 (JP) .............................. JP2017-223668

(51) Int. Cl.
*H01L 23/367* (2006.01)
*H01L 23/427* (2006.01)
(Continued)

(52) U.S. Cl.
CPC ...... *H01L 23/3672* (2013.01); *H01L 21/4882* (2013.01); *H01L 23/3735* (2013.01);
(Continued)

(58) Field of Classification Search
CPC ....... H01L 21/4882; H01L 23/36–3738; H01L 23/427; H01L 23/4275;
(Continued)

(56) References Cited

U.S. PATENT DOCUMENTS 6,538,892 B2    3/2003  Smalc
6,758,262 B2    7/2004  Kawabata et al.
(Continued)

FOREIGN PATENT DOCUMENTS

DE    102011077543    12/2011
DE    102014212097    1/2015
(Continued)

OTHER PUBLICATIONS

Yamakage et al. (JP H10270616A), machine translation accessed Dec. 2, 2021 (Year: 1998).*

(Continued)

*Primary Examiner* — Andres Munoz
(74) *Attorney, Agent, or Firm* — Hamre, Schumann, Mueller & Larson, P.C.

(57) ABSTRACT

The semiconductor apparatus includes: a thermal source TS including a semiconductor device generating heat in an operating state; a thermal diffusion unit thermally connected to the thermal source TS, the thermal diffusion unit including space in a direction opposite to the thermal source; a plurality of air-cooling fin units disposed in the space of the thermal diffusion unit, one end of the plurality of fin unit is connected to the thermal diffusion unit; and a base unit connected to the thermal diffusion unit, wherein the plurality of air-cooling fin units is connected to the base unit through a plurality of thermal contact units CP1, CP2, CP3, . . . , CPn. Provide is an air-cooling type semiconductor apparatus, power module, and power supply, each having high heat dissipation performance and realizing light weight.

11 Claims, 34 Drawing Sheets

(51) Int. Cl.
*H01L 21/48* (2006.01)
*H01L 23/373* (2006.01)
*H01L 23/00* (2006.01)
*H01L 25/07* (2006.01)
*H01L 23/467* (2006.01)
*H02P 27/06* (2006.01)

(52) U.S. Cl.
CPC .......... *H01L 23/427* (2013.01); *H01L 23/467* (2013.01); *H01L 24/73* (2013.01); *H01L 25/072* (2013.01); *H01L 2224/73265* (2013.01); *H01L 2924/1033* (2013.01); *H01L 2924/10253* (2013.01); *H01L 2924/10272* (2013.01); *H01L 2924/1203* (2013.01); *H01L 2924/13055* (2013.01); *H01L 2924/13064* (2013.01); *H01L 2924/13091* (2013.01); *H01L 2924/14252* (2013.01); *H02P 27/06* (2013.01)

(58) Field of Classification Search
CPC .......... H01L 23/467–4735; H01L 24/73; H01L 25/072; H01L 25/18
See application file for complete search history.

(56) References Cited

U.S. PATENT DOCUMENTS

| | | | |
|---|---|---|---|
| 9,380,733 B2 * | 6/2016 | Nagata | ............... H01L 23/3733 |
| 2014/0374648 A1 * | 12/2014 | Tanaka | ................. C08K 3/04 |
| | | | 252/74 |

FOREIGN PATENT DOCUMENTS

| | | |
|---|---|---|
| DE | 112013006640 T5 | 10/2015 |
| JP | H10-270616 | 10/1998 |
| JP | 2001-223308 | 8/2001 |
| JP | 2002-093967 | 3/2002 |
| JP | 2003-158227 | 5/2003 |
| JP | 2004-071636 | 3/2004 |
| JP | 2009-033799 | 2/2009 |
| JP | 2009-277699 | 11/2009 |
| JP | 201249167 | 3/2012 |
| JP | 2015-7162 | 1/2015 |
| JP | 2016-072618 | 5/2016 |
| WO | 01/41520 | 6/2001 |

OTHER PUBLICATIONS

Kitagawa (JP 2002093967 A), machine translation accessed Dec. 2, 2021 (Year: 2002).*

Office Action issued for the counterpart German Patent Application No. 11 2018 005 941.3, dated Apr. 22, 2021, 32 pages including English translation.

International Search Report and Written Opinion issued in PCT/JP2018/030602, dated Sep. 25, 2018, 10 pages including English translation of International Search Report.

Office Action issued for Japanese Patent Application No. 2019-556101, dated Apr. 21, 2022, 12 pages including machine translation.

Office Action issued for German Patent Application No. 112018005941.3, dated Apr. 28, 2022, 17 pages including English translation.

* cited by examiner

FIG. 11
| AIR-COOLING FIN (BASE UNIT/FIN UNIT) | MATERIALS | THERMAL CONDUCTIVITY (W/mK) |
|---|---|---|
| | GRAPHITE | X DIRECTION: 1500, Y DIRECTION: 5, Z DIRECTION: 1500 |
| | Cu | 400 |
| | Al | 237 |
| | ALLOY | 100 |
| | Fe | 50 |
| LENGTH OF AIR-COOLING FIN LF (mm) | | 10~80 |
| SPACE OF AIR-COOLING FIN FS (mm) | | 0.5~4 |
| NUMBER OF FINS | | 61~16 |
FIG. 12A
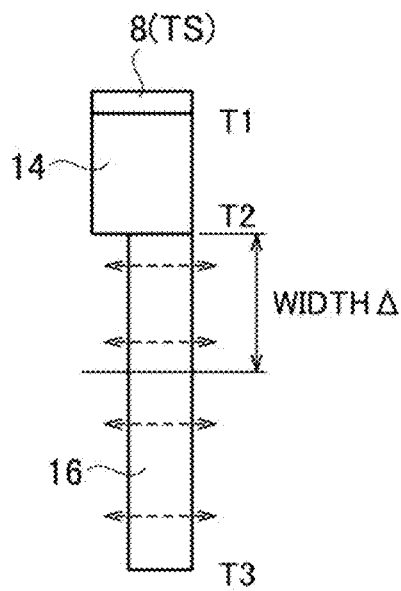
FIG. 12B
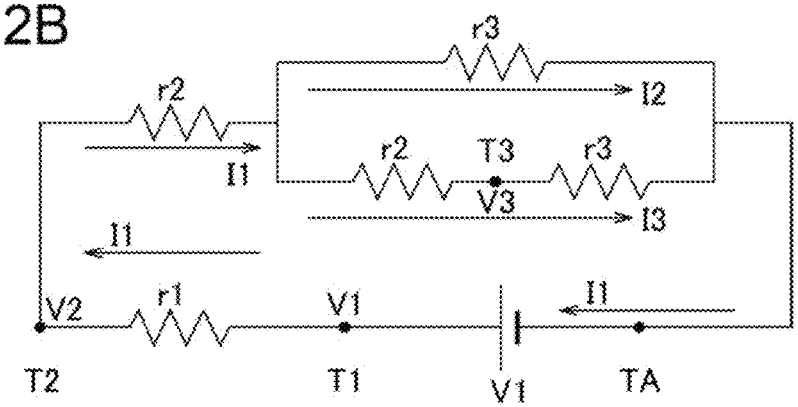

FIG. 16A
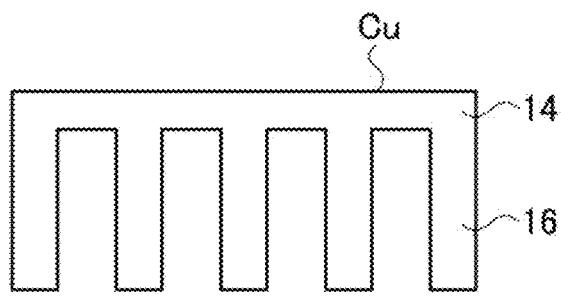
FIG. 16B
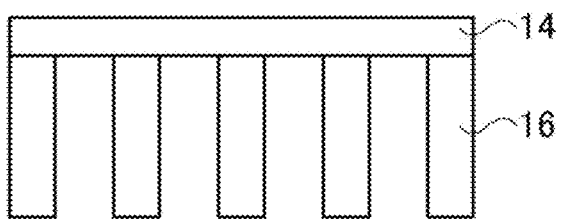
FIG. 16C
| PERFORMANCE ITEMS | GRAPHITE | Cu | Al | ALLOY | Fe |
|---|---|---|---|---|---|
| THERMAL CONDUCTIVITY (W/mK) | 1500 (HIGH) | 400 (CRITERION) | 237 (LOW) | 100 (LOW) | 50 (LOW) |
| COST OF MATERIALS | EXPENSIVE | CRITERION | CHEAP | DEPENDING ON MATERIALS | CHEAP |
| WEIGHT | LIGHT | CRITERION | LIGHT | DEPENDING ON MATERIALS | HEAVY |

FIG. 17

| | | BASE UNIT | | | |
| --- | --- | --- | --- | --- | --- |
| | | Cu | Al | ALLOY | Fe |
| | | THERMAL RESISTANCE | THERMAL RESISTANCE | THERMAL RESISTANCE | THERMAL RESISTANCE |
| AIR-COOLING FIN UNIT | Gr | 0.108 29.6%▼ | 0.111 24.6%▼ | 0.119 22.0%▼ | 0.134 11.9%▼ |
| | Cu | 0.153 CRITERION | 0.156 2.2%△ | 0.164 7.4%△ | 0.178 17.0%△ |
| | Al | 0.187 22.9%△ | 0.189 23.8%△ | 0.198 29.5%△ | 0.212 39.2%△ |
| | ALLOY | 0.272 78.5%△ | 0.273 78.8%△ | 0.282 84.5%△ | 0.296 94.3%△ |
| | Fe | 0.373 144%△ | 0.374 145%△ | 0.383 151%△ | 0.395 158%△ |

FIG. 18

| | | BASE UNIT | | | |
| --- | --- | --- | --- | --- | --- |
| | | Cu | Al | ALLOY | Fe |
| | | THERMAL RESISTANCE | THERMAL RESISTANCE | THERMAL RESISTANCE | THERMAL RESISTANCE |
| AIR-COOLING FIN UNIT | Gr | 0.096 15.3%▼ | 0.11 11.4%▼ | 0.107 5.2%▼ | 0.119 5.6%△ |
| | Cu | 0.113 CRITERION | 0.116 2.4%△ | 0.123 8.6%△ | 0.135 19.3%△ |
| | Al | 0.127 12.3%△ | 0.13 14.8%△ | 0.137 20.9%△ | 0.149 31.7%△ |
| | ALLOY | 0.168 48.5%△ | 0.17 51.3%△ | 0.177 56.6%△ | 0.19 68.0%△ |
| | Fe | 0.225 98.8%△ | 0.228 103%△ | 0.235 108%△ | 0.247 119%△ |

FIG. 19

| | | BASE UNIT | | | |
| --- | --- | --- | --- | --- | --- |
| | | Cu | Al | ALLOY | Fe |
| | | THERMAL RESISTANCE | THERMAL RESISTANCE | THERMAL RESISTANCE | THERMAL RESISTANCE |
| AIR-COOLING FIN UNIT | Gr | 0.100 4.7%▼ | 0.102 2.9%▼ | 0.108 3.2%△ | 0.119 13.7%△ |
| | Cu | 0.105 CRITERION | 0.107 1.7%△ | 0.113 7.7%△ | 0.124 18.1%△ |
| | Al | 0.11 5.0%△ | 0.112 6.6%△ | 0.118 12.5%△ | 0.129 22.8%△ |
| | ALLOY | 0.127 20.2%△ | 0.128 51.3%△ | 0.134 28.0%△ | 0.145 38.3%△ |
| | Fe | 0.153 45.6%△ | 0.154 47.0%△ | 0.16 52.8%△ | 0.171 62.6%△ |

FIG. 20

| | | BASE UNIT | | | |
| --- | --- | --- | --- | --- | --- |
| | | Cu | Al | ALLOY | Fe |
| | | THERMAL RESISTANCE | THERMAL RESISTANCE | THERMAL RESISTANCE | THERMAL RESISTANCE |
| AIR-COOLING FIN UNIT | Gr | 0.125 0.6%△ | 0.127 2.3%△ | 0.133 6.9%△ | 0.141 15.3%△ |
| | Cu | 0.124 CRITERION | 0.125 1.0%△ | 0.131 5.1%△ | 0.141 13.2%△ |
| | Al | 0.124 0.2%△ | 0.126 1.5%△ | 0.131 5.5%△ | 0.141 13.4%△ |
| | ALLOY | 0.13 4.3%△ | 0.131 5.5%△ | 0.136 9.1%△ | 0.145 16.8%△ |
| | Fe | 0.14 12.6%△ | 0.141 13.7%△ | 0.146 17.3%△ | 0.155 25.1%△ |

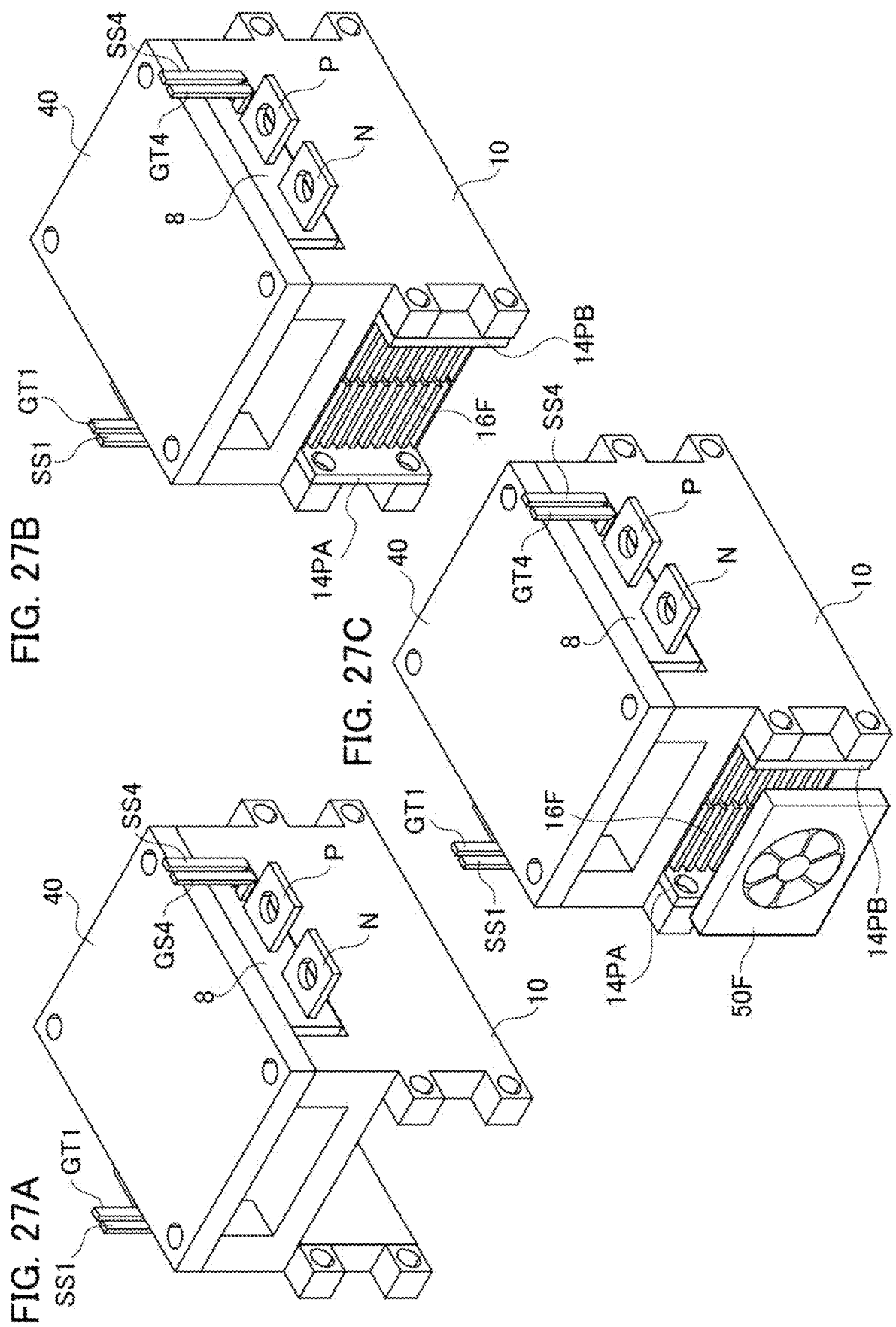

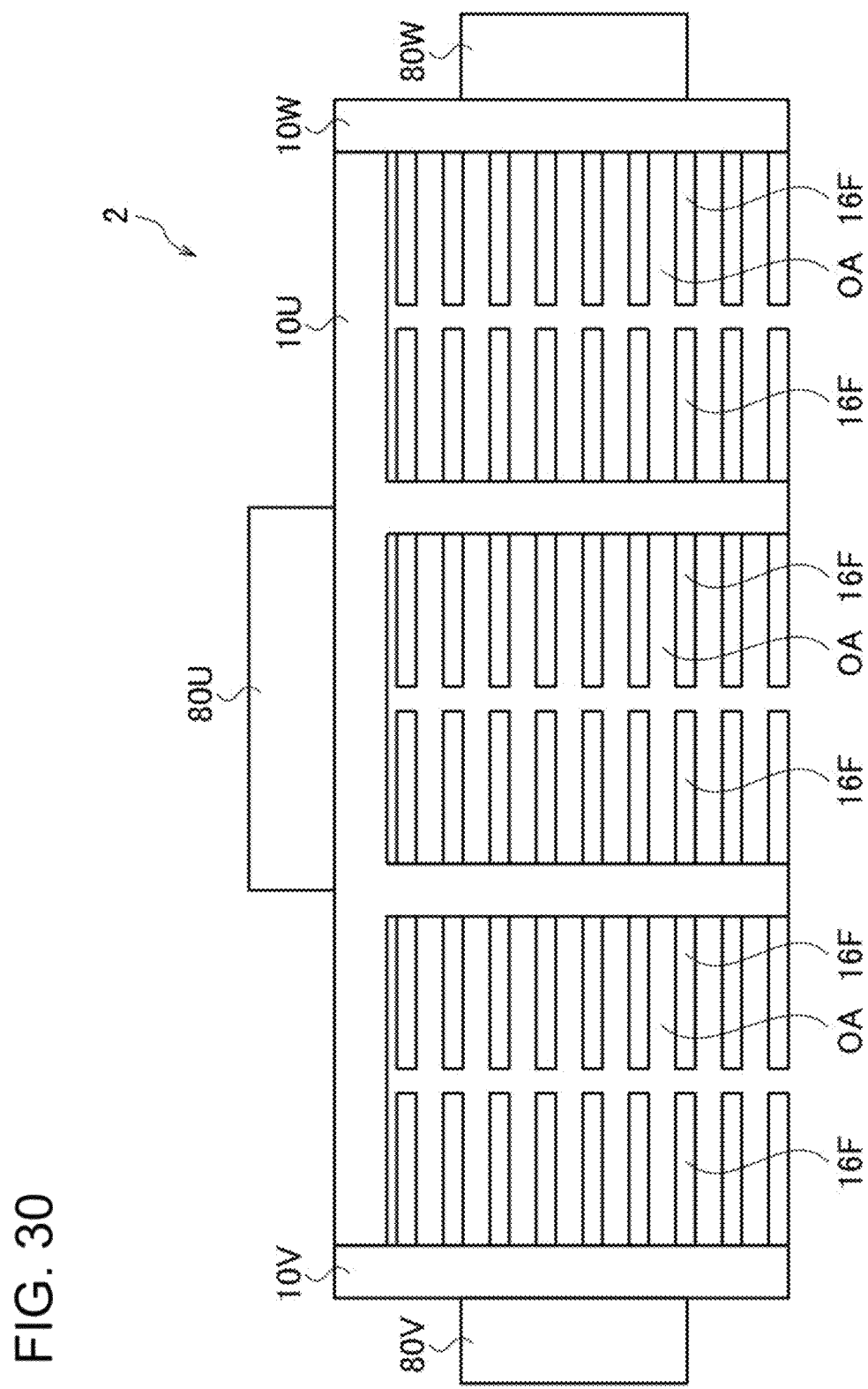

US 11,387,160 B2

SEMICONDUCTOR APPARATUS, POWER MODULE AND POWER SUPPLY

CROSS REFERENCE TO RELATED APPLICATIONS

This is a continuation application (CA) of PCT Application No. PCT/JP2018/030602, filed on Aug. 20, 2018, which claims priority to Japan Patent Application No. P2017-223668 filed on Nov. 21, 2017 and is based upon and claims the benefit of priority from prior Japanese Patent Application No. P2017-223668 filed on Nov. 21, 2017 and PCT Application No. PCT/JP2018/030602, filed on Aug. 20, 2018, the entire contents of each of which are incorporated herein by reference.

FIELD

The embodiments described herein relate a semiconductor apparatus, a power module, and a power supply.

BACKGROUND

Conventionally, as one of the power modules, there have been known power modules in which a perimeter of semiconductor device(s) including a power element(s) (chip(s)) such as Insulated Gate Bipolar Transistor (IGBT) is molded with resin.

In the operating state, it is general to make the heat radiators, e.g. the heat sink and the fin, arrange and radiate the heat to the back surface side of the substrate, and to cool the semiconductor device to the semiconductor device generates heat.

In recent years, an increase in heat generation density of electronic materials has become a problem. Consequently, in order to suppress junction temperature Tj of components to be within designed values, it is desired to improve performance of cooling apparatuses. For example, in power modules used for power conversion units of electric vehicles, water-cooling type cooling apparatuses have mainly been used as cooling apparatuses. However, the water cooling type cooling apparatuses require tanks for storing refrigerants, pumps for sending water, and the like, and therefore the whole cooling system becomes complicated and huge so that the weight thereof becomes heavy.

SUMMARY

The embodiments provide an air-cooling type semiconductor apparatus, power module, and power supply, each having high heat dissipation performance and realizing light weight.

According to one aspect of the embodiments, there is provided a semiconductor apparatus comprising: a thermal source comprising a semiconductor device, the semiconductor device generating heat in an operating state; a thermal diffusion unit thermally connected to the thermal source, the thermal diffusion unit including space in a direction opposite to the thermal source; and a plurality of fin units disposed in the space of the thermal diffusion unit, one end of the plurality of fin unit is connected to the thermal diffusion unit.

According to another aspect of the embodiments, there is provided a semiconductor apparatus comprising: a thermal source composed of a semiconductor device, the semiconductor device generating heat in an operating state; a thermal diffusion unit thermally connected to the thermal source; and a plurality of heat dissipation units connected to the thermal diffusion unit, wherein the thermal diffusion unit comprises a cooling apparatus spatially containing the heat dissipation unit.

According to still another aspect of the embodiments, there is provided a power module comprising: a thermal source comprising a semiconductor device, the semiconductor device generating heat in an operating state; a thermal diffusion unit thermally connected to the thermal source, the thermal diffusion unit including space in a direction opposite to the thermal source; and a plurality of fin units disposed in the space of the thermal diffusion unit, one end of the plurality of fin unit is connected to the thermal diffusion unit, wherein the semiconductor device comprises a configuration of any one selected from a group consisting a 1-in-1 module, a 2-in-1 module, a 4-in-1 module, a 6-in-1 module, a 7-in-1 module, an 8-in-1 module, a 12-in-1 module, and a 14-in-1 module.

According to yet aspect of the embodiments, there is provided a power supply configured to convert an input voltage and output the converted input voltage, using a semiconductor apparatus, the semiconductor apparatus comprising: a thermal source comprising a semiconductor device, the semiconductor device generating heat in an operating state; a thermal diffusion unit thermally connected to the thermal source, the thermal diffusion unit including space in a direction opposite to the thermal source; and a plurality of fin units disposed in the space of the thermal diffusion unit, one end of the plurality of fin unit is connected to the thermal diffusion unit.

According to further aspect of the embodiments, there is provided a power supply configured to convert an input voltage and output the converted input voltage, using a power module, the power module comprising: a thermal source comprising a semiconductor device, the semiconductor device generating heat in an operating state; a thermal diffusion unit thermally connected to the thermal source, the thermal diffusion unit including space in a direction opposite to the thermal source; and a plurality of fin units disposed in the space of the thermal diffusion unit, one end of the plurality of fin unit is connected to the thermal diffusion unit, wherein the semiconductor device comprises a configuration of any one selected from a group consisting a 1-in-1 module, a 2-in-1 module, a 4-in-1 module, a 6-in-1 module, a 7-in-1 module, an 8-in-1 module, a 12-in-1 module, and a 14-in-1 module.

According to the embodiments, there can be provided the air-cooling type semiconductor apparatus, power module, and power supply, each having high heat dissipation performance and realizing light weight.

BRIEF DESCRIPTION OF DRAWINGS

FIG. 11 is an explanatory diagram of each composite material applied to the thermal fluid simulation, in the semiconductor apparatus according to the embodiments.

FIG. 12A is an explanatory diagram of an equivalent thermal resistance of one air-cooling fin unit in the semiconductor apparatus according to the embodiments.

FIG. 12B is a configuration diagram of an equivalent thermal resistance circuit of one air-cooling fin unit in the semiconductor apparatus according to the embodiments.

FIG. 16A is a schematic configuration diagram when the base unit and the air-cooling fin unit are made of the same material, in the semiconductor apparatus according to the embodiments.

FIG. 16B is a schematic configuration diagram when the base unit and the air-cooling fin unit are made of materials different from each other, in the semiconductor apparatus according to the embodiments.

FIG. 16C is a diagram showing a performance list of each material of graphite, Cu, Al, alloy, and Fe, in the semiconductor apparatus according to the embodiments.

FIG. 17 shows a thermal resistance simulation result when the base unit and the air-cooling fin unit are made of materials different from each other (the length of air-cooling fin LF=80 mm), in the semiconductor apparatus according to the embodiments.

FIG. 18 shows a thermal resistance simulation result when the base unit and the air-cooling fin unit are made of materials different from each other (the length of air-cooling fin LF=40 mm), in the semiconductor apparatus according to the embodiments.

FIG. 19 shows a thermal resistance simulation result when the base unit and the air-cooling fin unit are made of materials different from each other (the length of air-cooling fin LF=20 mm), in the semiconductor apparatus according to the embodiments.

FIG. 20 shows a thermal resistance simulation result when the base unit and the air-cooling fin unit are made of materials different from each other (the length of air-cooling fin LF=10 mm), in the semiconductor apparatus according to the embodiments.

FIG. 27A is a process chart of an assembling method of the SiC PM (2-in-1) according to the embodiments, which is attaching the SiC PM to a vapor chamber.

FIG. 27B is a process chart of the assembling method of the SiC PM (2-in-1) according to the embodiments, which is attaching the air-cooling fin unit to the vapor chamber.

FIG. 27C is a process chart of the assembling method of the SiC PM (2-in-1) according to the embodiments, which is attaching a fan thereto.

FIG. 30 is a schematic cross-sectional structure diagram of another configuration example of the SiC PM (6-in-1) according to the embodiments.

DESCRIPTION OF EMBODIMENTS

Next, the embodiments will be described with reference to drawings. In the description of the following drawings, the identical or similar reference sign is attached to the identical or similar part. However, it should be noted that the drawings are schematic and therefore the relation between thickness and the plane size and the ratio of the thickness differs from an actual thing. Therefore, detailed thickness and size should be determined in consideration of the following explanation. Of course, the part from which the relation and ratio of a mutual size differ also in mutually drawings is included.

Moreover, the embodiments shown hereinafter exemplify the apparatus and method for materializing the technical idea; and the embodiments do not specify the material, shape, structure, placement, etc. of each component part as the following. The embodiments may be changed without departing from the spirit or scope of claims.

First Embodiment (Basic Technology)

Figure 1:
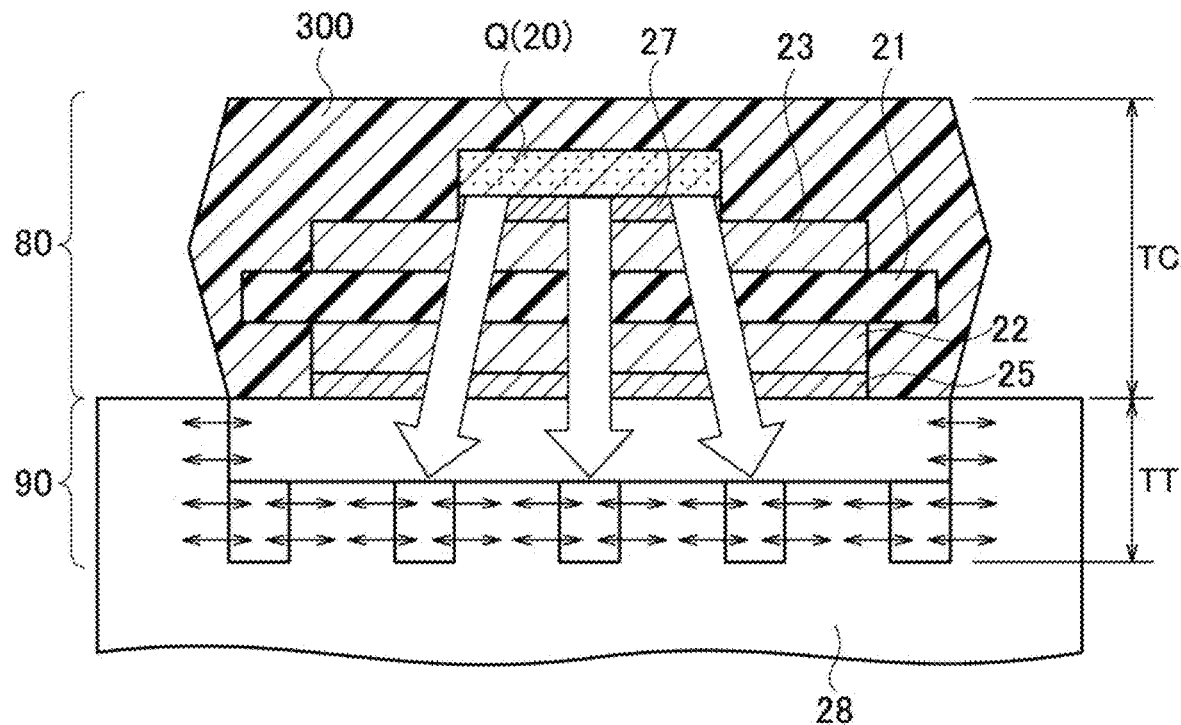
FIG. 1 is a conceptual diagram for explaining a state of a transfer of heat generated from a power module (hereinafter, also referred to as PM).

FIG. 1 shows a conceptual diagram for explaining a state of a transfer of heat generated from a PM 80. The PM 80 is mounted on a cooling apparatus 90. The cooling apparatus 90 is disposed in a refrigerant 28. The refrigerant 28 is water in a case of water cooling, or is air in a case of air cooling.

The PM 80 includes a semiconductor device Q20 corresponding to a thermal source (hereinafter referred to as TM) which generates heat in an operating state. The semiconductor device Q20 is disposed on a ceramics insulating substrate, for example. The ceramics insulating substrate can be formed with a Direct Bonding Copper (DBC) substrate, for example. In the example shown in FIG. 1, the ceramics insulating substrate includes a ceramics substrate 21, a front surface electrode layer 23 of the ceramics substrate 21, and a back surface electrode layer 22 of the ceramics substrate 21. The semiconductor device Q20 is bonded with an Ag fired layer 27 on the front surface electrode layer 23, for example. Moreover, the back surface electrode layer 22 is connected to the cooling apparatus 90 through a thermal conduction layer 25. The semiconductor device Q20 may include an IGBT, a diode, an Si based MOSFET, an SiC based MOSFET, or a GaN based FET, for example. The thermal conduction layer 25 may include any one of a thermal conduction sheet layer, a soldering layer or an Ag fired layer, for example. The PM 80 is resin-molded with a mold resin layer 300, such as a silicone resin or a polyimide resin.

Heat from the semiconductor device Q20 corresponding to the thermal source TS which generates heat in the operating state is transferred to the cooling apparatus 90 through the Ag fired layer 27, the ceramics insulating substrate (23/21/22), and the thermal conduction layer 25, as shown by the thick arrows. Furthermore, the heat from the cooling apparatus 90 is transferred to the refrigerants 28, such as water or air, as shown by the thin arrows.

Herein, the thermal resistance Rja from the semiconductor device Q20 to the refrigerant 28 is expressed by the sum total of a thermal resistance in a thermal conduction unit TC and a thermal resistance in a heat transfer unit TT.

The thermal resistance in the thermal conduction unit TC is a thermal resistance in the PM 80, and is expressed by $t/\lambda A$. Herein, t denotes a thickness of the thermal conduction unit TC, $\lambda$ denotes a heat transfer coefficient of the thermal conduction unit TC, and A denotes a heat transfer area.

The thermal resistance in the heat transfer unit TT is a thermal resistance in the cooling apparatus 90, and is expressed by $1/HA$. Herein, H denotes a heat transfer coefficient in the cooling apparatus 90.

The thermal resistance Rja is expressed by the equation (1):

$$Rja = t/\lambda A + 1/HA \quad (1)$$

Although the thermal resistance in the heat transfer unit TT of the water cooling type is lower than the thermal resistance in the thermal conduction unit TC, the thermal resistance in the thermal conduction unit TC of the air cooling type is substantially the same as the thermal resistance in the heat transfer unit TT, and is approximately 50% of the whole thermal resistance Rja.

Figure 2:
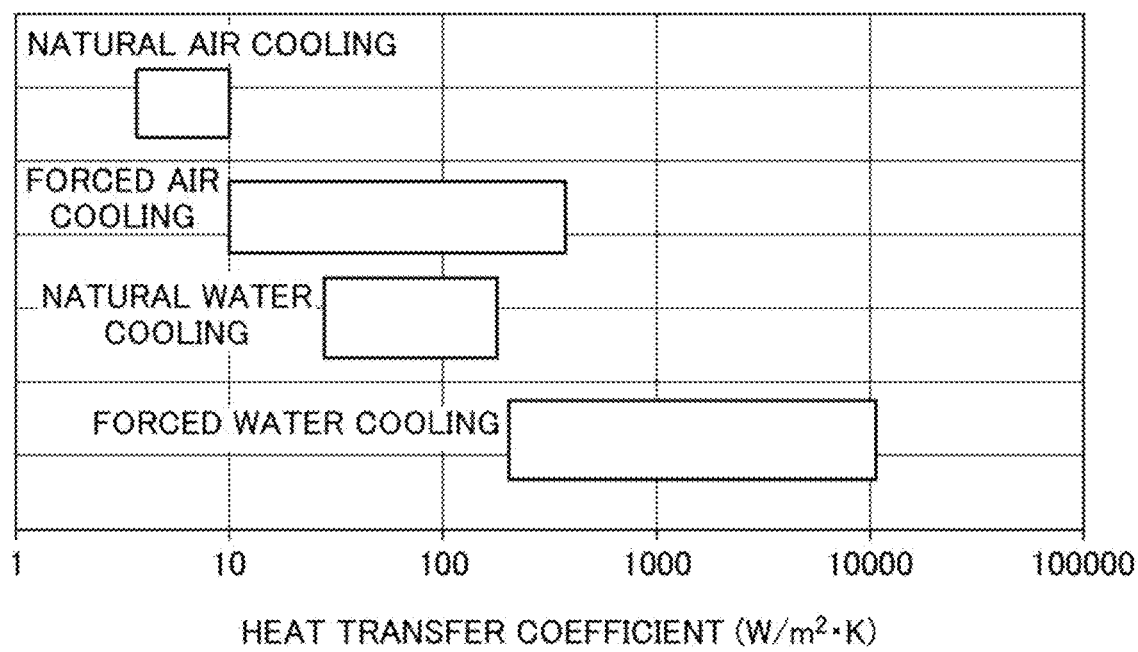
FIG. 2 is a comparative diagram of heat transfer capability according to a difference between cooling methods.

In this context, a comparison between heat transfer capabilities according to the difference in the cooling methods is expressed as shown in FIG. 2.

In the case of the air cooling type of which the refrigerant 28 is air, the heat transfer coefficient is several (W/m$^2$·K) to several hundred (W/m$^2$·K). In the case of the water cooling type of which the refrigerant 28 is water, the heat transfer coefficient is several tens of (W/m$^2$·K) to several thousand (W/m$^2$·K). The efficiency of the heat transfer of the air cooling type is lower than the efficiency of the heat transfer of the water cooling type, and the cooling performance of the air cooling type is relatively low. Moreover, since the water cooling type cooling system requires to circulate the water, the whole cooling system becomes complicated. On the other hand, the mechanism for circulating the refrigerant in the air cooling type can be greatly simplified, so that the system can be simplified as compared with that of the water cooling type. Accordingly, in order to simplify the cooling system, it is desirable to realize an air cooling type cooling apparatus having a thermal resistance value generated in the heat transfer unit as the same degree as that of the water cooling type cooling apparatus.

Figure 3:
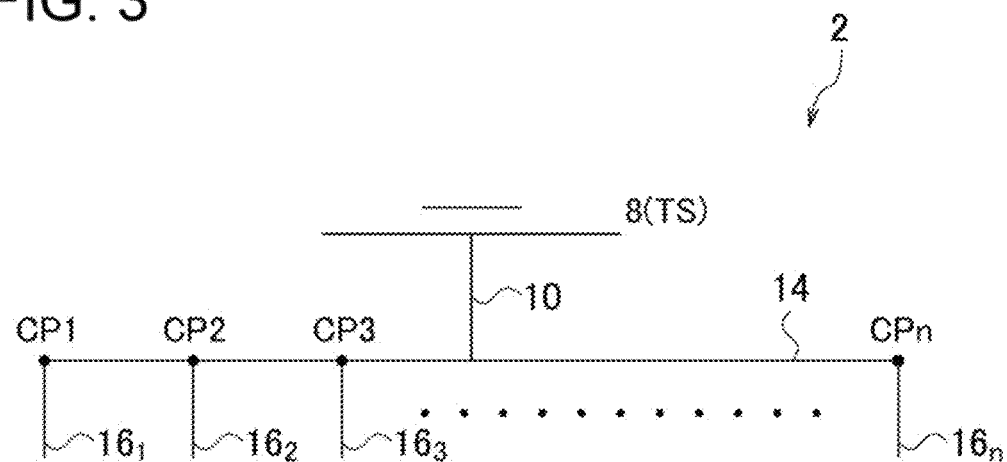
FIG. 3 is a schematic configuration diagram of a semiconductor apparatus according to the embodiments.

The semiconductor apparatus 2 according to the embodiments shown in FIG. 3 includes: a thermal source 8 (TS); a thermal diffusion unit 10 connected to the thermal source 8 (TS); a base unit 14 connected to the thermal diffusion unit 10; and air-cooling fin units $16_1, 16_2, 16_3, \ldots, 16_n$ connected through the base unit 14 and the thermal contact units CP1, CP2, CP3, ..., CPn. There are a plurality of the thermal contact units CP, and the base unit 14 is connected to the air-cooling fin units $16_1, 16_2, 16_3, \ldots, 16_n$ at the respective thermal contact units CP1, CP2, CP3, ..., CPn.

Figure 4:
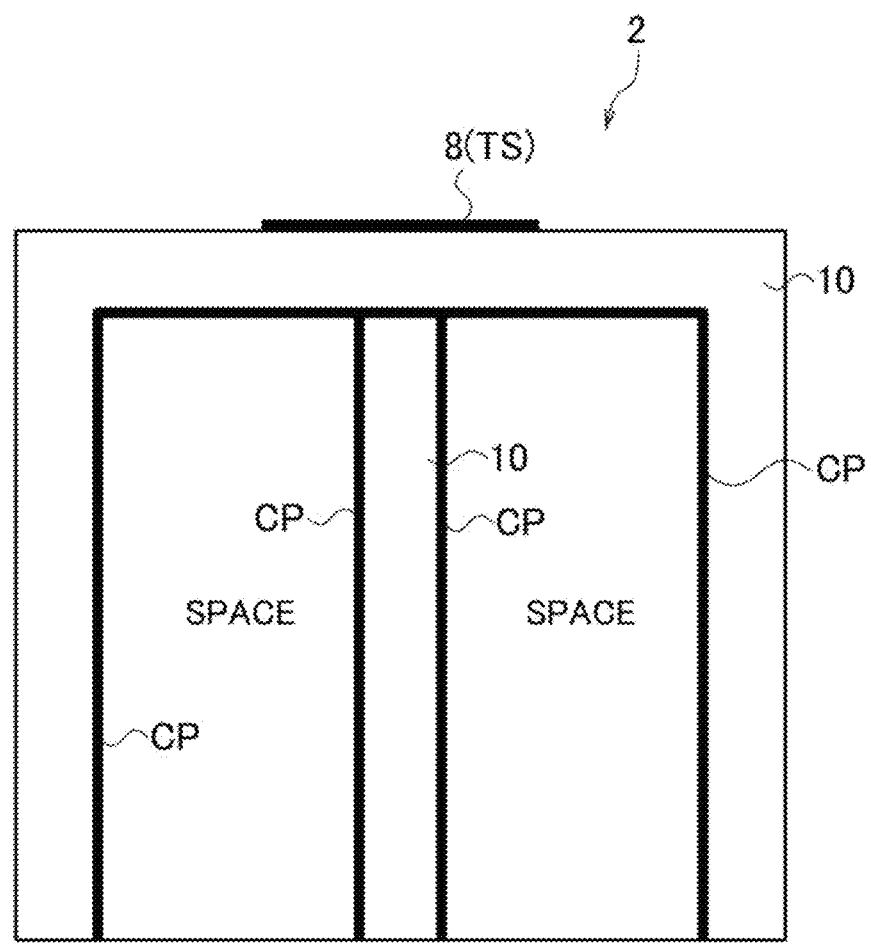
FIG. 4 is a schematic cross-sectional diagram of a configuration of providing a thermal diffusion unit for diffusing heat using a high thermal conductive material(s), and a thermal contact space unit between an air-cooling fin unit and the thermal diffusion unit, in the semiconductor apparatus according to the embodiments.

Alternatively, the semiconductor apparatus 2 according to the embodiments shown in FIG. 4 may includes: a thermal source 8 (TS); a thermal diffusion unit 10 connected to the thermal source 8 (TS); and a thermal contact space unit SPACE between the thermal diffusion unit 10 and the air-cooling fin unit (not shown).

Thermal diffusion unit 10 includes a high thermal conductive material and can diffuse heat. The thermal diffusion unit 10 can be formed, for example of copper (Cu) as a high thermal conductive material, and a vapor chamber may be used for the thermal diffusion unit 10. The thermal diffusion unit 10 and the air-cooling fin unit (not shown) are connected to each other through the thermal contact unit CP.

The semiconductor apparatus 2 according to the embodiments includes a thermal diffusion unit 10 configured to diffuse heat using a high thermal conductive material, and a thermal contact space SPACE between the thermal diffusion unit 10 and the air-cooling fin unit (not shown), wherein since the air-cooling fin units are thermally contacted to the thermal diffusion unit 10 at a plurality of points, reduction of the thermal resistance of the cooling apparatus can be realized.

Figure 5:
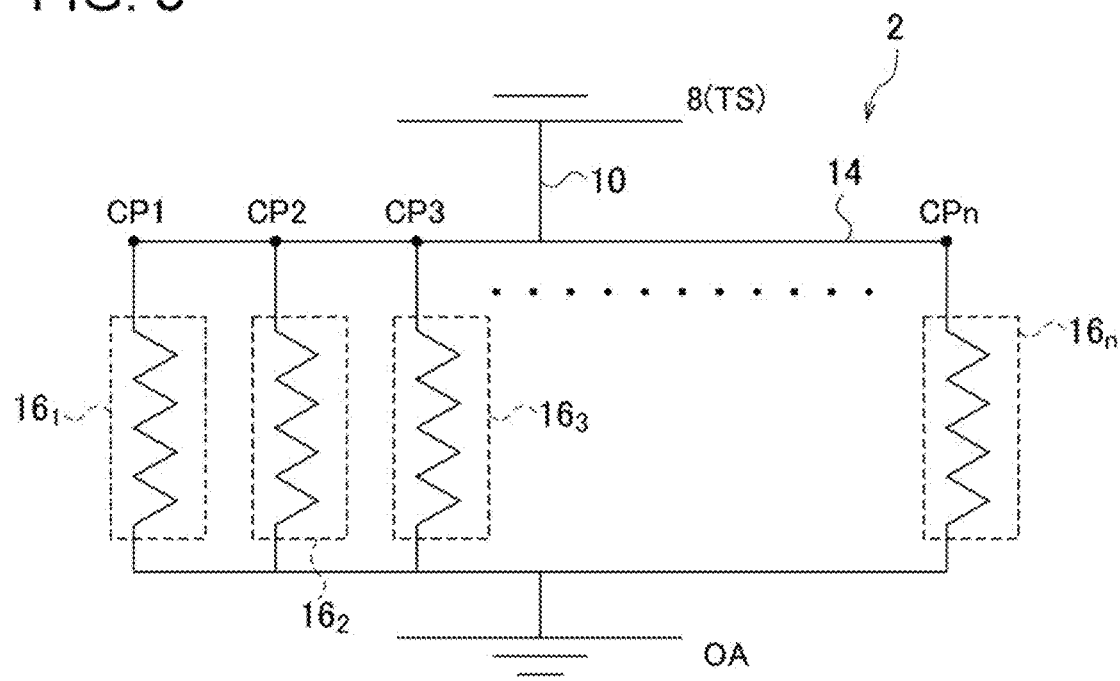
FIG. 5 is a schematic configuration diagram of a thermal resistance circuit illustrating a configuration in which air-cooling fin units are in thermal contact with a thermal diffusion unit at a plurality of points, in order to realize reduction of a thermal resistance, in the semiconductor apparatus according to the embodiments.

FIG. 5 shows a schematic configuration of a thermal resistance circuit for explaining a configuration for in which a plurality of the air-cooling fin units $16_1, 16_2, 16_3, \ldots, 16_n$ are in thermal contact with to the thermal diffusion unit 10 at a plurality of the thermal contact units CP1, CP2, CP3, ..., CPn in order to realize the reduction of the thermal resistance, in the semiconductor apparatus 2 according to the embodiments.

The semiconductor apparatus 2 according to the embodiments includes: the thermal diffusion unit 10 configured to diffuse heat using the high thermal conductive material; the base unit 14 connected with the thermal diffusion unit 10; and the thermal contact units CP1, CP2, CP3, ..., CPn in thermal contact with the base unit 14 and the plurality of the air-cooling fin units $16_1, 16_2, 16_3, \ldots, 16_n$ at the plurality of the points, wherein the plurality of the air-cooling fin units $16_1, 16_2, 16_3, \ldots, 16_n$ are thermally contacted to the thermal diffusion unit 10 through the base unit 14 at the plurality of the points, and thereby the reduction of the thermal resistance of the cooling apparatus can be realized.

Configuration of First Embodiment

Figure 6:
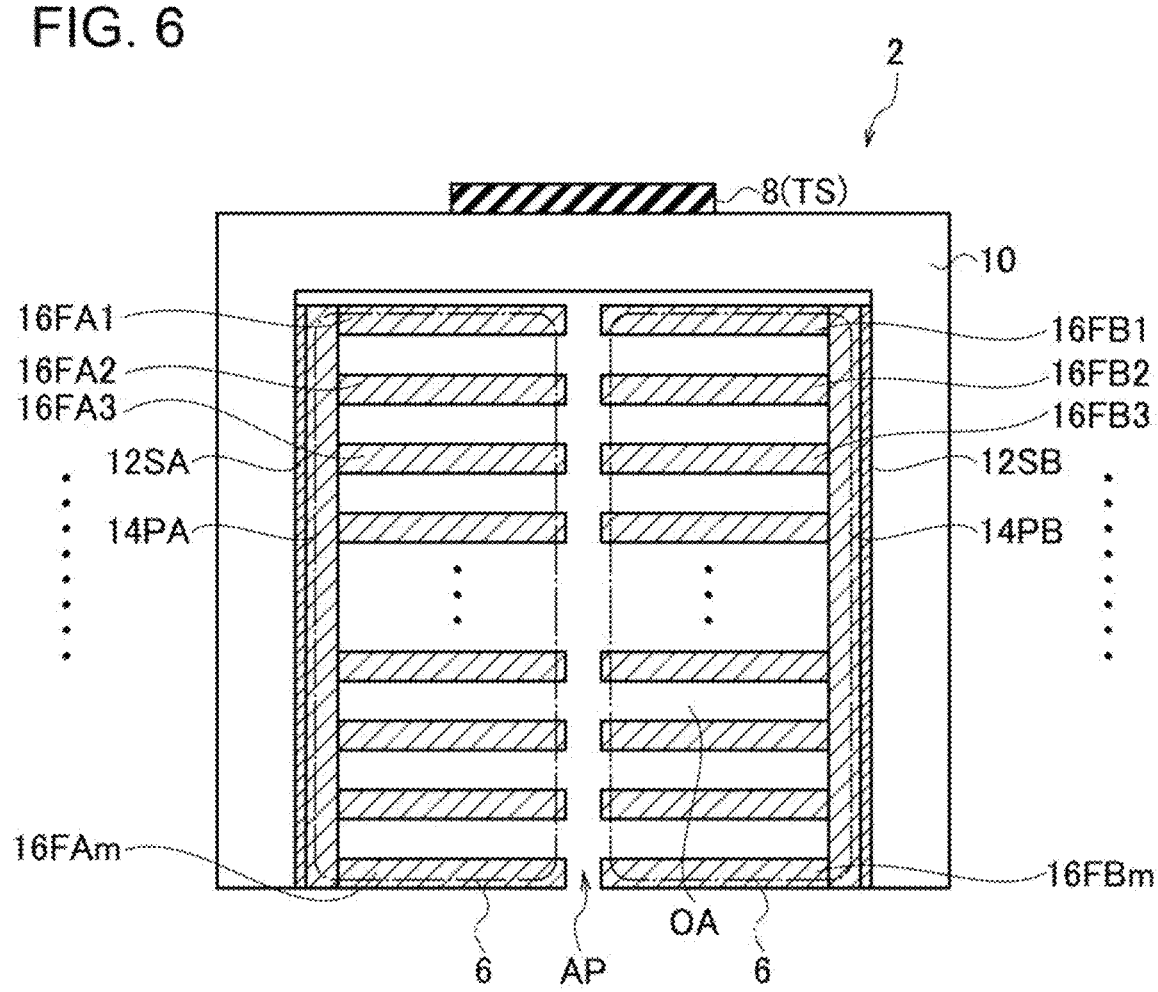
FIG. 6 is a schematic cross-sectional structure diagram of a semiconductor apparatus according to a first embodiment.

FIG. 6 shows a schematic cross-sectional structure of a semiconductor apparatus 2 according to a first embodiment.

The semiconductor apparatus 2 shown in FIG. 6 including a cooling apparatus according to the first embodiment includes two heat dissipation units 6.

As shown in FIG. 6, the semiconductor apparatus 2 according to the first embodiment includes a thermal source 8 (TS) composed of a semiconductor device which generates heat in an operating state; a thermal diffusion unit 10 connected to the thermal source 8 (TS); and a plurality of air-cooling fin units (16FA1, 16FA2, 16FA3, ..., 16FAm), (16FB1, 16FB2, 16FB3, ..., 16FBm) connected to the thermal diffusion unit 10.

Moreover, the semiconductor apparatus 2 includes base units 14PA, 14PB connected to the thermal diffusion unit 10 through thermal conduction layers 12SA, 12SB. The thermal conduction layers 12SA, 12SB may be thermal conduction sheet layers or soldering layers, for example. Moreover, the plurality of air-cooling fin units (16FA1, 16FA2, 16FA3, ..., 16FAm), (16FB1, 16FB2, 16FB3, ..., 16FBm) are connected to the base units 14PA, 14PB through a plurality of thermal contact units.

Moreover, the semiconductor apparatus 2 includes a thermal contact space unit OA between the thermal diffusion unit 10 and the plurality of air-cooling fin units (16FA1, 16FA2, 16FA3, ..., 16FAm), (16FB1, 16FB2, 16FB3, ..., 16FBm), the thermal contact space unit OA being surrounded with the thermal diffusion unit 10 and a plurality of air-cooling fin units (16FA1, 16FA2, 16FA3, ..., 16FAm), (16FB1, 16FB2, 16FB3, ..., 16FBm). Herein, the thermal contact space unit OA may be an air layer formed by natural air cooling or forced air cooling.

The semiconductor apparatus 2 may further include an opening AP with an external space. Alternatively, as long as a structure that ensures the flow of air, the opening AP may not be provided.

The thermal diffusion unit 10 may be configured to efficiently diffuse the heat using a high thermal conductive material(s). For example, the thermal diffusion unit 10 may include copper (Cu) or a vapor chamber.

Moreover, the base units 14PA, 14PB and the air-cooling fin units (16FA1, 16FA2, 16FA3, ..., 16FAm), (16FB1, 16FB2, 16FB3, ..., 16FBm) may be composed of the same material or may be composed of materials different from each other.

Moreover, the thermal diffusion unit 10 or the base units 14PA, 14PB may include a graphite substrate having anisotropic thermal conductivity. More specifically, thermal diffusion unit 10 or base units 14PA, 14PB may effectively use the anisotropic thermal conductivity of the graphite substrate by providing the graphite substrate in an orientation direction in which a heat transfer coefficient of the graphite substrate is relatively high.

Second Embodiment

Figure 7:
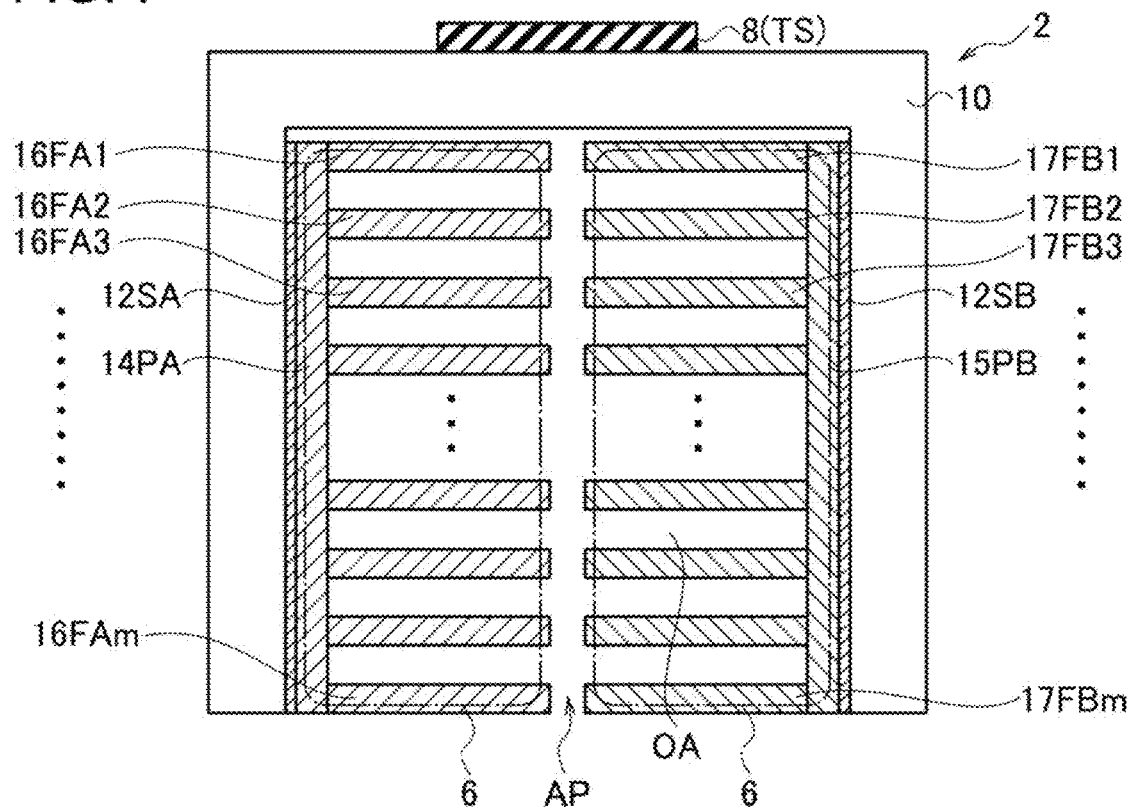
FIG. 7 is a schematic cross-sectional structure diagram of a semiconductor apparatus according to a second embodiment.

FIG. 7 shows a schematic cross-sectional structure of a semiconductor apparatus 2 according to a second embodiment.

The semiconductor apparatus 2 according to the second embodiment includes two heat dissipation units 6, as shown in FIG. 7.

As shown in FIG. 7, the semiconductor apparatus 2 according to the second embodiment includes a thermal source 8 (TS) composed of a semiconductor device which generates heat in an operating state; a thermal diffusion unit 10 connected to the thermal source 8 (TS); and a plurality of air-cooling fin units (16FA1, 16FA2, 16FA3, ..., 16FAm), (17FB1, 17FB2, 17FB3, ..., 17FBm) connected to the thermal diffusion unit 10.

Moreover, the semiconductor apparatus 2 includes base units 14PA, 15PB connected to the thermal diffusion unit 10 through thermal conduction layers 12SA, 12SB. The thermal conduction layers 12SA, 12SB may be thermal conduction sheet layers or soldering layers, for example. Moreover, the plurality of air-cooling fin units (16FA1, 16FA2, 16FA3, ..., 16FAm), (17FB1, 17FB2, 17FB3, ..., 17FBm) are respectively connected to the base units 14PA, 15PB through a plurality of thermal contact units.

In the semiconductor apparatus 2 according to the second embodiment, the base unit 14PA and the air-cooling fin units (16FA1, 16FA2, 16FA3, ..., 16FAm) are composed of the same material. Moreover, the base unit 14PB and the air-cooling fin units (17FB1, 17FB2, 17FB3, ..., 17FBm) are composed of the same material.

On the other hand, the base unit 14PA and the base unit 14PB are composed of materials different from each other, and the air-cooling fin units (16FA1, 16FA2, 16FA3, ..., 16FAm) and the air-cooling fin units (17FB1, 17FB2, 17FB3, ..., 17FBm) are composed of materials different from each other.

For example, the base unit 14PA may be composed of a relatively low thermal conduction material, and the base unit 14PB may be composed of a relatively high thermal conductive material. Similarly, the air-cooling fin units (16FA1, 16FA2, 16FA3, ..., 16FAm) may be composed of the relatively low thermal conduction material, and the air-cooling fin units (17FB1, 17FB2, 17FB3, ..., 17FBm) may be composed of the relatively high thermal conductive material. Other configurations are the same as those of the semiconductor apparatus 2 according to the first embodiment.

Third Embodiment

Figure 8:
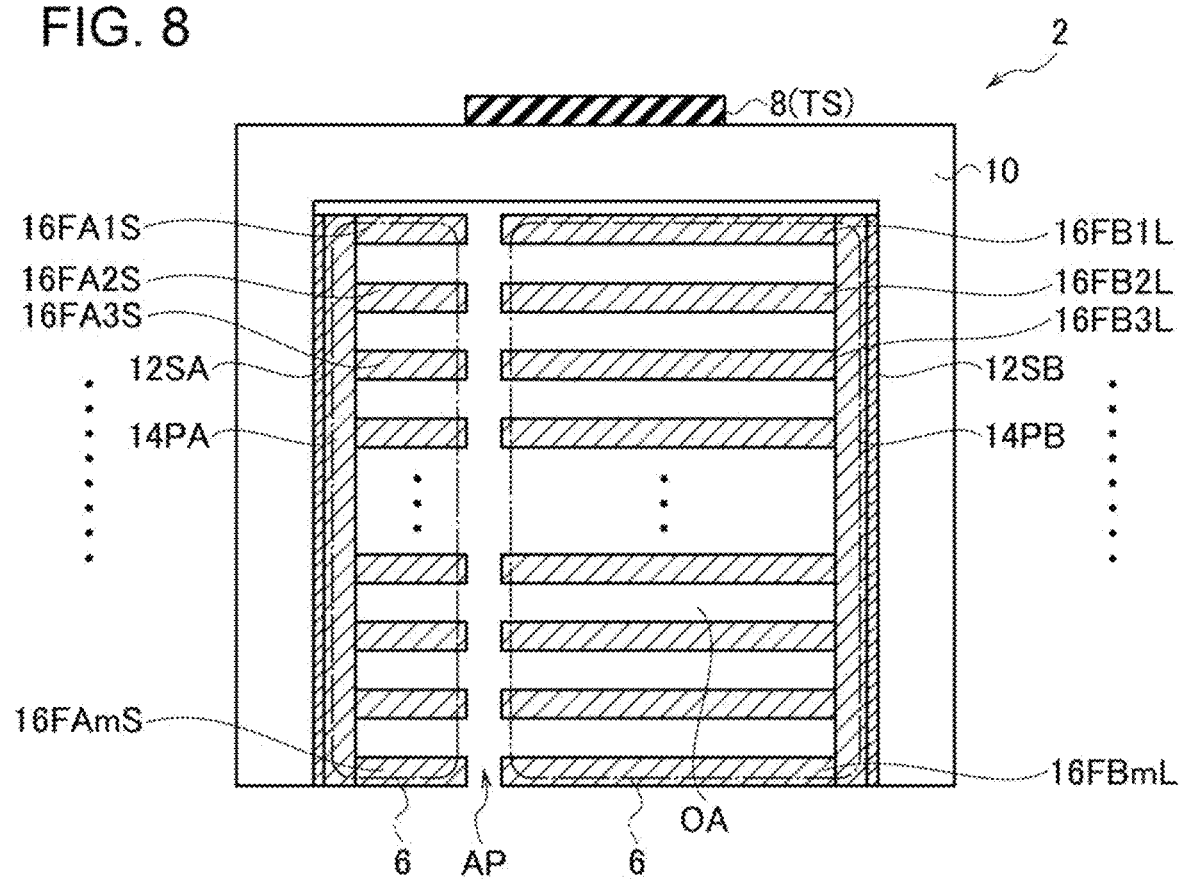
FIG. 8 is a schematic cross-sectional structure diagram of a semiconductor apparatus according to a third embodiment.

FIG. 8 shows a schematic cross-sectional structure of a semiconductor apparatus 2 according to a third embodiment.

The semiconductor apparatus 2 according to the third embodiment includes two heat dissipation units 6, as shown in FIG. 8.

As shown in FIG. 8, the semiconductor apparatus 2 according to the third embodiment includes a thermal source 8 (TS) composed of a semiconductor device which generates heat in an operating state; a thermal diffusion unit 10 connected to the thermal source 8 (TS); and a plurality of air-cooling fin units (16FA1S, 16FA2S, 16FA3S, ..., 16FAmS), (16FB1L, 16FB2L, 16FB3L, ..., 16FBmL) connected to the thermal diffusion unit 10.

Moreover, the semiconductor apparatus 2 includes base units 14PA, 14PB connected to the thermal diffusion unit 10 through thermal conduction layers 12SA, 12SB. The thermal conduction layers 12SA, 12SB may be thermal conduction sheet layers or soldering layers, for example. Moreover, the plurality of the air-cooling fin units (16FA1S, 16FA2S, 16FA3S, ..., 16FAmS), (16FB1L, 16FB2L, 16FB3L, ..., 16FBmL) are respectively connected to the base units 14PA, 14PB through a plurality of thermal contact units.

Moreover, the base units 14PA, 14PB and the air-cooling fin units (16FA1S, 16FA2S, 16FA3S, ..., 16FAmS), (16FB1L, 16FB2L, 16FB3L, ..., 16FBmL) are composed of the same material.

In the semiconductor apparatus 2 according to the third embodiment, it is configured so that a length of the air-cooling fin units (16FA1S, 16FA2S, 16FA3S, ..., 16FAmS) is relatively shorter than a length of the air-cooling fin units (16FB1L, 16FB2L, 16FB3L, ..., 16FBmL). Other configurations are the same as those of the semiconductor apparatus 2 according to the first embodiment.

Fourth Embodiment

Figure 9:
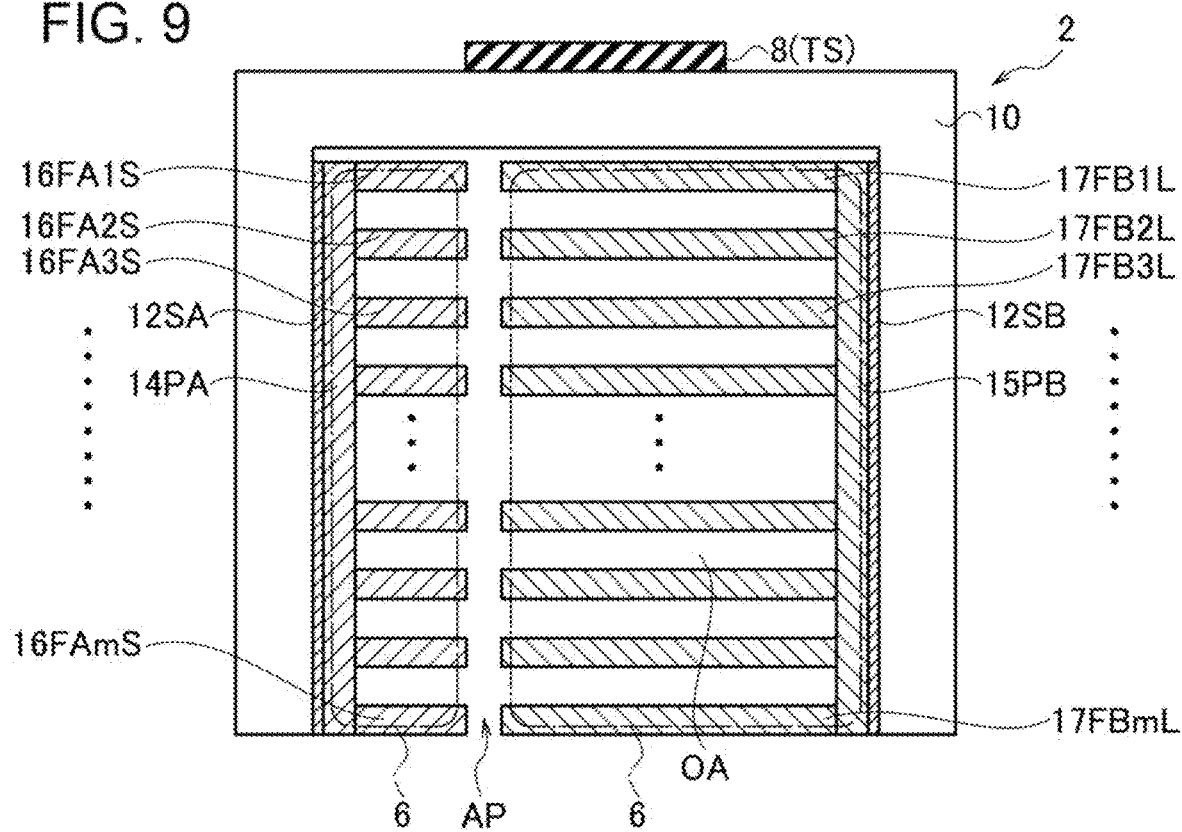
FIG. 9 is a schematic cross-sectional structure diagram of a semiconductor apparatus according to a fourth embodiment.

FIG. 9 shows a schematic cross-sectional structure of a semiconductor apparatus 2 according to a fourth embodiment.

The semiconductor apparatus 2 according to the fourth embodiment includes two heat dissipation units 6, as shown in FIG. 9.

As shown in FIG. 9, the semiconductor apparatus 2 according to the fourth embodiment includes a thermal source 8 (TS) composed of a semiconductor device which generates heat in an operating state; a thermal diffusion unit 10 connected to the thermal source 8 (TS); and a plurality of air-cooling fin units (16FA1S, 16FA2S, 16FA3S, . . . , 16FAmS), (17FB1L, 17FB2L, 17FB3L, . . . , 17FBmL) connected to the thermal diffusion unit 10.

Moreover, the semiconductor apparatus 2 includes base units 14PA, 15PB connected to the thermal diffusion unit 10 through thermal conduction layers 12SA, 12SB. The thermal conduction layers 12SA, 12SB may be thermal conduction sheet layers or soldering layers, for example. Moreover, the plurality of the air-cooling fin units (16FA1S, 16FA2S, 16FA3S, . . . , 16FAmS), (17FB1L, 17FB2L, 17FB3L, . . . , 17FBmL) are respectively connected to the base units 14PA, 15PB through a plurality of thermal contact units.

In the semiconductor apparatus 2 according to the fourth embodiment, the base unit 14PA and the air-cooling fin units (16FA1S, 16FA2S, 16FA3S, . . . , 16FAmS) are composed of the same material. Moreover, the base unit 14PB and the air-cooling fin units (17FB1L, 17FB2L, 17FB3L, . . . , 17FBmL) are composed of the same material.

On the other hand, the base unit 14PA and the base unit 14PB are composed of materials different from each other, and the air-cooling fin units (16FA1S, 16FA2S, 16FA3S, . . . , 16FAmS) and the air-cooling fin units (17FB1L, 17FB2L, 17FB3L, . . . , 17FBmL) are composed of materials different from each other.

For example, the base unit 14PA may be composed of a relatively low thermal conduction material, and the base unit 14PB may be composed of a relatively high thermal conductive material. Similarly, the air-cooling fin units (16FA1S, 16FA2S, 16FA3S, . . . , 16FAmS) may be composed of the relatively low thermal conduction material, and the air-cooling fin units (17FB1L, 17FB2L, 17FB3L, . . . , 17FBmL) may be composed of the relatively high thermal conductive material.

In the semiconductor apparatus 2 according to the fourth embodiment, it is configured so that a length of the air-cooling fin units (16FA1S, 16FA2S, 16FA3S, . . . , 16FAmS) is relatively shorter than a length of the air-cooling fin units (16FB1L, 16FB2L, 16FB3L, . . . , 16FBmL). Other configurations are the same as those of the semiconductor apparatus 2 according to the third embodiment.

As explained above, as shown in FIG. 5, the semiconductor apparatus 2 according to the embodiments includes the thermal diffusion unit 10 configured to diffuse the heat using a high thermal conductive material, the base unit 14 connected to the thermal diffusion unit 10, and the thermal contact units CP1, CP2, CP3, . . . , CPn in thermal contact with the base unit 14 and the plurality of the air-cooling fin units $16_1$, $16_2$, $16_3$, . . . , $16_n$ at the plurality of the points, wherein the plurality of the air-cooling fin units $16_1$, $16_2$, $16_3$, . . . , $16_n$ are thermally contacted to the thermal diffusion unit 10 through the base unit 14 at the plurality of the points, and thereby the reduction of the thermal resistance of the cooling apparatus in a limited space (thermal contact space unit OA) can be realized.

Various combinations are possible for the air-cooling fin (the base unit 14+the air-cooling fin units $16_1$, $16_2$, $16_3$, . . . , $16_n$) occupying the space (thermal contact space unit OA). For example, the air-cooling fins may be formed of a uniform material, or may be formed using different materials. Moreover, the air-cooling fins may be formed using a relatively high thermal conductive material, a relatively low thermal conduction materials, or a combination thereof.

(Thermal Fluid Simulation)

Figure 10:
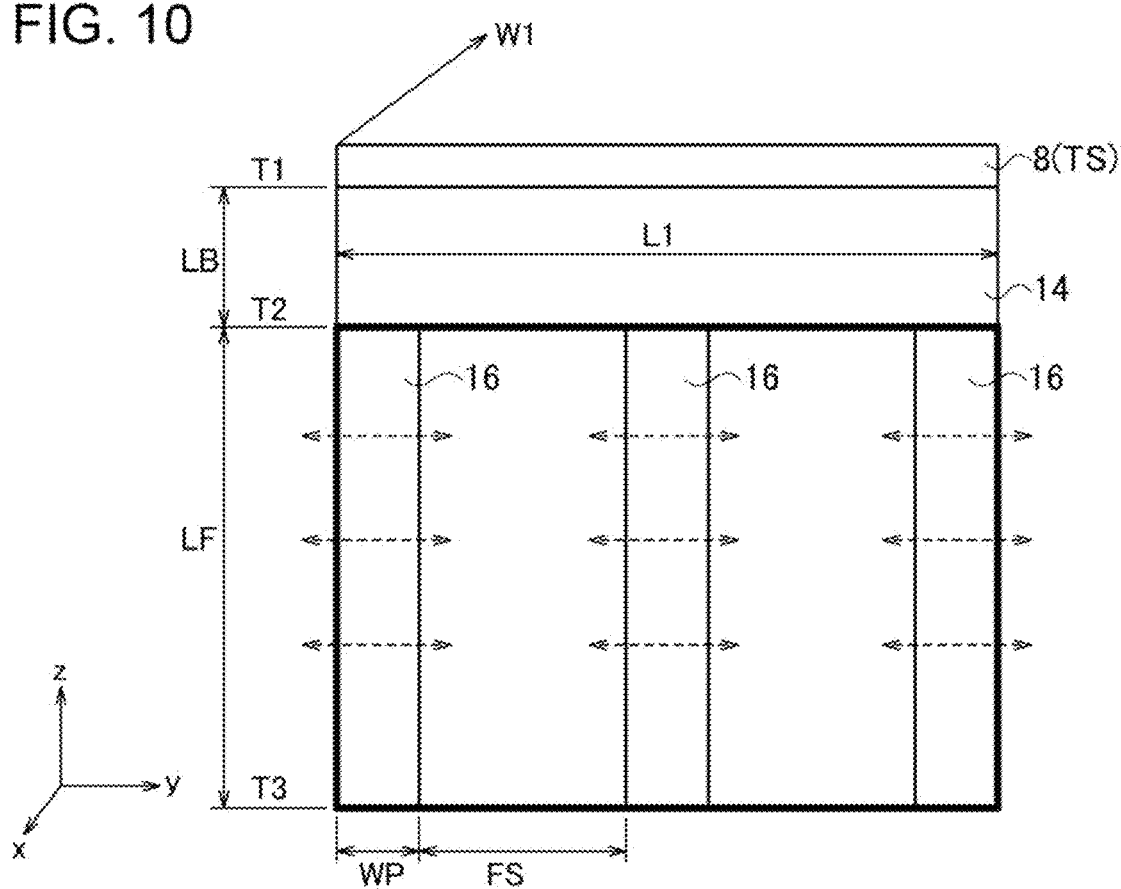
FIG. 10 is an explanatory diagram of a calculation evaluation method of a thermal fluid simulation, in the semiconductor apparatus according to the embodiments.

FIG. 10 is an explanatory diagram of a calculation evaluation method of a thermal fluid simulation, in the semiconductor apparatus according to the embodiments. In a thermal fluid simulation model, the thermal source 8 (TS) is disposed on the base unit 14 so as to heat the whole surface thereof. In FIG. 10, T1 denotes a surface temperature of the base unit, T2 denotes a root temperature of the air-cooling fin unit, and T3 denotes a tip temperature of the air-cooling fin unit. W1 denotes a thickness of the cooling apparatus, WP denotes a width of the air-cooling fin, LF denotes a length of the air-cooling fin, LB denotes a base length, and L1 denotes a base width. In this case, the thickness of the cooling apparatus W1=70 mm, the base length LB=5 mm, the base width L1=70 mm, and a space of the air cooling fin FS=LF/20. The cooling conditions are air cooling at an air velocity of 10 m/sec on the front surface of the fins, and the outside air temperature Ta=20° C. In the following calculation, the thermal resistance of the air-cooling fin unit 16 is investigated by fixing the tongs ratio (LF/FS) to 20 and changing the length of the air-cooling fin LF.

As the fin evaluation items, the thermal resistance Rth (fin) (K/W) of the fin and a temperature difference ratio RATIO inside the fin are defined and applied by the following equations (2) and (3):

$$Rth(fin)(K/W) = (T1 - Ta)/W \qquad (2)$$

$$RATIO = (T2 - T3)/(T1 - T2) \qquad (3)$$

In the equation (2), W denotes dissipation power in the thermal source 8 (TS) and corresponds to dissipation power of the semiconductor device, for example. RATIO is an index indicating a temperature distribution inside the air-cooling fin unit 16, and corresponds to temperature difference of the base unit/temperature difference of the air-cooling fin unit 16.

FIG. 11 shows an explanation of each composite materials applied to the thermal fluid simulation, in the semiconductor apparatus according to the embodiments. Herein, graphite, copper (Cu), aluminum (Al), alloy, and Fe are assumed as the materials composing the air-cooling fins composed of the base unit 14 and the air-cooling fin unit 16. The heat transfer coefficient of the graphite is 1500 (W/mK) in the x direction, 5 (W/mK) in the y direction and 1500 (W/mK) in the z direction. The heat transfer coefficients of the copper (Cu), the aluminum (Al), the alloy, and the Fe are respectively 400 (W/mK), 237 (W/mK), 100 (W/mK), and 50 (W/mK). The length of the air-cooling fin LF is 10 mm to 80 mm, the air cooling fin space FS is 0.5 mm to 4 mm, and the number of the fins is 61 to 16.

The thermal fluid simulation of the semiconductor apparatus according to the embodiments is evaluated with the thermal resistance Rth (fin) (K/W) of the air-cooling fin unit by changing the material of the air-cooling fin and the length of air-cooling fin LF. Moreover, a correlative relationship between thermal resistance Rth (fin) and the temperature difference inside the fin is also evaluated by introducing the temperature difference ratio RATIO inside the fin.

(Equivalent Thermal Resistance Circuit)

In the thermal fluid simulation of the semiconductor apparatus according to the embodiments is performed by dividing the air-cooling fin unit is into the optional numbers of elements. In the following example, it is divided into two each having a width Δ.

FIG. 12A shows an explanation of an equivalent thermal resistance of one air-cooling fin unit, and FIG. 12B shows the equivalent thermal resistance circuit of the one air-cooling fin unit 1, in the semiconductor apparatus according to the embodiments. In FIG. 12B, r1, r2, and r3 denote thermal resistances, V1, V2, and V3 denote temperatures, and I1, I2, and I3 denote thermal flows.

Figure 13A:
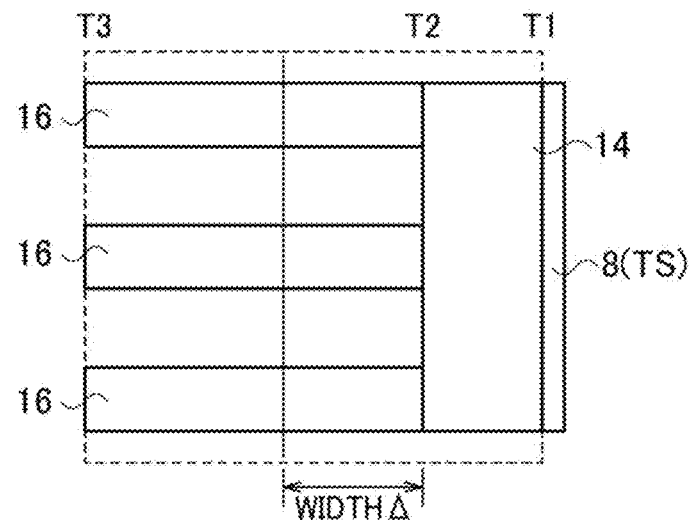
FIG. 13A is an explanatory diagram of an equivalent thermal resistance of three air-cooling fin units in the semiconductor apparatus according to the embodiments.
Figure 13B:
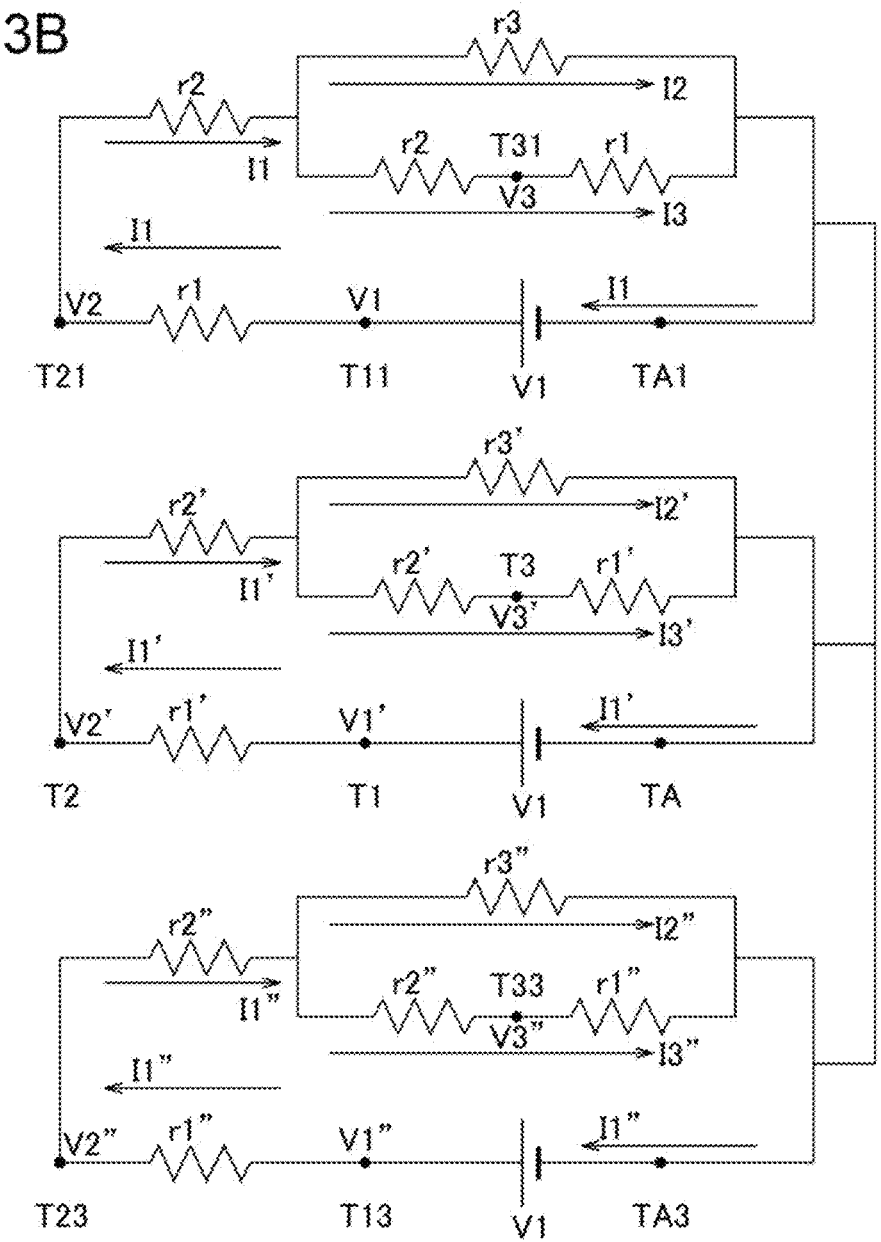
FIG. 13B is a configuration diagram of an equivalent thermal resistance circuit of three air-cooling fin units in the semiconductor apparatus according to the embodiments.

Similarly, FIG. 13A shows an explanation of an equivalent thermal resistance of three air-cooling fin units, and FIG. 13B shows the equivalent thermal resistance circuit of the three air-cooling fin units, in the semiconductor apparatus according to the embodiments. In FIG. 13B, r1, r2, r3, r1', r2', r3', r1", r2", and r3" denote thermal resistances, V1, V2, V3, V1', V2', V3', V1", V2", and V3" denote temperatures, and I1, I2, I3, I1', I2', I3', I1", I2", and I3" denote thermal flows.

(Result of Thermal Fluid Simulation)

Figure 14:
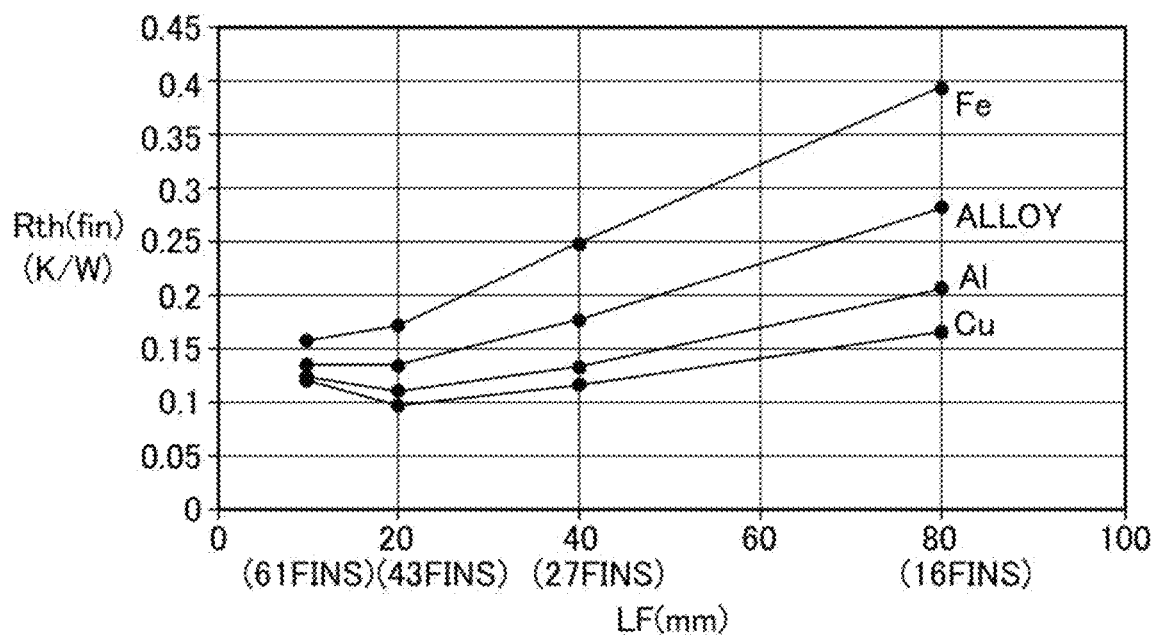
FIG. 14 shows a simulation result of a relationship between a thermal resistance Rth (fin) (K/W) and a length of air-cooling fin LF (mm) using a material as a parameter when a base unit and an air-cooling fin unit are made of the same material, in the semiconductor apparatus according to the embodiments.

FIG. 14 shows a simulation result of a relationship between a thermal resistance Rth (fin) (K/W) and a length of air-cooling fin LF (mm) using a material for composing the fin as a parameter when the base unit 14 and the air-cooling fin 16 unit are made of the same material, in the semiconductor apparatus according to the embodiments.

Figure 15:
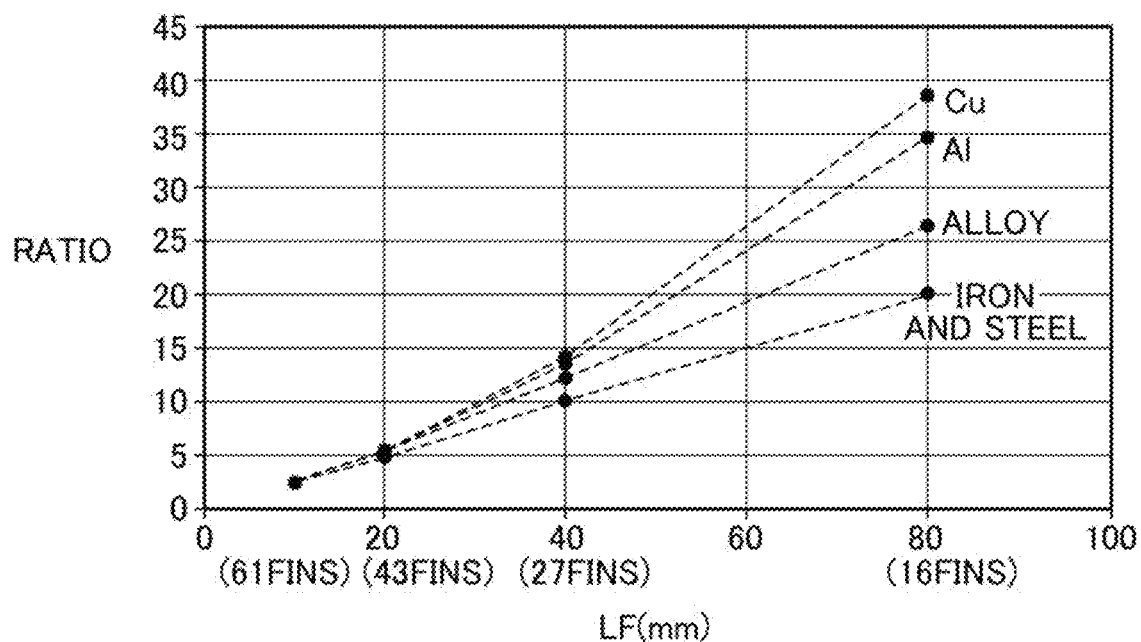
FIG. 15 shows a simulation result of a relationship between RATIO and the length of air-cooling fin LF (mm), using a material as a parameter when the base unit and the air-cooling fin unit are made of the same material, in the semiconductor apparatus according to the embodiments.

FIG. 15 shows a simulation result of a relationship between RATIO and the length of air-cooling fin LF (mm), using a material for composing the fin as a parameter when the base unit 14 and the air-cooling fin unit 16 are made of the same material, in the semiconductor apparatus according to the embodiments.

As shown in FIG. 14, the thermal resistance Rth (fin) (K/W) tends to be reduced when the length of the air-cooling fin LF is equal to or less than 20 (mm), regardless of which material is used. When the length of the air-cooling fin LF=20 mm and the composite material of the air-cooling fin unit is copper (Cu), the lowest thermal resistance Rth (fin) (K/W) is obtained when the length of the air-cooling fin LF=20 mm.

Moreover, as shown in FIG. 15, when the RATIO value is as low as equal to or less than 5, the tendency of reduction of the thermal resistance is observed, regardless of the composite material of the air-cooling fin unit.

From the above-mentioned thermal fluid simulation results, the temperature difference inside the air-cooling fin is reduced by shortening the length of the air-cooling fin LF (equal to or less than 20 mm) (RATIO is equal to or less than 5). Moreover, as a result of the fin interval becoming narrow, it becomes possible to increase the number of fins, and the area for efficiently transferring the heat to air is enlarged, and thereby reduction of the thermal resistance can be realized. Moreover, it is proved that the influence of the heat transfer coefficient of the fin materials can also be reduced.

From the above thermal fluid simulation results, in the semiconductor apparatus according to the embodiments, a structure in which a plurality of small-sized air-cooling fin units are connected to one another is effective for reducing the thermal resistance.

Example of Using Composite Materials

In the semiconductor device according to the present embodiment, the performance of the air-cooling fin is examined by combining different materials for the base unit 14 and the air-cooling fin unit 16 based on the criterion of a copper (Cu) fin.

FIG. 16A shows a schematic configuration when the base unit 14 and the air-cooling fin unit 16 are made of the same material, in the semiconductor apparatus according to the embodiments. FIG. 16B shows a schematic configuration when the base unit 14 and the air-cooling fin unit 16 are made of materials different from each other, in the semiconductor apparatus according to the embodiments. FIG. 16C is a diagram showing a performance list of each material of graphite, Cu, Al, alloy, and Fe, in the semiconductor apparatus according to the embodiments. As the performance items, the heat transfer coefficient (W/mK), the cost of materials, and the weight thereof are taken into consideration.

While the heat transfer coefficient of the copper (Cu) fins is 400 (W/mK), the heat transfer coefficient of graphite is as high as 1500 (W/mK) in the orientation direction, and the heat transfer coefficients of Al, alloy and Fe are respectively as low as 237, 100 and 50.

Based on the criterion of the material cost of the Cu fins, the material cost of the graphite is expensive, and the material costs of al and Fe are cheep. The material cost of the alloy is dependent on the materials thereof.

Based on the criterion of the weight of Cu fins, the weights of graphite and aluminum are light and the weight of iron is heavy. The weight of the alloy is dependent on the materials thereof.

Thermal Resistance Calculated Result (Example of Using Composite Materials)

The merit of using the composite materials for each material is calculated and analyzed. Copper (Cu), aluminum (Al), the alloy, and Fe are applied as the materials of the base unit 14, and graphite, copper (Cu), aluminum (Al), the alloy, and Fe are applied as the materials of the air-cooling fin unit 16. The numerical values in the following FIGS. 17 to 20 denote the thermal resistance Rth (fin) (K/W). As for each of the percent (%) values of the base unit 14 and the air-cooling fin unit 16, the black-painted triangle "▼" denotes a reduction rate of the thermal resistance Rth (fin) (K/W), and the white triangle "Δ" denotes an increasing rate of the thermal resistance Rth (fin) (K/W), based on the criterion of the case of copper (Cu).

FIG. 17 shows a thermal resistance simulation result in when the base unit 14 and the air-cooling fin unit 16 are made of materials different from each other (the length of air-cooling fin LF=80 mm), in the semiconductor apparatus according to the embodiments.

FIG. 18 shows a thermal resistance simulation result in when the base unit 14 and the air-cooling fin unit 16 are made of materials different from each other (the length of air-cooling fin LF=40 mm), in the semiconductor apparatus according to the embodiments.

FIG. 19 shows a thermal resistance simulation result in when the base unit 14 and the air-cooling fin unit 16 are made of materials different from each other (the length of air-cooling fin LF=20 mm), in the semiconductor apparatus according to the embodiments.

FIG. 20 shows a thermal resistance simulation result in when the base unit 14 and the air-cooling fin unit 16 are made of materials different from each other (the length of air-cooling fin LF=10 mm), in the semiconductor apparatus according to the embodiments.

From the above-mentioned results, it is proved that the reduction effect of the thermal resistance is large by using the high thermally-conductive material for the air-cooling fin unit 16 when the length of the air-cooling fin LF of the air-cooling fin unit 16 is relatively long. This is because a fin having a large RATIO is greatly affected by the heat transfer coefficient of the air-cooling fin unit 16.

On the other hand, it is proved that when length of air-cooling fin LF of the air-cooling fin unit 16 is relatively short, there is not much effect of increasing the thermal resistance even if the material having low rate thermal conduction is used for the air-cooling fin unit 16 and the base unit 14 use. This is because a fin having a small RATIO is less affected by the heat transfer coefficient of the air-cooling fin unit 16.

—Simulation Result of RATIO and Thermal Resistance Rth (Fin) (K/W)—

Figure 21A:
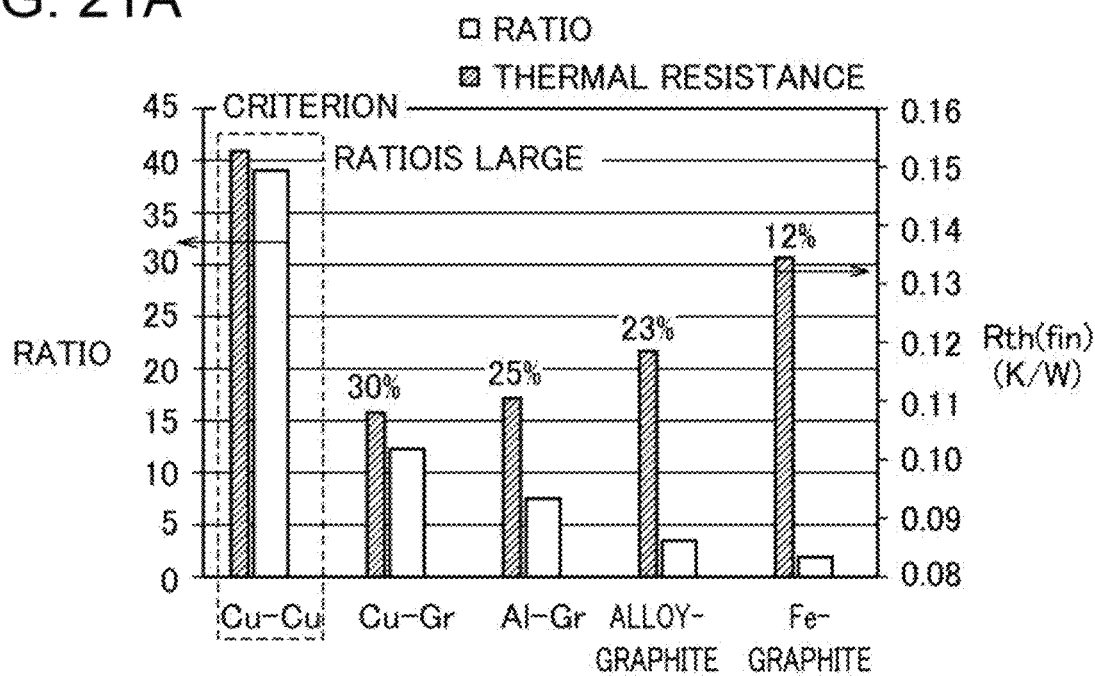
FIG. 21A shows a thermal resistance simulation result of the RATIO and the thermal resistance when the base unit and the air-cooling fin unit are made of Cu—Cu, Cu-graphite, Al-graphite, alloy-graphite, or Fe-graphite (the length of air-cooling fin LF=80 mm), in the semiconductor apparatus according to the embodiments.

FIG. 21A shows a thermal resistance simulation result of the RATIO and the thermal resistance Rth (fin) (K/W) when the base unit 14 and the air-cooling fin unit 16 are made of Cu—Cu, Cu-graphite, Al-graphite, alloy-graphite, or Fe-graphite (the length of air-cooling fin unit 16 LF=80 mm), in the semiconductor apparatus according to the embodiments. As shown in FIG. 21A, when material of the base unit 14 the air-cooling fin unit 16 shown as the criterion is Cu—Cu, the RATIO tends to be large and the cooling efficiency tends to be wrong. For this result, if graphite is used for the air-cooling fin unit 16 to increase the thermal conductivity, the thermal resistance can be reduced. The percent (%) values denote the reduction rate of the thermal resistance with respect to the criterion value. When the base unit 14 and the air-cooling fin unit 16 are made of Cu-Gr, the thermal resistance is reduced by up to approximately 30%. Similarly, the RATIO value is also reduced by approximately 30%.

Figure 21B:
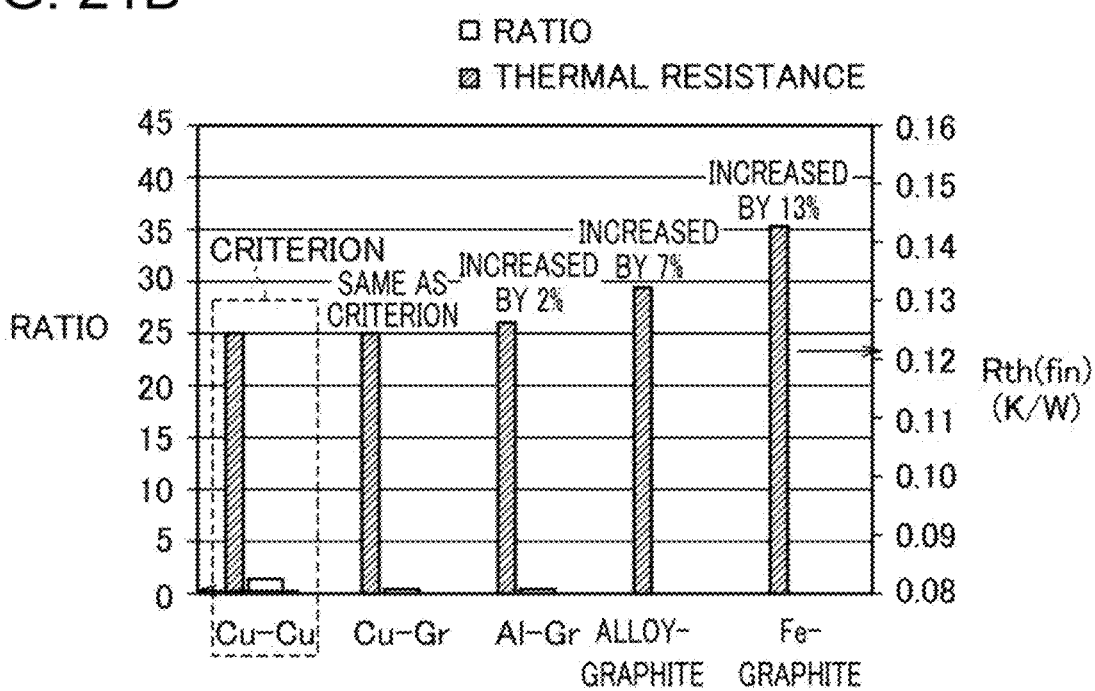
FIG. 21B shows a thermal resistance simulation result of the RATIO and the thermal resistance when the base unit and the air-cooling fin unit are made of Cu—Cu, Cu-graphite, Al-graphite, alloy-graphite, or Fe-graphite (the length of air-cooling fin LF=10 mm), in the semiconductor apparatus according to the embodiments.

FIG. 21B shows a thermal resistance simulation result of the RATIO and the thermal resistance Rth (fin) (K/W) when the base unit 14 and the air-cooling fin unit 16 are made of Cu—Cu, Cu-graphite, Al-graphite, alloy-graphite, or Fe-graphite (the length of air-cooling fin unit 16 LF=10 mm), in the semiconductor apparatus according to the embodiments. As shown in FIG. 21B, when material of the base unit 14 the air-cooling fin unit 16 shown as the criterion is Cu—Cu, the RATIO tends to be small and the cooling efficiency tends to be high. Contrary to this result, even if graphite (Gr) is used for the air-cooling fin unit 16 to increase the thermal conductivity, the cooling performance is hardly changed. Even if a cheap and light material is used for the base unit 14 and the air-cooling fin unit 16, the cooling performance is hardly changed. The percent (%) values denote the increasing rate of the thermal resistance with respect to the criterion value. When the base unit 14 and the air-cooling fin unit 16 are made of Fe-Gr, the thermal resistance is increased by up to approximately 13%. On the other hand, the RATIO is reduced.

—Simulation Result of Thermal Resistance Rth (Fin) (K/W) and RATIO—

It is calculated whether or not the reduction of the thermal resistance is possible even by a further small-sized air-cooling fin unit by increasing the tongs ratio (LF/FS) and reducing the fin space FS to increase the number of the air-cooling fins, in a region where the length of the air-cooling fin LF is short (equal to or less than 20 mm). Copper (Cu) having a heat transfer coefficient 400 (W/mK) is used for the air-cooling fin unit, the length of air-cooling fin LF is 2 mm to 20 mm, the fin space FS is 0.2 mm to 1 mm, and the number of fins is 40 to 100.

Figure 22A:
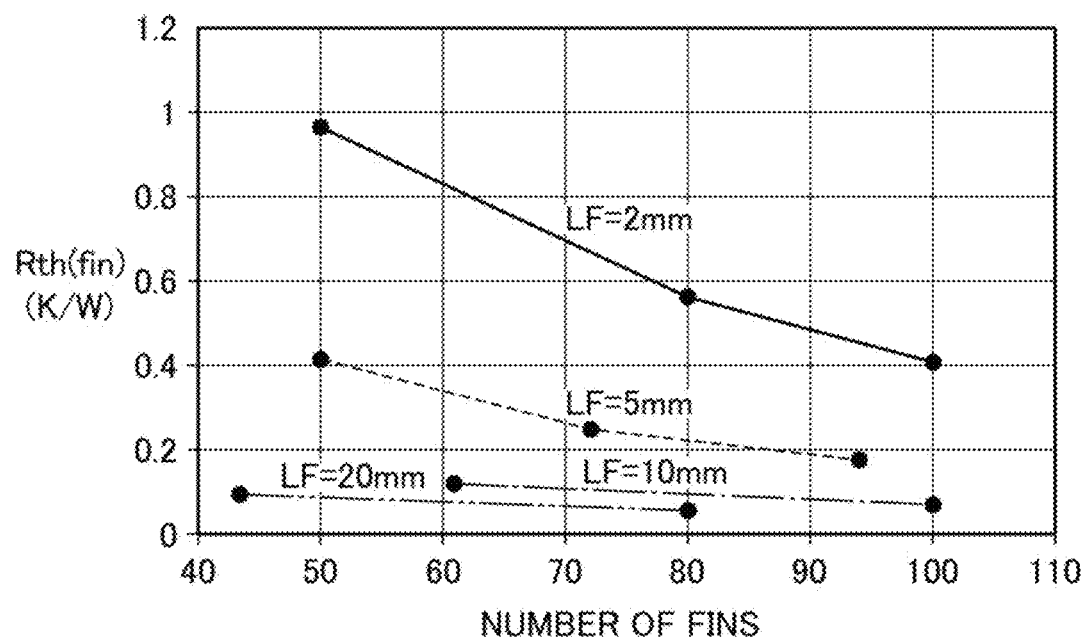
FIG. 22A shows a simulation result of a relationship between the thermal resistance and the number of fins using the length of air-cooling fin LF as a parameter, in the semiconductor apparatus according to the embodiments.
Figure 22B:
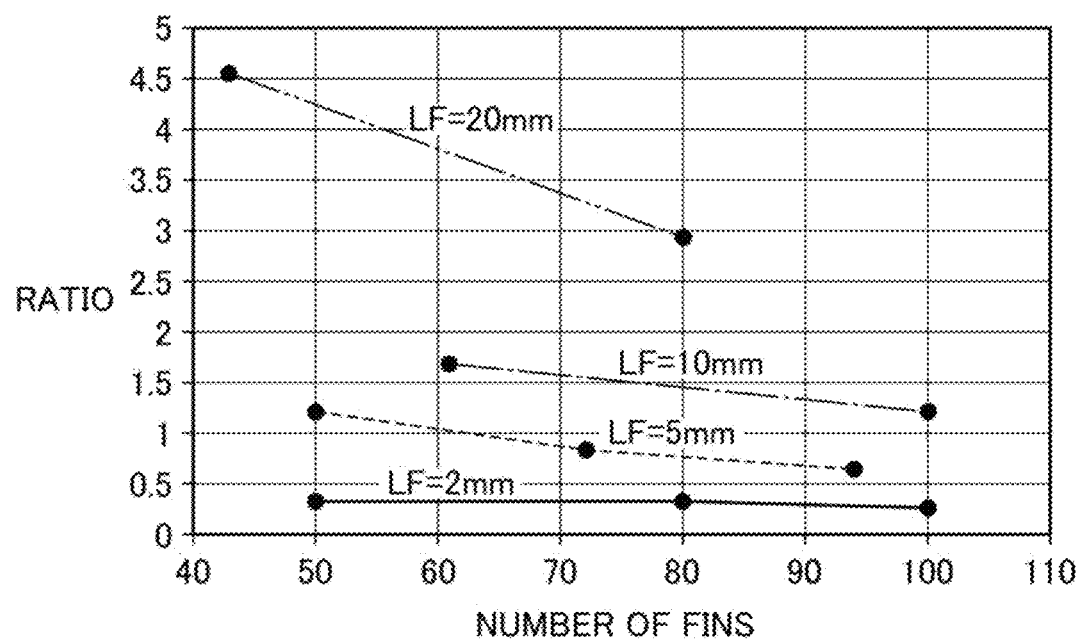
FIG. 22B shows a simulation result of a relationship between the RATIO and the number of fins using the length of air-cooling fin LF as a parameter, in the semiconductor apparatus according to the embodiments.

FIG. 22A shows a simulation result of a relationship between the thermal resistance Rth (fin) (K/W) and the number of fins using the length of the air-cooling fin LF as a parameter, and FIG. 22B shows a simulation result of a relationship between the RATIO and the number of fins using the length of the air-cooling fin LF as a parameter, in semiconductor apparatus according to the embodiments.

As shown in FIG. 22A, when increasing the number of fins, the reduction effect of the thermal resistance Rth (fin) (K/W) is more remarkable as the length of the air-cooling fin LF is shorter. For example, in the case of a fine processing fin, the air cooling fin space FS is approximately 0.2 mm.

As shown in FIG. 22B, when increasing the number of fins, the reduction effect of the RATIO is more remarkable as the length of the air-cooling fin LF is longer. As shown in FIG. 15, when the RATIO is equal to or less than 5, the material dependency of the air-cooling fin unit is reduced. The RATIO is preferable to be equal to or less than 5.

In addition, even when the above calculation is performed on the assumption that the material of the air-cooling fin unit is Al having a heat transfer coefficient of 237 (W/mK), no significant change is observed in the above calculation results.

Fifth Embodiment

Figure 23:
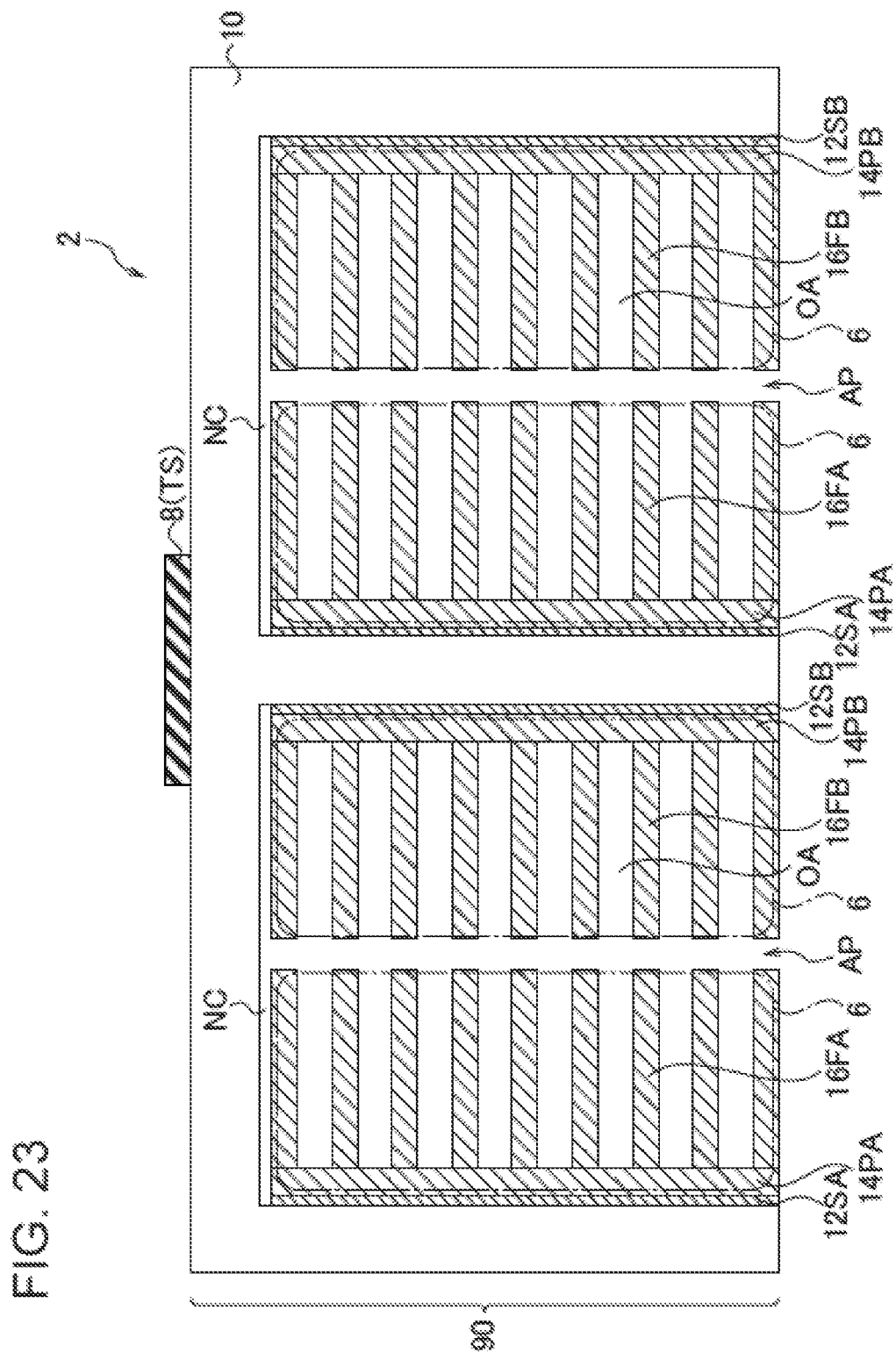
FIG. 23 is a schematic cross-sectional structure diagram of a semiconductor apparatus according to a fifth embodiment.

FIG. 23 shows a schematic cross-sectional structure of a semiconductor apparatus 2 according to a fifth embodiment.

The semiconductor apparatus 2 according to the fifth embodiment includes four heat dissipation units 6.

The semiconductor apparatus 2 according to the fifth embodiment includes: a thermal source 8 (TS) composed of a semiconductor device which generates heat in an operating state; a thermal diffusion unit 10 thermally connected to the thermal source 8 (TS); and a plurality of heat dissipation units 6 connected to the thermal diffusion unit 10, wherein the thermal diffusion unit 10 has a cooling apparatus 90 spatially containing the heat dissipation unit 6 (by the thermal contact space unit OA).

The thermal diffusion unit 10 includes an opening AP, and the space (thermal contact space unit OA) which contains the heat dissipation unit 6 is opened in the opening AP. Alternatively, the thermal diffusion unit 10 may contain the heat dissipation unit 6 in a spatially closed state (including no opening AP).

The heat dissipation unit 6 may include base units 14PA, 14PB and a plurality of air-cooling fin units 16FA, 16FB connected to the base units 14PA, 14PB, and the base units 14PA, 14PB may be in contact with the thermal diffusion unit 10. For example, the base units 14PA, 14PB are respectively connected to the thermal diffusion unit 10 through the thermal conduction layers 12SA, 12SB. The thermal conduction layers 12SA, 12SB may be thermal conduction sheet layers or soldering layers, for example.

A portion of the heat dissipation unit 6 may include a non-contact unit NC other than the thermal diffusion unit 10 and the opening AP. It is used for avoiding the direct contact between the air-cooling fin unit 16FA, 16FB and the thermal diffusion unit 10, thereby ensuring the heat dissipation performance.

The value of RATIO=(T2−T3)/(T1−T2) is equal to or less than 25/LB (mm), where T1 is a surface temperature of the base unit, T2 is a root temperature of the air-cooling fin unit, T3 is a tip temperature of the air-cooling fin unit, and LB (mm) is a base length of the base unit. For example, in the case of LB (mm)=5 (mm), the RATIO=25/LB (mm)=5 or less.

In addition, the heat transfer coefficient of the material composing the thermal diffusion unit 10 is preferable to be equal to or greater than the heat transfer coefficient of the material composing the heat dissipation unit 6. This is to enhance the heat radiation performance and effectively dissipate the heat.

Moreover, the semiconductor apparatus 2 according to the fifth embodiment shown in FIG. 23 includes a thermal source 8 (TS) composed of a semiconductor device which generates heat in an operating state; a thermal diffusion unit 10 connected to the thermal source 8 (TS); a plurality of air-cooling fin units 16FA, 16FB connected to the thermal diffusion unit 10; and a thermal contact space unit OA between the thermal diffusion unit 10 and the plurality of air-cooling fin units 16FA, 16FB. Herein, the thermal contact space unit OA may be an air layer formed by natural air cooling or forced air cooling.

Moreover, the semiconductor apparatus 2 includes base units 14PA, 14PB connected to the thermal diffusion unit 10 through thermal conduction layers 12SA, 12SB. Moreover, the plurality of the air-cooling fin units 16FA, 16FB are respectively connected to the base units 14PA, 14PB through a plurality of thermal contact units.

The semiconductor apparatus 2 may further include an opening AP with an external space. Alternatively, as long as a structure that ensures the flow of air, the opening AP may not be provided.

The thermal diffusion unit 10 may be configured to efficiently diffuse the heat using a high thermal conductive material(s). For example, the thermal diffusion unit 10 may include copper (Cu) or a copper vapor chamber (CuVC).

Moreover, the base units 14PA, 14PB and the air-cooling fin unit 16FA, 16FB are composed of the same material.

Moreover, the thermal diffusion unit 10 or the base units 14PA, 14PB may include a graphite substrate having anisotropic thermal conductivity. More specifically, thermal diffusion unit 10 or base units 14PA, 14PB may effectively use the anisotropic thermal conductivity of the graphite substrate by disposing the graphite substrate in an orientation direction in which a heat transfer coefficient of the graphite substrate is relatively high.

Sixth Embodiment

Figure 24:
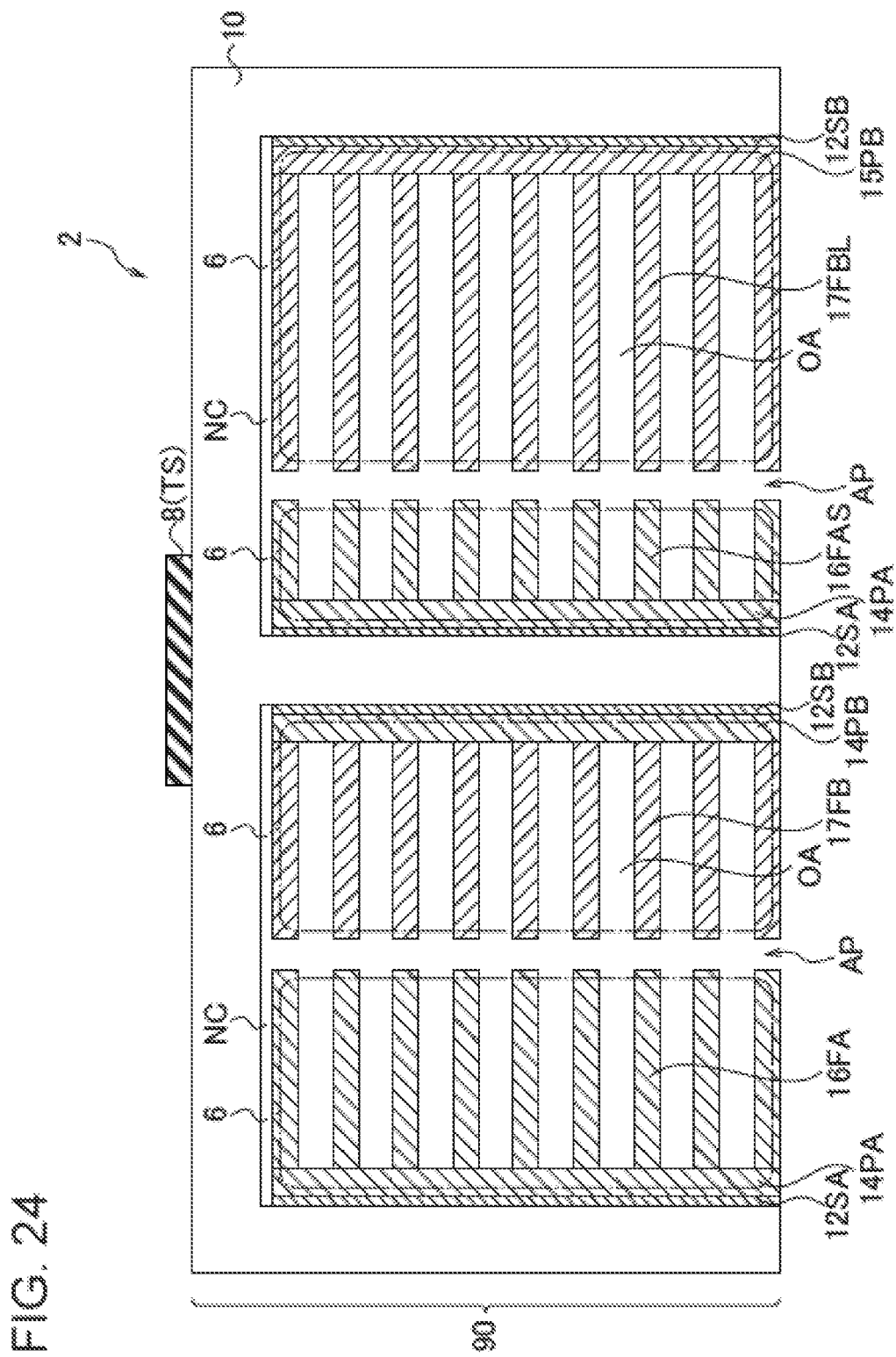
FIG. 24 is a schematic cross-sectional structure diagram of a semiconductor apparatus according to a sixth embodiment.

FIG. 24 shows a schematic cross-sectional structure of a semiconductor apparatus 2 according to a sixth embodiment.

The semiconductor apparatus 2 according to the sixth embodiment includes four heat dissipation units 6.

The semiconductor apparatus 2 according to the sixth embodiment includes: a thermal source 8 (TS) composed of a semiconductor device which generates heat in an operating state; a thermal diffusion unit 10 thermally connected to the thermal source 8 (TS); and a plurality of heat dissipation units 6 connected to the thermal diffusion unit, wherein the thermal diffusion unit 10 has a cooling apparatus 90 spatially containing the heat dissipation unit 6 (by the thermal contact space unit OA).

The thermal diffusion unit 10 includes an opening AP, and the space (thermal contact space unit OA) which contains the heat dissipation unit 6 is opened in the opening AP. Alternatively, the thermal diffusion unit 10 may contain the heat dissipation unit 6 in a spatially closed state (including no opening AP).

The heat dissipation unit 6 includes: base units 14PA, 14PB, 14PA, 15PB; and a plurality of air-cooling fin unit 16FA, 17FB, 16FAS, 17FBL connected to the base units 14PA, 14PB, 14PA, 15PB, wherein the base units 14PA, 14PB, 14PA, 15PB may be in contact with the thermal diffusion unit 10. The base units 14PA, 14PB, 14PA, 15PB are respectively connected to the thermal diffusion unit 10 through the thermal conduction layers 12SA, 12SB. The thermal conduction layers 12SA, 12SB may be thermal conduction sheet layers or soldering layers, for example.

A portion of the heat dissipation unit 6 may include a non-contact unit NC other than the thermal diffusion unit 10 and the opening AP. It is used for avoiding the direct contact between the air-cooling fin unit 16FA, 17FB, 16FAS, 17FBL and the thermal diffusion unit 10, thereby ensuring the heat dissipation performance.

The value of RATIO=(T2−T3)/(T1−T2) is preferable to be equal to or less than 25/LB (mm)

where T1 is a surface temperature of the base unit, T2 is a root temperature of the air-cooling fin unit, T3 is a tip temperature of the air-cooling fin unit, and LB (mm) is a base length of the base unit. For example, it is preferable that, in the case of LB (mm)=5 (mm), the RATIO=25/LB (mm)=5 or less.

In addition, the heat transfer coefficient of the material composing the thermal diffusion unit 10 is preferable to be equal to or greater than the heat transfer coefficient of the material composing the heat dissipation unit 6.

Moreover, the semiconductor apparatus 2 according to the sixth embodiment shown in FIG. 24 includes a thermal source 8 (TS) composed of a semiconductor device which generates heat in an operating state; a thermal diffusion unit 10 connected to the thermal source 8 (TS); and a plurality of air-cooling fin unit 16FA, 17FB, 16FAS, 17FBL connected to the thermal diffusion unit 10.

Moreover, the semiconductor apparatus 2 includes base units 14PA, 14PB, 14PA, 15PB connected to the thermal diffusion unit 10 through thermal conduction layers 12SA, 12SB. Moreover, the plurality of the air-cooling fin units 16FA, 17FB, 16FAS, 17FBL are respectively connected to the base units 14PA, 14PB, 14PA, 15PB through a plurality of thermal contact units.

Moreover, the semiconductor apparatus 2 includes a thermal contact space unit OA between the thermal diffusion unit 10 and the plurality of air-cooling fin unit 16FA, 17FB, 16FAS, 17FBL, which is surrounded with the thermal diffusion unit 10 and the plurality of air-cooling fin unit 16FA, 17FB, 16FAS, 17FBL. Herein, the thermal contact space unit OA may be an air layer formed by natural air cooling or forced air cooling.

The semiconductor apparatus 2 may further include an opening AP with an external space. Alternatively, as long as a structure that ensures the flow of air, the opening AP may not be provided.

The thermal diffusion unit 10 may be configured to efficiently diffuse the heat using a high thermal conductive material(s). For example, the thermal diffusion unit 10 may include copper (Cu) or a copper vapor chamber (CuVC).

In the semiconductor apparatus 2 according to the sixth embodiment, the base units 14PA, 14PB and the air-cooling fin unit 16FA are composed of the same material. Moreover, the air-cooling fin unit 16FA and the air-cooling fin unit 17FB are composed of materials different from each other.

On the other hand, the base unit 14PA and the air-cooling fin unit 16FAS are composed of the same material. The base unit 15PB and the air-cooling fin unit 17FBL are composed of the same material. The air-cooling fin unit 16FAS and the air-cooling fin unit 17FBL are composed of materials different from each other.

For example, the base units 14PA, 14PB may be composed of a relatively low thermal conduction material or may be composed of a relatively high thermal conductive material. On the other hand, the air-cooling fin unit 16FA may be composed of a relatively low thermal conduction material, and the air-cooling fin unit 17FB may be composed of a relatively high thermal conductive material.

Moreover, in the semiconductor apparatus 2 according to the sixth embodiment, the base unit 14PA and the air-cooling fin unit 16FAS are composed of the same material. Moreover, the base unit 15PB and the air-cooling fin unit 17FBL are composed of the same material.

On the other hand, the base unit 14PA and the base unit 15PB are composed of materials different from each other, and the air-cooling fin unit 16FAS and the air-cooling fin unit 17FBL are composed of materials different from each other. For example, the base unit 14PA may be composed of a relatively low thermal conduction material, and the base unit 15PB may be composed of a relatively high thermal conductive material. Similarly, the air-cooling fin units 16FA, 16FAS may be composed of a relatively low thermal conduction material, and the air-cooling fin units 17FB, 17FBL may be composed of a relatively high thermal conductive material.

In the semiconductor apparatus 2 according to the sixth embodiment, it is configured so that the length of the air-cooling fin unit 16FAS is relatively short compared with the length of the air-cooling fin unit 16FBL. Other configurations are the same as those of the semiconductor apparatus 2 according to the fifth embodiment.

The semiconductor apparatus 2 according to the embodiments includes the thermal diffusion unit 10 configured to diffuse the heat using a high thermal conductive material, the base unit connected to the thermal diffusion unit, and the thermal contact unit in thermally contact with the base unit and the plurality of air-cooling fin units at the plurality of points, wherein the plurality of the air-cooling fin units is in thermally contact with the thermal diffusion unit through the base unit at the plurality of points, and thereby the reduction of the thermal resistance of the cooling apparatus can be realized in the limited space (thermal contact space unit OA).

Moreover, the thermal diffusion unit 10 or the base units 14PA, 14PB, 14PA, 15PB may include a graphite substrate having anisotropic thermal conductivity. More specifically, thermal diffusion unit 10 or base units 14PA, 14PB, 14PA, 15PB may effectively use the anisotropic thermal conductivity of the graphite substrate by disposing the graphite substrate in an orientation direction in which a heat transfer coefficient of the graphite substrate is relatively high.

Configuration Example of SiC PM (2-in-1)

Figure 25B:
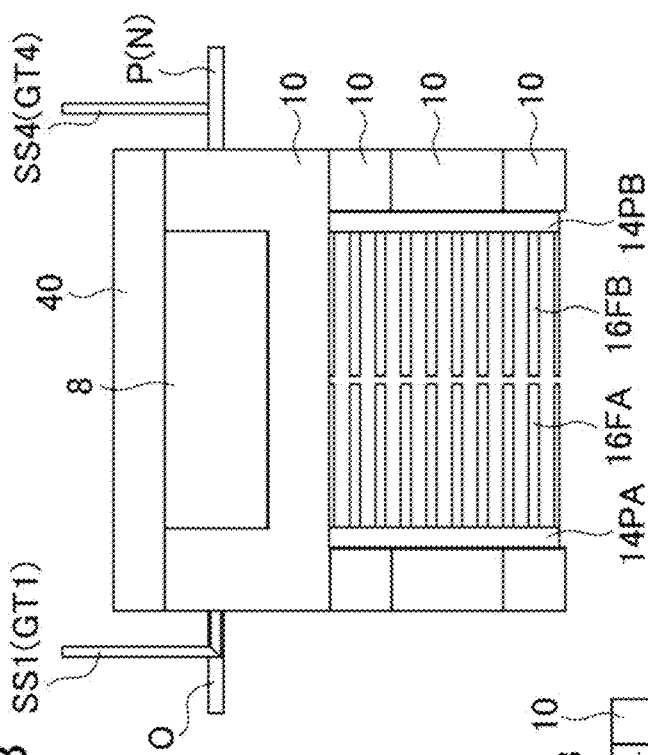
FIG. 25B is a front view diagram of the SiC PM (2-in-1) 8 according to the embodiments, as viewed from the arrow A in FIG. 25A.
Figure 25C:
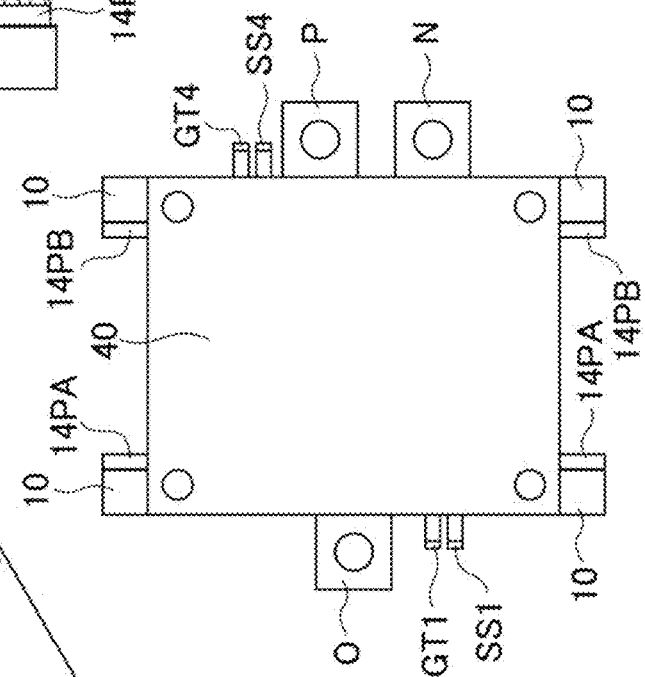
FIG. 25C is a top view diagram of the SiC PM (2-in-1) 8 according to the embodiments, which is mounted on the semiconductor apparatus according to the embodiments.
Figure 25A:
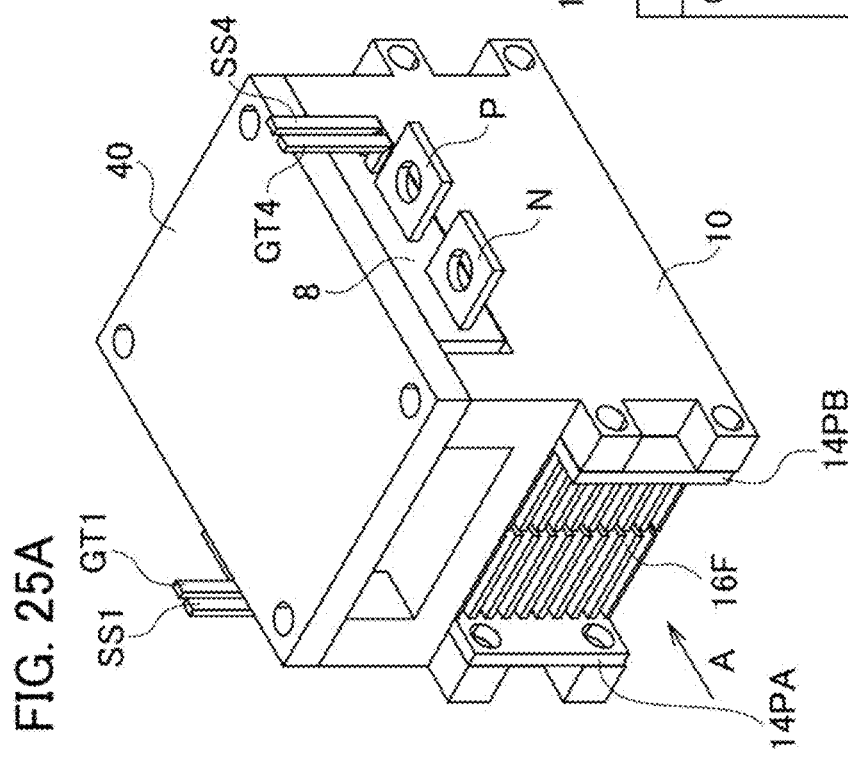
FIG. 25A is a bird's-eye view configuration diagram of an SiC PM (2-in-1) 8 according to the embodiments, which is mounted on the semiconductor apparatus according to the embodiments.

FIG. 25A shows a bird's-eye view configuration of an SiC PM (2-in-1) 8 according to the embodiments, which is mounted on the semiconductor apparatus 2 according to the embodiments; FIG. 25B is a front view diagram thereof as viewed from the arrow A in FIG. 25A; and FIG. 25C is a top view diagram thereof.

The SiC PM 8 according to the embodiments shown in FIGS. 25A to 25C can be mounted in the semiconductor apparatus 2 disclosed in the embodiments. The SiC PM 8 according to the embodiments may be mounted in any one of the semiconductor apparatuses 2 respectively disclosed in the first to sixth embodiments.

The SiC PM 8 according to the embodiments is disposed by being pressurized between a pressing plate 40 and the thermal diffusion unit 10. In this case, the pressurizing may be implemented by screwing. The thermal diffusion unit 10 can be formed of copper (Cu) or a copper vapor chamber, for example.

The SiC PM 8 according to the embodiments includes a 2-in-1 configuration. The circuit configuration is similarly shown as FIG. 40 described below.

In FIGS. 25A to 25C, reference signs SS1, GT1 respectively denote a source sense terminal electrode and a gate signal terminal electrode of a transistor Q1 at a side of an upper arm of the SiC PM 8 including the 2-in-1 configuration, and reference signs SS4, GT4 respectively denote a source sense terminal electrode and a gate signal terminal electrode of a transistor Q4 at a side of a lower arm of the SiC PM 8 including the 2-in-1 configuration. Moreover, reference signs P, N respectively denote a positive side power input terminal electrode (first power source) and a negative side power input terminal electrode (second power source) of the SiC PM 8 including the 2-in-1 configuration, and reference sign O denotes an output terminal electrode thereof.

Figure 26:
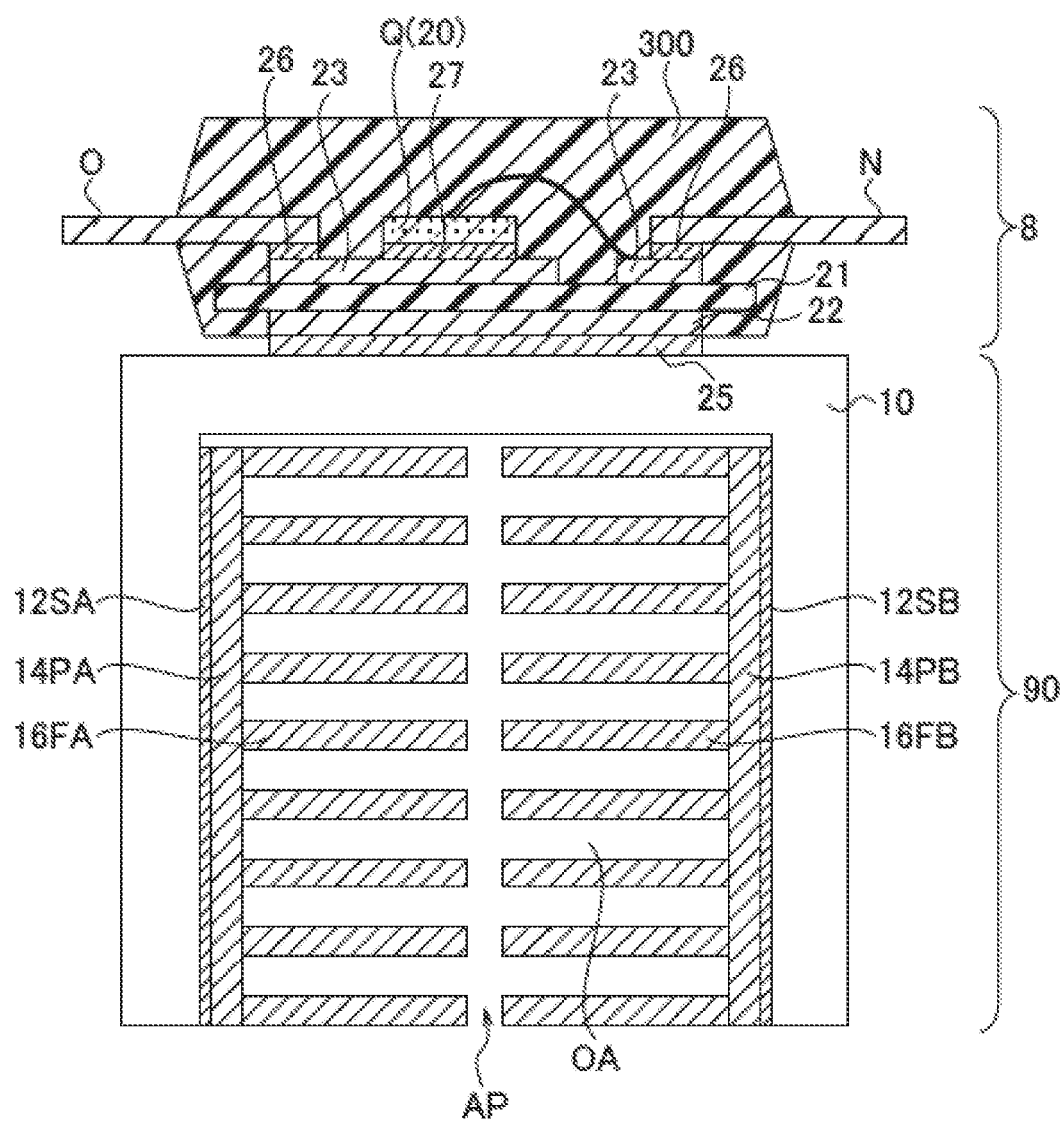
FIG. 26 is a schematic cross-sectional structure diagram of a configuration example in which the SiC PM is mounts on the semiconductor apparatus according to the embodiments.

FIG. 26 shows a schematic cross-sectional structure of a configuration example in which the SiC PM 8 is mounted at a center portion of the thermal diffusion unit 10 of the semiconductor apparatus 2 according to the first embodiment.

The PM 8 includes a semiconductor device Q20 corresponding to the thermal source TS which generates heat in an operating state. The semiconductor device Q20 is disposed on a ceramics insulating substrate, for example. The ceramics insulating substrate can be formed of a DBC substrate, for example.

In the example shown in FIG. 26, the ceramics insulating substrate includes a ceramics substrate 21, a front surface electrode layer 23 of the ceramics substrate 21, and a back surface electrode layer 22 of the ceramics substrate 21. The semiconductor device Q20 is bonded with an Ag fired layer 27 on the front surface electrode layer 23, for example. Moreover, the back surface electrode layer 22 is connected to the cooling apparatus 90 through a thermal conduction layer 25. The semiconductor device Q20 may include an IGBT, a diode, an Si based MOSFET, or a GaN based FET, for example. The thermal conduction layer 25 may include any one of a thermal conduction sheet layer, a soldering layer or an Ag fired layer, for example. Moreover, the PM 8 is resin-molded with a mold resin layer 300, such as a silicone resin or a polyimide resin.

Heat from the semiconductor device Q20 corresponding to the thermal source TS which generates heat in the operating state is transferred to the cooling apparatus 90 through the Ag fired layer 27, the ceramics insulating substrate (23/21/22), and the thermal conduction layer 25.

(Assembling Method of SiC PM (2-in-1))

In an assembling method of the SiC PM (2-in-1) 8 according to the embodiments, FIG. 27A shows a process of attaching the SiC PM 8 to the vapor chamber 10, FIG. 27B shows a process of attaching the air-cooling fin unit 16F to the vapor chamber 10, and FIG. 27C shows a process of attaching the fan 50F thereto.

(A) First, as shown in FIG. 27A, a thermal conduction sheet is set on a bottom surface of the SiC PM 8, and the pressing plate 40 is disposed on the SiC PM 8. The pressing plate 40 is pressurized by screw fastening, and the SiC PM 8 is attached to the vapor chamber 10. In this case, soldering may be performed instead of using the thermal conduction sheet. In FIG. 27A, the thermal conduction sheet and the screw thread are not shown.

(B) Next, as shown in FIG. 27B, a thermal conduction sheet is set between the base units 14A, 14B of the air-cooling fin unit 16F and the vapor chamber 10, a pressing plate is pressurized by screw fastening to attach the air-cooling fin unit 16F to the vapor chamber 10. In this case, soldering may be performed instead of using the thermal conduction sheet. In FIG. 27B, the thermal conduction sheet and the screw thread are not shown.

(C) Next, as shown in FIG. 27C, the fan 50F is attached to a front of the air-cooling fin unit 16F.

Configuration Example of SiC PM (6-in-1)

Figure 28A:
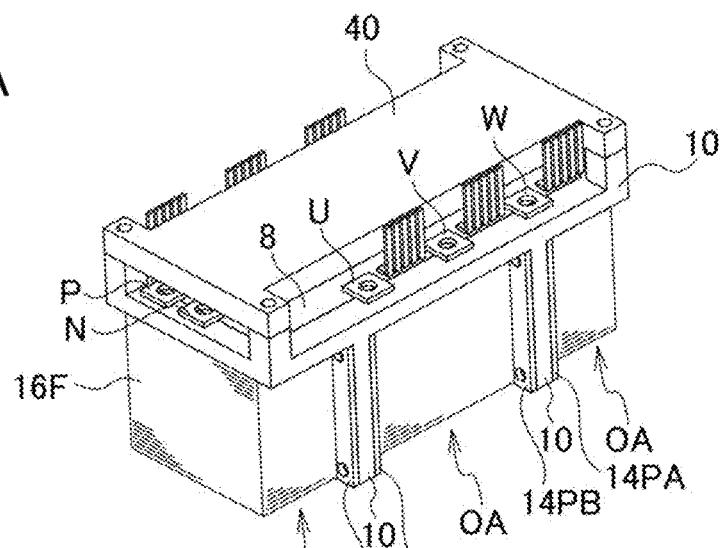
FIG. 28A is a bird's-eye view configuration diagram of an SiC PM (6-in-1) according to the embodiments, which is mounted on the semiconductor apparatus according to the embodiments.
Figure 28B:
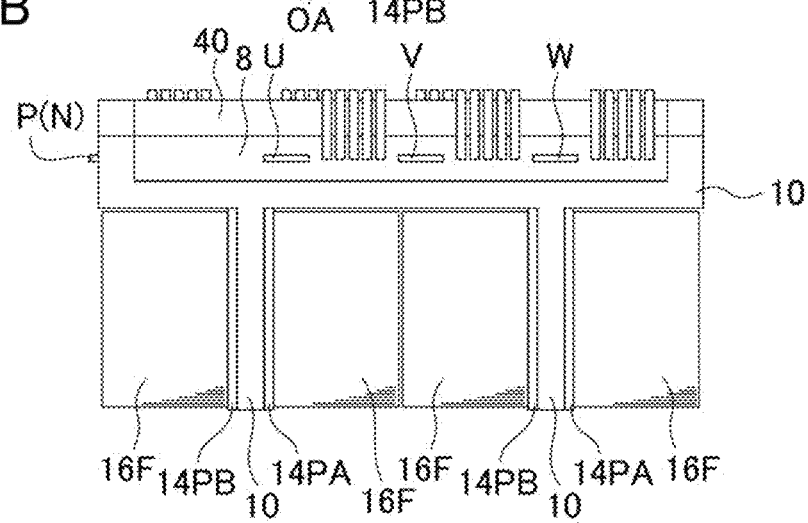
FIG. 28B is a side view diagram of the SiC PM (6-in-1) according to the embodiments, which is mounted on the semiconductor apparatus according to the embodiments.

FIG. 28A shows a bird's-eye view configuration of an SiC PM (6-in-1) 8 according to the embodiments, which is mounted on the semiconductor apparatus 2 according to the embodiments; FIG. 28B shows a side view diagram thereof; and FIG. 28C shows a top view diagram thereof.

Figure 28C:
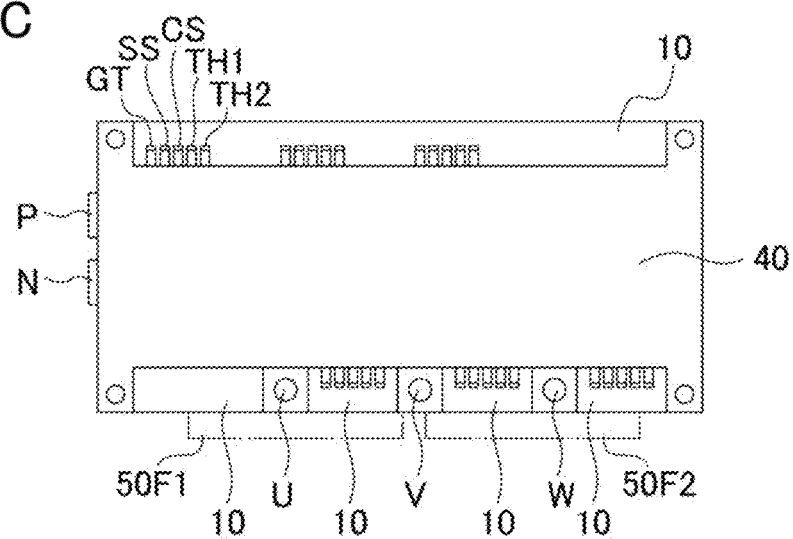
FIG. 28C is a top view diagram of the SiC PM (6-in-1) according to the embodiments, which is mounted on the semiconductor apparatus according to the embodiments.

The SiC PM 8 according to the embodiments can be mounted on the semiconductor apparatus 2 disclosed in the embodiments, as shown in FIGS. 28A to 28C. The SiC PM 8 according to the embodiments may be mounted in any one of the semiconductor apparatuses 2 respectively disclosed in the first to sixth embodiments. In this context, the structure of the semiconductor apparatus shown in FIGS. 28A to 28C corresponds to a further extended structure of the semiconductor apparatuses 2 disclosed in the fifth to sixth embodiments. More specifically, three thermal contact space units OA surrounded with the thermal diffusion unit 10 are provided, as shown in FIG. 30 described below. In FIGS. 28A to 28C, the thermal diffusion units (vapor chambers corresponding to 10V and 10W) are also disposed on the front and back surfaces of the cooling apparatus in the similar manner in FIG. 30; but illustration of the thermal diffusion units is omitted in order to show the internal structure.

The SiC PM 8 according to the embodiments is disposed by being pressurized between the pressing plate 40 and the thermal diffusion unit 10, as shown in FIGS. 28A to 28C. In this case, the pressurizing may be implemented by screwing. The thermal diffusion unit 10 can be formed of copper (Cu) or a copper vapor chamber, for example.

The SiC PM 8 according to the embodiments includes a 6-in-1 configuration. The circuit configuration is similarly shown as FIG. 45 described below.

In FIGS. 28A to 28C, reference signs SS, GT, CS respectively denote a source sense terminal electrode, a gate signal terminal electrode, and a current sense terminal electrode of each transistor Q1 to Q6 of the SiC PM 8 including the 6-in-1 configuration. Moreover, reference signs TH1, TH2 respectively denote thermistor terminal electrodes for temperature sensing. Moreover, reference signs P, N respectively denote a positive side power input terminal electrode (first power source) and a negative side power input terminal electrode (second power source) of the SiC PM 8 including the 6-in-1 configuration. Moreover, reference signs U, V, W respectively denotes output terminal electrodes.

(Assembling Method of SiC PM (6-in-1))

Figure 29A:
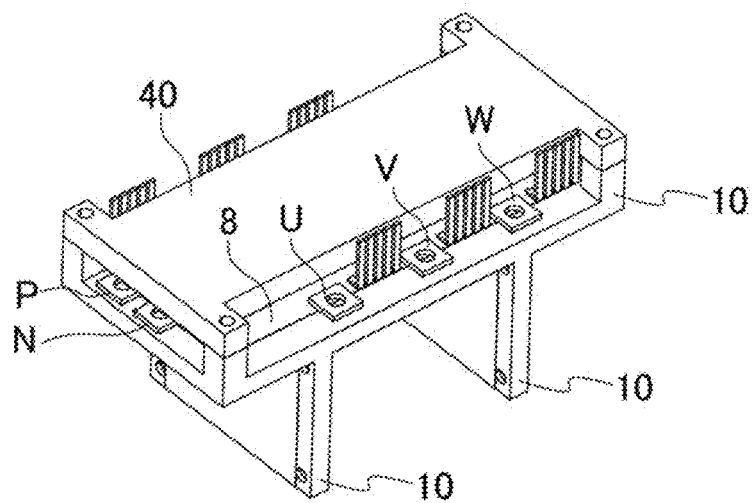
FIG. 29A is a process chart of an assembling method of the SiC PM (6-in-1) according to the embodiments, which is attaching the SiC PM to a vapor chamber.
Figure 29B:
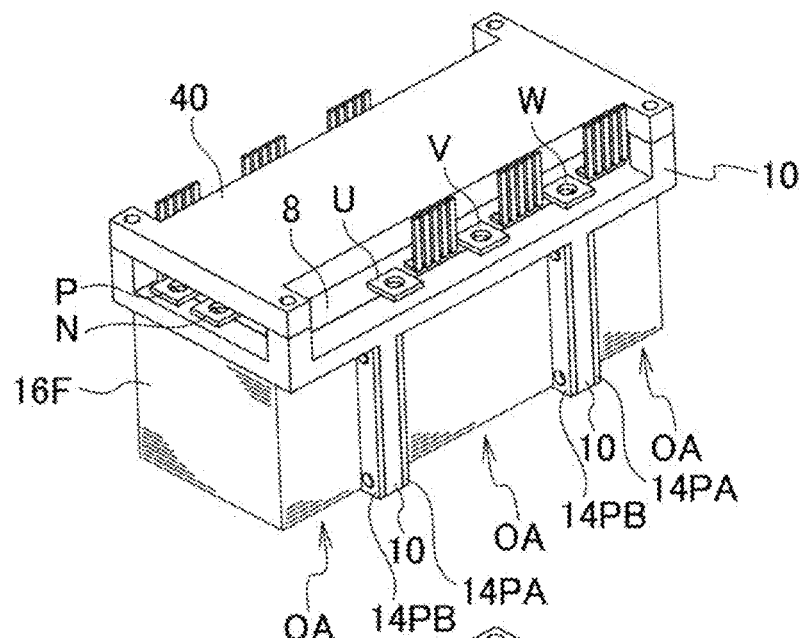
FIG. 29B is a process chart of the assembling method of the SiC PM (6-in-1) according to the embodiments, which is attaching the air-cooling fin unit to the vapor chamber.
Figure 29C:
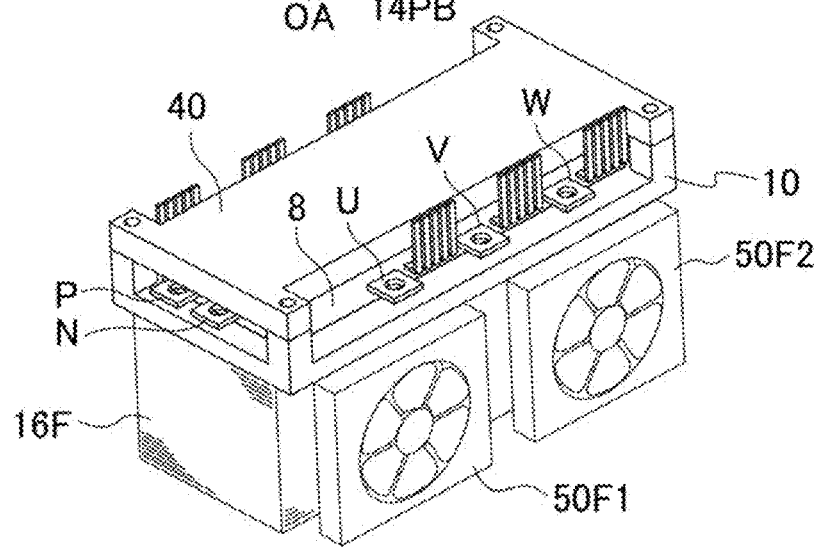
FIG. 29C is a process chart of the assembling method of the SiC PM (6-in-1) according to the embodiments, which is attaching a fan thereto.

In an assembling method of the SiC PM (6-in-1) 8 according to the embodiments, FIG. 29A shows a process of attaching the SiC PM 8 to the vapor chamber 10, FIG. 29B shows a process of attaching the air-cooling fin unit 16F to the vapor chamber 10, and FIG. 29C shows a process of attaching the fans 50F1, 50F2 thereto.

(A) First, as shown in FIG. 29A, a thermal conduction sheet is set on a bottom surface of the SiC PM 8, and the pressing plate 40 is disposed on the SiC PM 8. The pressing plate 40 is pressurized by screw fastening, and the SiC PM 8 is attached to the vapor chamber 10. In this case, soldering may be performed instead of using the thermal conduction sheet. In FIG. 29A, the thermal conduction sheet and the screw thread are not shown.

(B) Next, as shown in FIG. 29B, a thermal conduction sheet is set between the base units 14PA, 14PB of the air-cooling fin unit 16F and the vapor chamber 10, a pressing plate is pressurized by screw fastening to attach the air-cooling fin unit 16F to the vapor chamber 10. In this case, soldering may be performed instead of using the thermal conduction sheet. In FIG. 29B, the thermal conduction sheet and the screw thread are not shown.

(C) Next, as shown in FIG. 29C, the fans 50F1, 50F2 are attached to a front of the air-cooling fin unit 16F.

Another Configuration Example of SiC PM (6-in-1)

FIG. 30 shows another configuration of an SiC PM (6-in-1) according to the embodiments, which is mounted on the semiconductor apparatus 2 according to the embodiments.

The vapor chamber 10 applicable to the semiconductor apparatus according to the embodiments may include a monolithic structure, or may include a structure of being divided with each other as shown in FIG. 30.

In the configuration shown in FIG. 30, thermal diffusion units 10U, 10V, 10W divided from one another are provided. Moreover, PMs 80U, 80V, 80W divided to correspond to U phase, V phase, W phase are respectively disposed on the thermal diffusion units 10U, 10V, 10W divided, and thereby the efficiency of the heat dissipation is further improved. In FIG. 30, although the base unit and the thermal conduction layer which are connected to the air-cooling fin unit 16F are formed in the similar manner in FIG. 23, illustration thereof is omitted.

(Vapor Chamber)

Figure 31A:
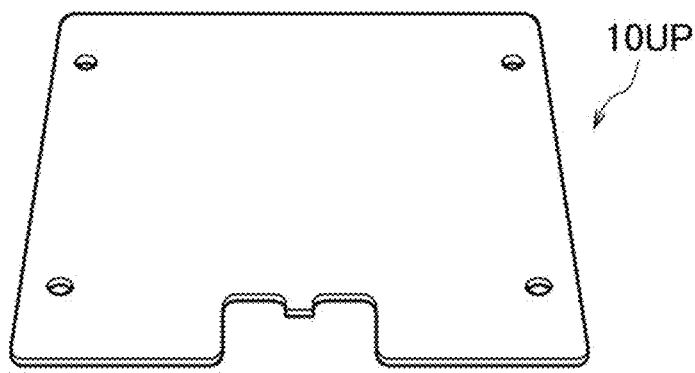
FIG. 31A is a bird's-eye view of an upper container of a vapor chamber applicable to the semiconductor apparatus according to the embodiments.
Figure 31B:
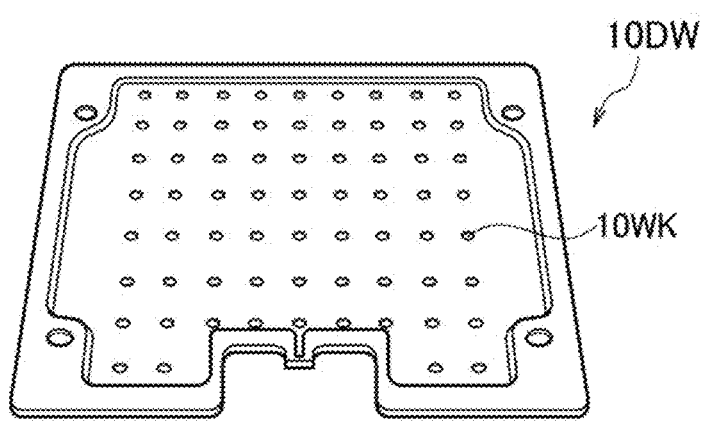
FIG. 31B is a bird's-eye view of a lower container of the vapor chamber applicable to the semiconductor apparatus according to the embodiments.
Figure 31C:
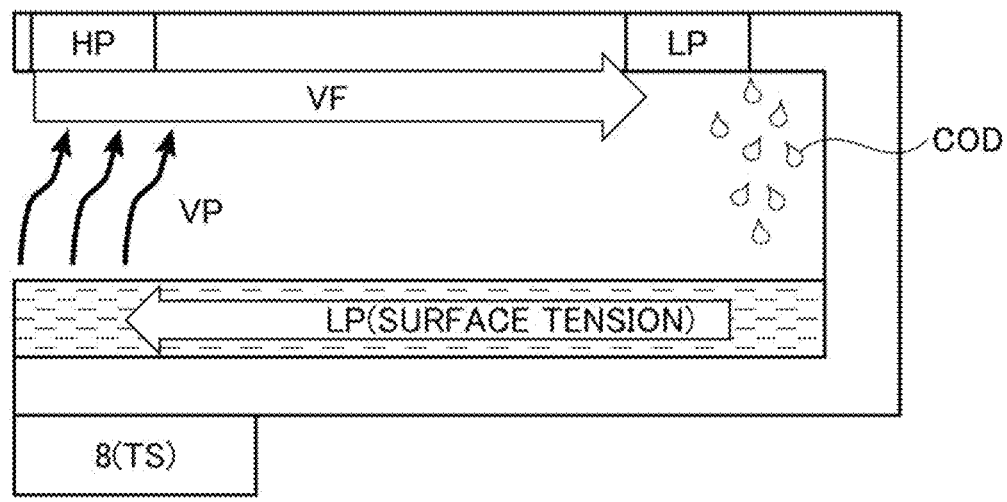
FIG. 31C is an explanatory diagram of an operational principle of the vapor chamber applicable to the semiconductor apparatus according to the embodiments.

FIG. 31A shows a bird's-eye view of an upper container 10UP of a vapor chamber 10 applicable to the semiconductor apparatus according to the embodiments, FIG. 31B shows a bird's-eye view of a lower container 10DW thereof, and FIG. 31C shows an explanatory diagram of an operational principle thereof. A plurality of wicks 10WK are formed on the lower container 10DW. The plurality of wicks 10WK allow liquid flow by surface tension.

(A) First, since heat is generated when the PM 8 (TS) in contact with the vapor chamber 10 operates, a working fluid evaporates (VP) to generate vapor.

(B) Next, the vapor moves due to a pressure difference between a high pressure portion HP and a low pressure portion LP caused by the evaporation (VP) of the working fluid, vapor flow VF is generated as shown in FIG. 31C.

(C) Next, the heat is dissipated at an end of the vapor chamber 10, and a state of the vapor flow VF is changed to a state of a liquid (COD) by condensation effects.

(D) Next, as shown in FIG. 31C, a liquid flow LP (SURFACE TENSION) is generated by a capillary force accompanying the surface tension by the plurality of wicks 10WK.

In the vapor chamber 10 applicable to the semiconductor apparatus according to the embodiments, the thermal transfer efficiency due to the phase change is extremely high, and the value of the heat transfer coefficient, approximately 3000 (W/mK) degree can be obtained, for example.

(Graphite Plate)

Figure 32:
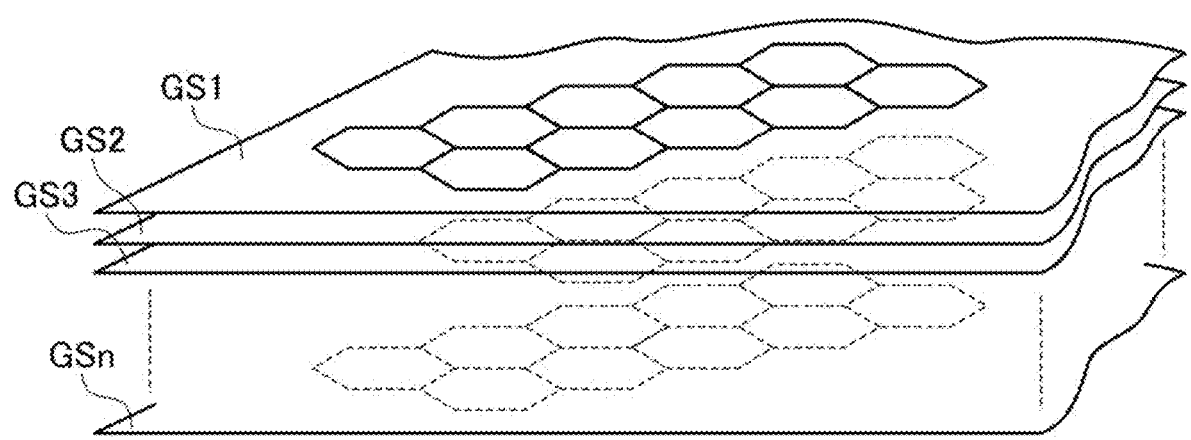
FIG. 32 is a schematic bird's-eye view configuration diagram showing a laminated structure of a graphite plate (graphite sheet) composing a graphite substrate applicable to the semiconductor apparatus according to the embodiments.

FIG. 32 shows a schematic bird's-eye view configuration of a laminated structure of a graphite plate (graphite sheet)

composing a graphite substrate applicable to the semiconductor apparatus according to the embodiments.

As shown in FIG. 32, graphite sheets GS1, GS2, GS3, . . . , GSn of each surface composed of n layers have many covalent bonding of hexagonal crystal in one laminated crystal structure, and between the graphite sheets GS1, GS2, GS3, . . . , GSn of each surface are bonded to one another with Van der Waals force.

More specifically, the graphite which is a carbon based anisotropic thermal conducting material is a laminated crystal body of a hexagonal mesh structure of carbon atom, and the thermal conduction thereof also has anisotropy, and the graphite sheets GS1, GS2, GS3, . . . , GSn shown in FIG. 32 have a thermal conductivity higher than that in a thickness direction of Z-axis with respect to a crystal surface direction (on the XY plane).

Figure 33A:
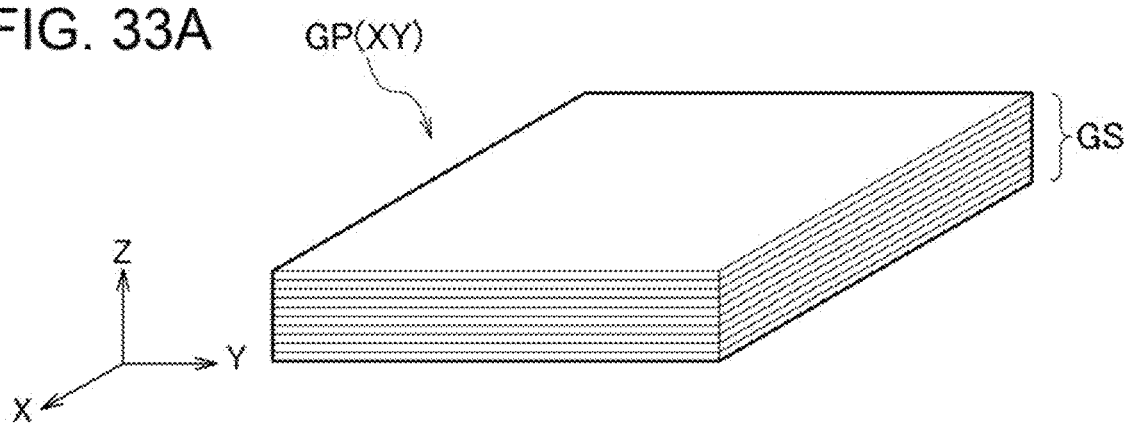
FIG. 33A is a schematic bird's-eye view configuration diagram showing an application example of a graphite substrate of XY orientation, in an example of a graphite substrate applicable to the semiconductor apparatus according to the embodiments.
Figure 33B:
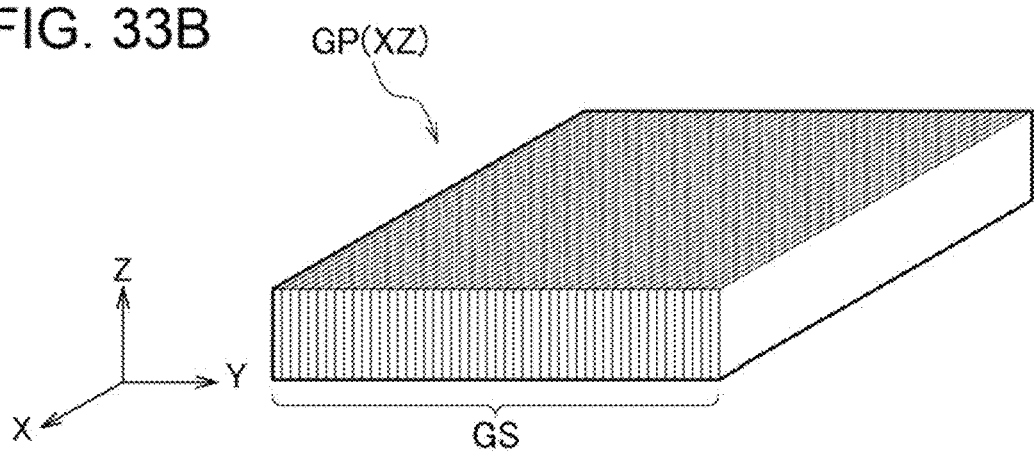
FIG. 33B is a schematic bird's-eye view configuration diagram showing an application example of a graphite substrate of XZ orientation, in an example of a graphite substrate applicable to the semiconductor apparatus according to the embodiments.
Figure 33C:
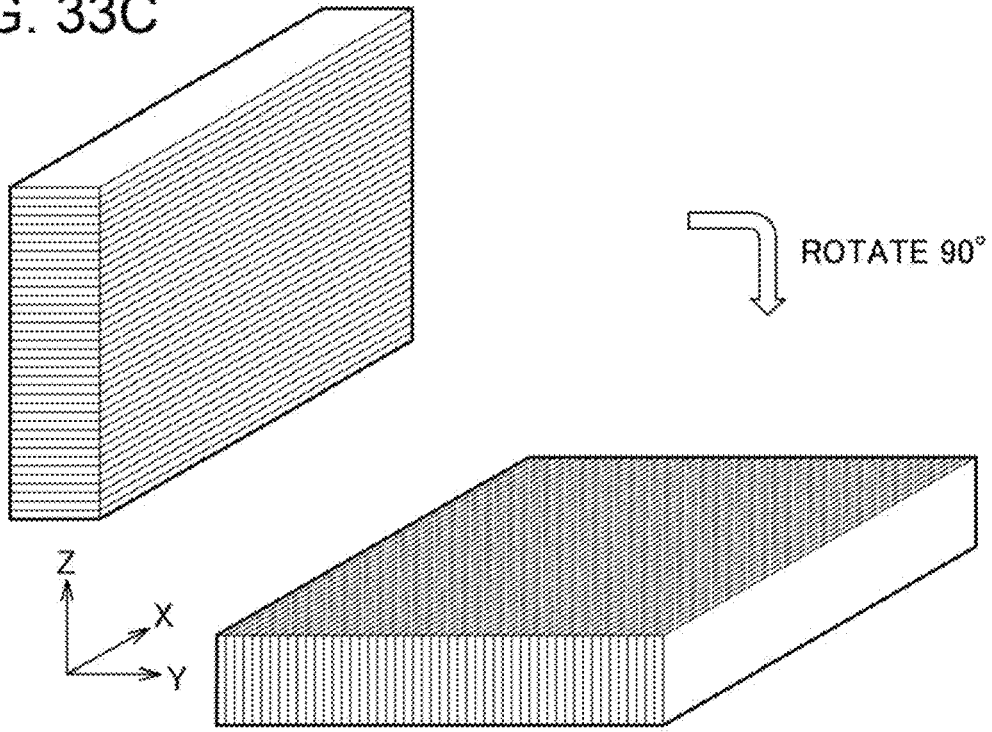
FIG. 33C is an explanatory diagram showing an aspect in which a graphite substrate of XZ orientation is obtained by rotating the graphite substrates of XY orientation by 90 degrees, in an example of the graphite substrate applicable to the semiconductor apparatus according to the embodiments.

In an example of the graphite substrate applicable to the semiconductor apparatus according to the embodiments, FIG. 33A shows a schematic bird's-eye view configuration of an application example of a graphite substrate GP (XY) of XY orientation, FIG. 33B shows a schematic bird's-eye view configuration of a graphite substrate GP (XZ) of XZ orientation, and FIG. 33C shows an explanatory diagram showing an aspect in which a graphite substrate GP (XZ) of XZ orientation is obtained by rotating the graphite substrates GP (XY) of XY orientation by 90 degrees.

In the semiconductor apparatus according to the embodiments, two types of graphite substrates can be applied to the thermal diffusion unit 10. More specifically, a graphite substrate GP (XZ) having the XZ orientation having a higher heat transfer coefficient in a thickness direction than that a plane direction, and a graphite substrate GP (XY) having the XY orientation having a higher heat transfer coefficient in the plane direction than that in the thickness direction can be applied.

Accordingly, as shown in FIG. 33A, the graphite substrate GP (XY) having XY orientation is provided with thermal conductivities X=1500 (W/mK), Y=1500 (W/mK), and Z=5 (W/mK), for example.

Meanwhile, as shown in FIG. 33B, the graphite substrate GP (XZ) having XZ orientation is provided with thermal conductivities X=1500 (W/mK), Y=5 (W/mK), and Z=1500 (W/mK), for example.

In addition, the density of each graphite substrate GP (XY) and GP(XZ) is approximately 2.2 (g/cm$^3$), and the thickness thereof is approximately 0.7 mm to approximately 10 mm, for example, and the size thereof is equal to or less than approximately 40 mm×approximately 40 mm, for example.

Moreover, in the semiconductor apparatus 2 according to the embodiments, the graphite substrate can be applied to the heat dissipation unit 6. More specifically, the graphite substrate may be applied to the base unit 14 of the air-cooling fin which composes the heat dissipation unit 6. The point that two types of graphite substrates can be applied is the same as described above.

In the embodiments, graphite substrates GP(XY) and GP (XZ) which are anisotropy and have the high coefficient of thermal conductivity can be used, and thereby it can provide the semiconductor apparatus having satisfactory heat diffusibility and simple structure, capable of further reducing the thermal resistance.

(Simulation Result of Effect Verification)

Figure 34:
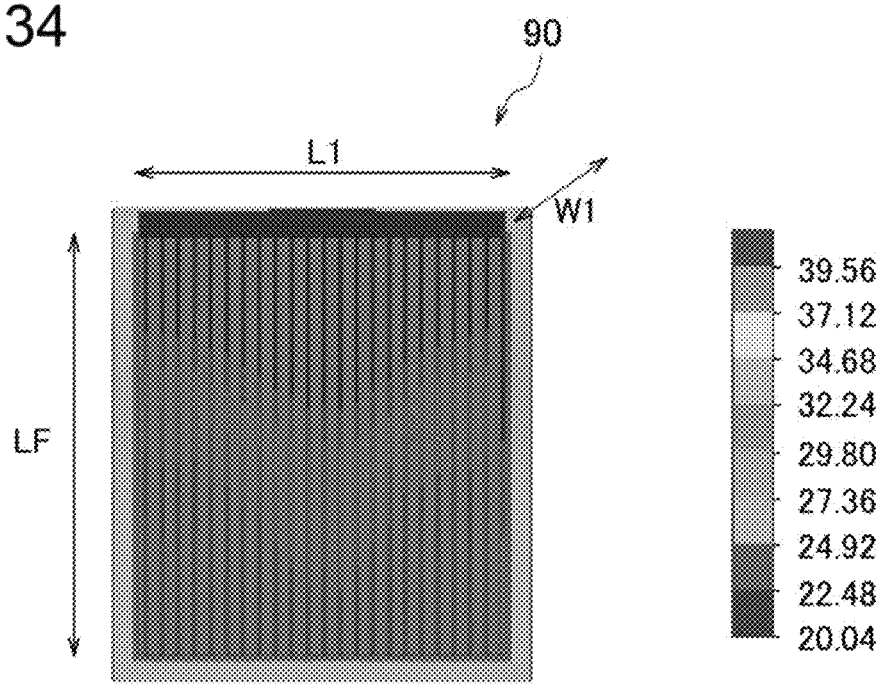
FIG. 34 shows a simulation result of an effect verification of a cooling apparatus according to a comparative example.

FIG. 34 shows a simulation result of an effect verification of a cooling apparatus 90 according to a comparative example. In FIG. 34, the thermal diffusion unit is disposed as copper (Cu) or a copper vapor chamber (CuVC) on a base surface, and the air-cooling fin unit is extended in a vertical direction from the base surface. In FIG. 34, the base width L1 is 70 mm, and the base length LB is 5 mm. The air-cooling fin unit is formed with copper (Cu) in which the width of the air-cooling fin WP is 0.6 mm, the fin space FS is 2.5 mm, and the length of the air-cooling fin LF is 80 mm. The thickness of the cooling apparatus W1 is 70 mm.

According to the simulation result of the effect verification of the cooling apparatus 90 according to the comparative example, it is proved that the heat is not transferred up to a tip portion of the air-cooling fin unit, as shown in FIG. 34.

Figure 35:
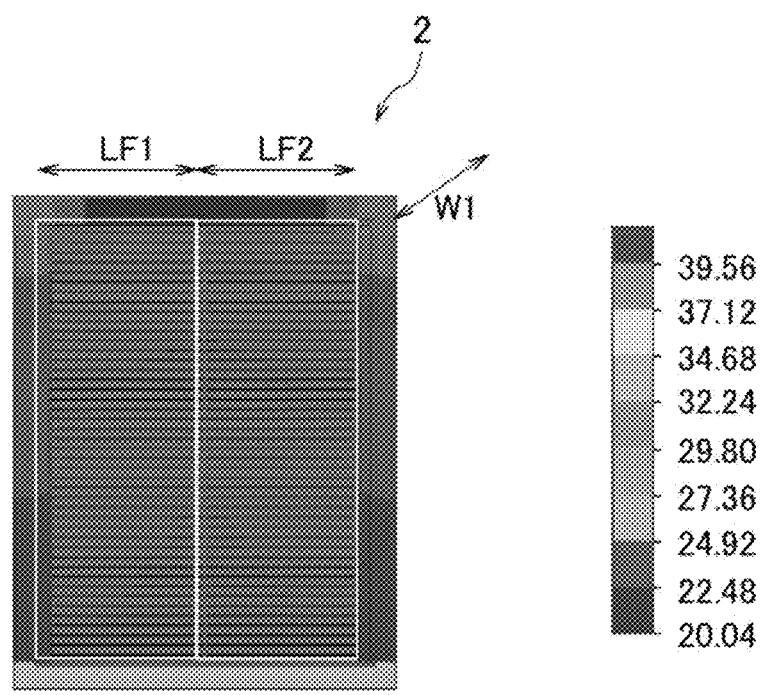
FIG. 35 shows a simulation result of an effect verification of the semiconductor apparatus according to the embodiment (Cu).

FIG. 35 shows a simulation result of effect verification of the semiconductor apparatus 2 including the cooling apparatus according to the embodiments (Cu). In FIG. 35, the thermal diffusion unit and the air-cooling fin unit are composed in the similar manner shown in FIG. 6. In FIG. 35, the thermal diffusion unit is formed with copper (Cu) in which the base width L1 is 80 mm and the base length LB is 5 mm. The air-cooling fin unit is formed with copper (Cu) in which the width of the air-cooling fin WP is 0.3 mm, the fin space FS is 1.5 mm, and the length of the air-cooling fin LF is 30 mm. The thickness of the cooling apparatus W1 is 70 mm.

According to the simulation result of the effect verification of the semiconductor apparatus 2 including the cooling apparatus according to the embodiments (Cu), it is proved that the heat transfer state is relatively reduced at a side surface of the thermal diffusion unit in contact with the base unit, as shown in FIG. 35.

Figure 36:
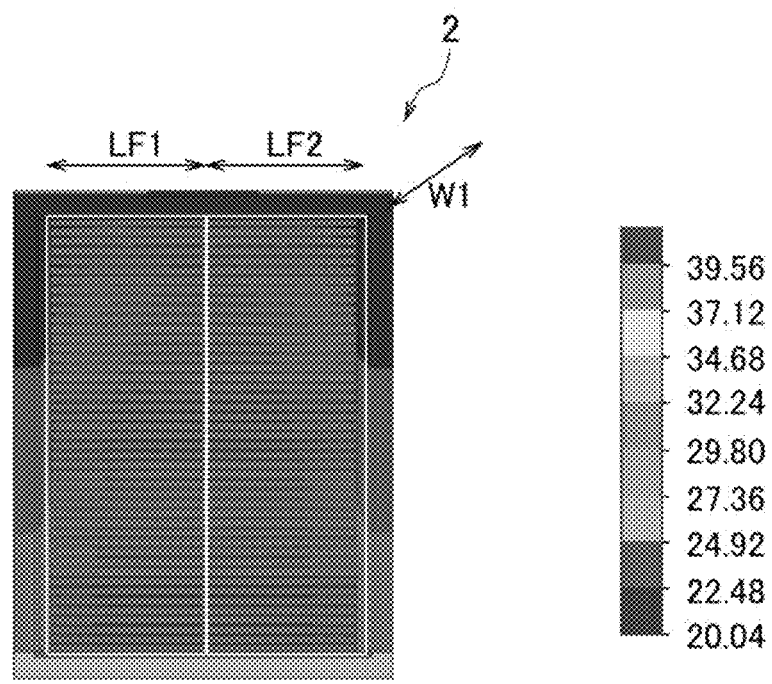
FIG. 36 shows a simulation result of an effect verification of the semiconductor apparatus according to the embodiment (CuVC).

FIG. 36 shows a simulation result of effect verification of the semiconductor apparatus 2 including the cooling apparatus according to the embodiments (CuVC). Also in FIG. 36, the thermal diffusion unit and the air-cooling fin unit are composed in the similar manner shown in FIG. 6. In FIG. 36, the thermal diffusion unit is formed with copper (CuVC) in which the base width L1 is 80 mm and the base length LB is 5 mm. The air-cooling fin unit is formed with copper (Cu) in which the width of the air-cooling fin WP is 0.3 mm, the fin space FS is 1.5 mm, and the length of the air-cooling fin LF is 30 mm. The thickness of the cooling apparatus W1 is 70 mm.

According to the simulation result of the effect verification of the semiconductor apparatus 2 including the cooling apparatus according to the embodiments (CuVC), as shown in FIG. 36, it is proved that the heat can be transferred up to the tip portion of the air-cooling fin unit.

Figure 37:
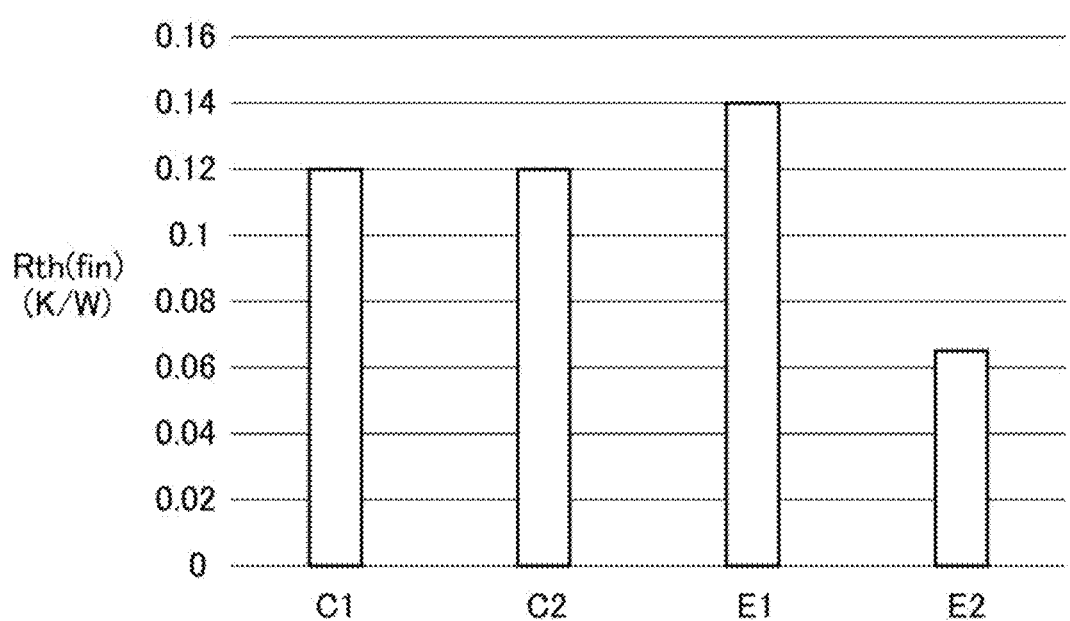
FIG. 37 shows a simulation result of a thermal resistance Rth (fin) of the semiconductor apparatuses according to a comparative example 1, a comparative example 2, the embodiment (Cu), and the embodiments (CuVC).

FIG. 37 shows simulation results of the thermal resistance Rth (fin) of the semiconductor apparatuses including cooling apparatuses according to the comparative examples 1 and 2, the embodiment (Cu), and the embodiment (CuVC). The semiconductor apparatus including the cooling apparatus according to the comparative example 1 corresponds to an example of forming the thermal diffusion unit with copper (Cu) in the configuration shown in FIG. 34. The semiconductor apparatus including the cooling apparatus according to the comparative example 2 corresponds to an example of forming the thermal diffusion unit with the copper vapor chamber (CuVC) in the configuration shown in FIG. 34. The semiconductor apparatus including the cooling apparatus according to the embodiment (Cu) corresponds to the configuration shown in FIG. 35, and the semiconductor apparatus including the cooling apparatus according to the embodiment (CuVC) corresponds to the configuration shown in FIG. 36.

The values of the thermal resistance Rth (fin) (K/W) of the comparative example 1, the comparative example 2, the embodiment (Cu), and the embodiment (CuVC) are respectively approximately 0.12 (K/W), approximately 0.12 (K/W), approximately 0.14 (K/W), and approximately 0.065 (K/W).

In the semiconductor apparatus including the cooling apparatus according to the comparative example 2, since the heat spreads on the base surface, the low thermal resistance effect obtained by forming the thermal diffusion unit with the copper vapor chamber (CuVC) is not obtained.

In the semiconductor apparatus including the cooling apparatus according to the embodiment (Cu), heat transfer to the side surface of the thermal diffusion unit in contact with the base unit of the air-cooling fin is reduced.

In the semiconductor apparatus including the cooling apparatus according to the embodiment (CuVC), heat transfer up to the side surface of the thermal diffusion unit in contact with the base unit of the air-cooling fin can be realized. Therefore, the cooling efficiency is increased and the thermal resistance Rth (fin) (K/W) is reduced by approximately 46%, as compared with those of the comparative examples 1 and 2.

Concrete Example of Semiconductor Device

Figure 38:
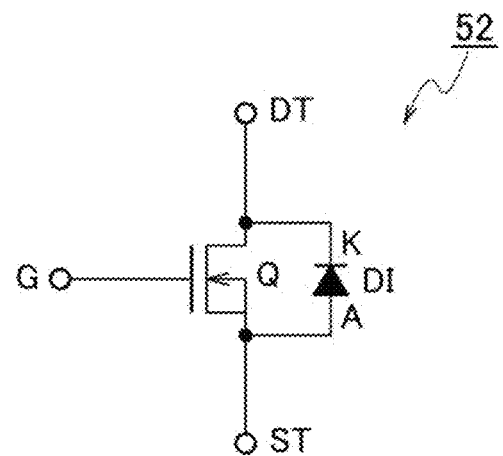
FIG. 38 is a schematic circuit representative diagram of a Silicon Carbide Metal Oxide Semiconductor Field Effect Transistor (SiC MOSFET) of a 1-in-1 module, which is the PM to be mounted on the semiconductor apparatus according to the embodiments.

FIG. 38 shows a schematic circuit representation of SiC MOSFET of 1-in-1 module type PM 52 applicable as a semiconductor device, in the PM to be mounted on the semiconductor apparatus according to the embodiments.

The diode DI connected to the SiC MOSFET Q inversely in parallel is shown in FIG. 38. It can be also omitted, if using a parasitic diode as diode DI. A main electrode of the SiC MOSFET Q is expressed with a drain terminal DT and a source terminal ST.

Figure 39:
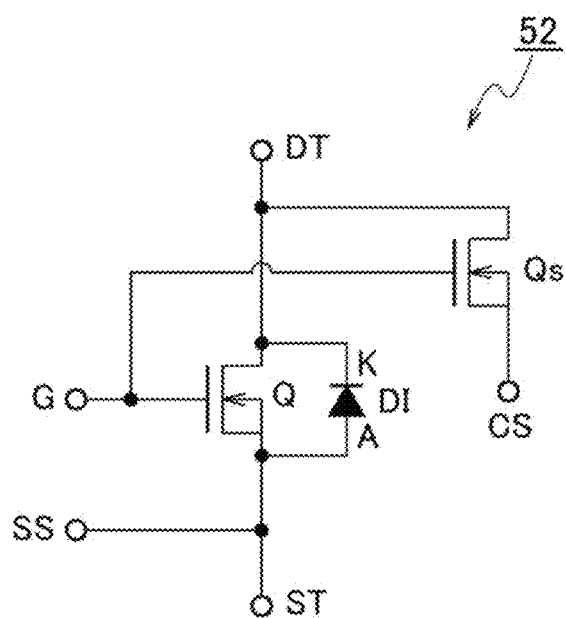
FIG. 39 is a detail circuit representative diagram of the SiC MOSFET of the 1-in-1 module, which is the PM to be mounted on the semiconductor apparatus according to the embodiments.

Moreover, FIG. 39 shows a detailed circuit representation of SiC MOSFET of 1-in-1 module type PM 52 applicable as a semiconductor device, in the PM to be mounted on the semiconductor apparatus according to the embodiments.

The PM to be mounted on the semiconductor apparatus according to the embodiments includes a configuration in which the semiconductor device is the 1-in-1 module type PM 52, for example. More specifically, one piece of the MOSFET Q is included in one module. As an example, five chips (MOSFET×5) can be mounted thereon, and a maximum of five pieces of the MOSFETs Q respectively can be connected to one another in parallel. Note that it is also possible to mount a part of five pieces of the chips for the diode DI thereon.

More particularly, as shown in FIG. 39, a sense MOSFET Qs is connected to the SiC MOSFET Q in parallel. The sense MOSFET Qs is formed as a minuteness transistor in the same chip as the SiC MOSFET Q.

In FIG. 39, reference sign SS denotes a source sense terminal, reference sign CS denotes a current sense terminal, and reference sign G denotes a gate terminal. Note that, also in the SiC MOSFET Q according to the embodiments, the sense MOSFET Qs may be formed as a minuteness transistor in the same chip.

(Circuit Configuration)

Next, a circuit configuration example of the semiconductor device in the PM to be mounted on the semiconductor apparatus according to the embodiments will now be more specifically explained.

There will now be explained a semiconductor package device (the so-called 2-in-1 type of module) in which two semiconductor devices are sealed into one mold resin, as a module applicable as the semiconductor device of the PM to be mounted on the semiconductor apparatus according to the embodiments.

Figure 40:
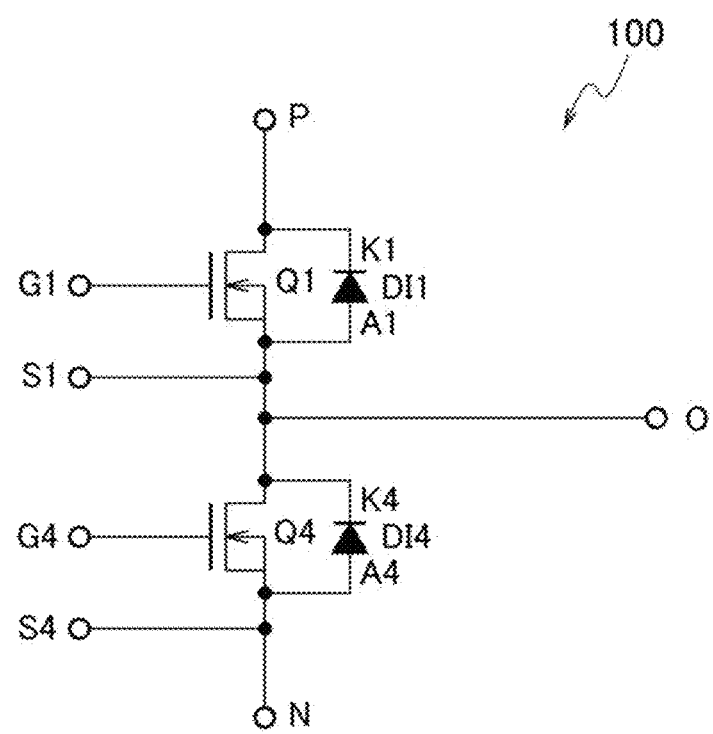
FIG. 40 is a schematic circuit representative diagram of an SiC MOSFET of a 2-in-1 module, which is the PM to be mounted on the semiconductor apparatus according to the embodiments.

FIG. 40 shows a circuit configuration of the 2-in-1 module type PM (2-in-1 module) 100 to which the SiC MOSFETs Q1 and Q4 are applied as the semiconductor device, for example.

More specifically, as shown in FIG. 40, the 2-in-1 module 100 includes a configuration of module with the built-in half-bridge in which two SiC MOSFETs Q1 and Q4 is included as one module.

Herein, each of the SiC MOSFETs Q1 and Q4 included in the module can be regarded as one large transistor, but one chip or a plurality of chips may be connected in parallel. Moreover, the modules include 1-in-1 module, 2-in-1 module, 4-in-1 module, 6-in-1 module, and the like. For example, a module containing two pieces of transistors (chips) on one module is called the 2-in-1 module, a module containing two pieces of 2-in-1 modules on one module is called the 4-in-1 module, and a module containing three pieces of 2-in-1 modules on one module is called the 6-in-1 module.

As shown in FIG. 40, the 2-in-1 module 100 includes two SiC MOSFETs Q1 and Q4, and diodes DI1 and DI4 connected in reversely parallel to the SiC MOSFETs Q1 and Q4, as one module.

In FIG. 40, reference sign G1 denotes a lead terminal for gate signal (the so-called gate terminal) of the SiC MOSFET Q1, and reference sign S1 denotes a lead terminal for source signal (the so-called source sense terminal) of the SiC MOSFET Q1. Similarly, reference sign G4 denotes a lead terminal for gate signal of the SiC MOSFET Q4, and reference sign S4 denotes a lead terminal for source signal of the SiC MOSFET Q4.

Reference sign P denotes a positive side power input terminal electrode, reference sign N denotes a negative side power input terminal electrode, and reference sign O denotes an output terminal electrode.

The semiconductor devices (Q2 and Q5) and semiconductor devices (Q3 and Q6) applicable to the PM to be mounted on the semiconductor apparatus according to the embodiments can also be similarly realized.

—Power Supply—

A power supply according to the embodiments includes the above-mentioned PM to be mounted on the semiconductor apparatus according to the embodiments. Provided is a power supply configured to convert an input voltage and output the converted input voltage, using the above-mentioned semiconductor apparatus or power module.

According to the 2-in-1 module 100 to be mounted on the semiconductor apparatus according to the embodiments, as shown in FIG. 40, an SiC MOSFET (first switching device) Q1 and an SiC MOSFET (second switching device) Q4 are connected in series between a positive side power input terminal electrode (first power source) P and a negative side power input terminal electrode (second power source) N; and the power supply (power supply circuit) configured to output the voltage of the aforementioned connecting point from the output terminal electrode O can be composed.

As the PM to be mounted on the semiconductor apparatus according to the embodiments, not only the 1-in-1 module and the 2-in-1 module, but also a 4-in-1 (four in one) module, a 6-in-1 module (six in one), a 7-in-1 (seven in one) module in which a snubber capacitor etc. is provided in the 6-in-1 module, an 8-in-1 (eight in one) module, a 12-in-1 (twelve in one) module, a 14-in-1 (fourteen in one) module, and the like can be applied.

(Device Structure)

Figure 41:
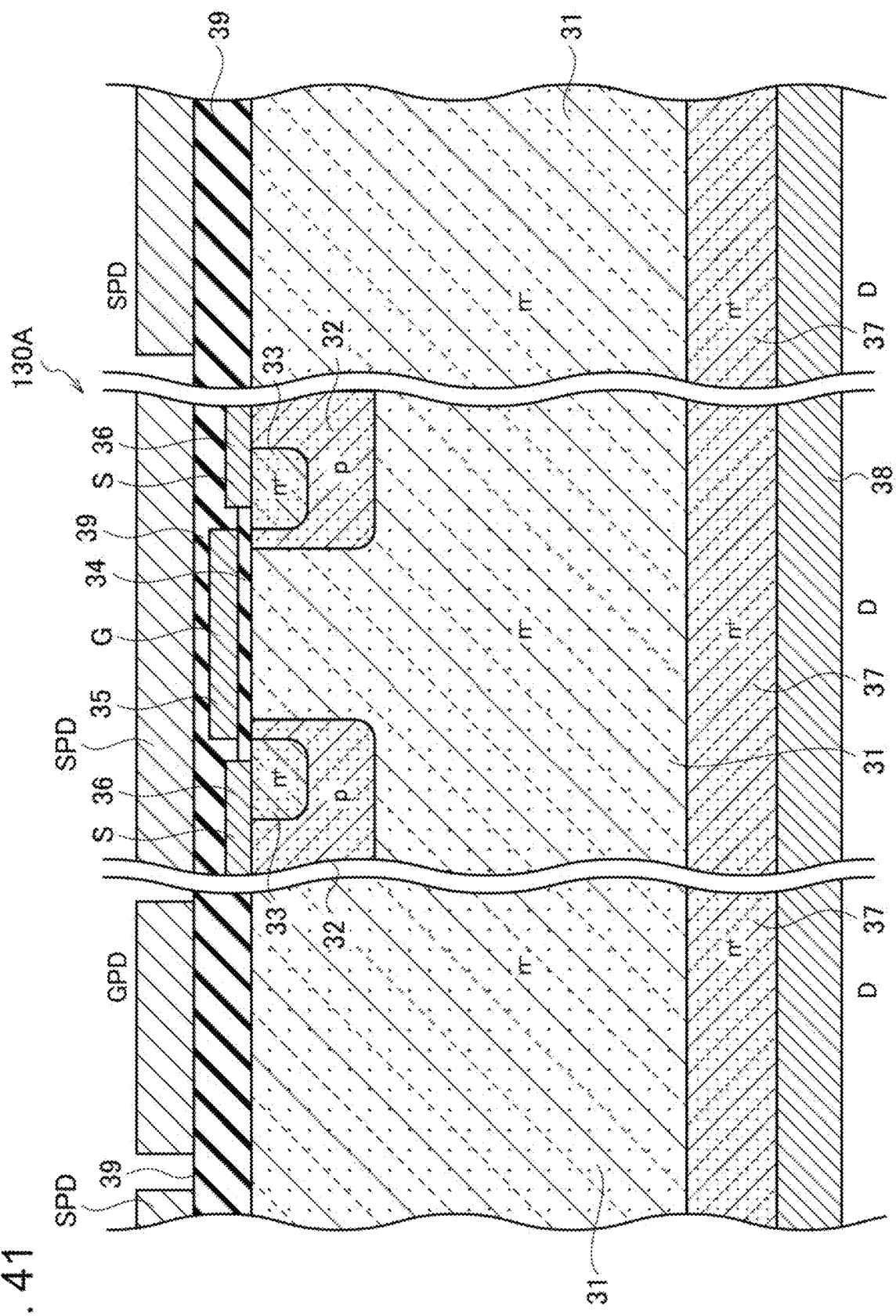
FIG. 41 is a schematic cross-sectional structure diagram showing an SiC MOSFET including a source pad electrode SP and a gate pad electrode GP, which is an example of the semiconductor device which can be applied to the PM to be mounted on the semiconductor apparatus according to the embodiments.

FIG. 41 shows a schematic cross-sectional structure of an SiC MOSFET 130A including a source pad electrode SP and a gate pad electrode GP, which is an example of the semiconductor devices (Q1 and Q4) applicable to the PM to be mounted on the semiconductor apparatus according to the embodiments.

As shown in FIG. 41, the SiC MOSFET 130A includes: a semiconductor layer 31 composed by including an n– type high resistivity layer; a p body region 32 formed on a front surface side of the semiconductor layer 31; a source region 33 formed on a front side surface of the p body region 32; a gate insulating film 34 disposed on a front side surface of the semiconductor layer 31 between the p body regions 32; a gate electrode 35 disposed on the gate insulating film 34; a source electrode 36 connected to the source region 33 and the p body region 32; an n+ drain region 37 disposed on a back side surface opposite to the surface of the semiconductor layer 31; and a drain electrode 38 connected to the n+ type drain region 37.

The gate pad electrode GP is connected to the gate electrode 35 disposed on the gate insulating film 34, and the source pad electrode SP is connected to the source electrode 36 connected to the source region 33 and the p body region 32. Moreover, as shown in FIG. 41, the gate pad electrode GP and the source pad electrode SP are disposed on an interlayer insulating film 39 for passivation which covers the surface of the SiC MOSFET 130A.

In addition, a microstructural transistor structure (not shown) may be formed in the semiconductor layer 31 below the gate pad electrode GP and the source pad electrode SP.

Furthermore, as shown in FIG. 41, the source pad electrode SP may be disposed to be extended onto the interlayer insulating film 39 for passivation, also in the transistor structure of the center portion.

Although the SiC MOSFET 130A is composed by including a planar-gate-type n channel vertical SiC-MOSFET in FIG. 41, the SiC MOSFET 130A may be composed by including a trench-gate type n channel vertical SiC-TMOSFET 130C, etc., shown in FIG. 44 mentioned below.

Alternatively, a GaN-based FET etc. instead of the SiC-MOSFET 130A can also be adopted to the semiconductor device which can be applied to the PM to be mounted on the semiconductor apparatus according to the embodiments.

The semiconductor devices ((Q2 and Q5) and (Q3 and Q6)) applicable to the PM to be mounted on the semiconductor apparatus according to the embodiments can also be similarly realized.

Furthermore, a wide-bandgap type semiconductor of which the bandgap energy is from 1.1 eV to 8 eV, for example, can be used for the semiconductor devices Q1 to Q6 applicable to the PM to be mounted on the semiconductor apparatus according to the embodiments.

Figure 42:
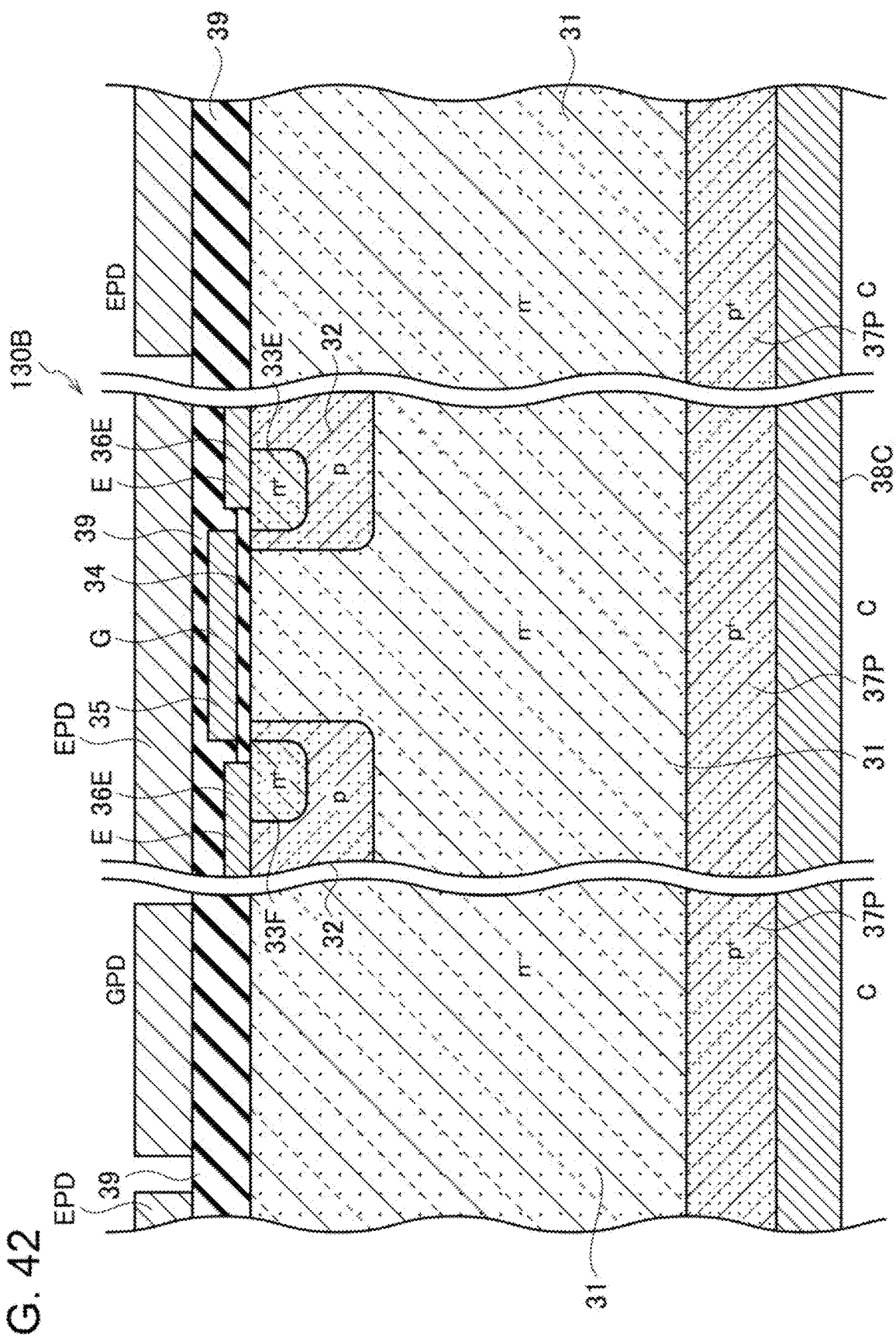
FIG. 42 is a schematic cross-sectional structure diagram showing an IGBT including an emitter pad electrode EP and a gate pad electrode GP, which is an example of the semiconductor device which can be applied to the PM to be mounted on the semiconductor apparatus according to the embodiments.

Similarly, FIG. 42 shows a schematic cross-sectional structure of an IGBT 130B including an emitter pad electrode EP and a gate pad electrode GP, which is an example of the semiconductor devices (Q1, Q4) applicable to the PM to be mounted on the semiconductor apparatus according to the embodiments.

As shown in FIG. 42, the IGBT 130B includes: a semiconductor layer 31 composed by including an n– type high resistivity layer; a p body region 32 formed on a front surface side of the semiconductor layer 31; an emitter region 33E formed on a front side surface of the p body region 32; a gate insulating film 34 disposed on a front side surface of the semiconductor layer 31 between the p body regions 32; a gate electrode 35 disposed on the gate insulating film 34; an emitter electrode 36E connected to the emitter region 33E and the p body region 32; a p+ collector region 37P disposed on a back side surface opposite to the surface of the semiconductor layer 31; and a collector electrode 38 connected to the p+ collector region 37P.

The gate pad electrode GP is connected to the gate electrode 35 disposed on the gate insulating film 34, and the emitter pad electrode EP is connected to the emitter electrode 36E connected to the emitter region 33E and the p body region 32. Moreover, as shown in FIG. 42, the gate pad electrode GP and the emitter pad electrode EP are disposed on an interlayer insulating film 39 for passivation which covers the surface of IGBT 130B.

In addition, a microstructural IGBT structure (not shown) may be formed in the semiconductor layer 31 below the gate pad electrode GP and the emitter pad electrode EP.

Furthermore, as shown in FIG. 42, the emitter pad electrode EP may be disposed to be extended onto the interlayer insulating film 39 for passivation, also in the IGBT structure of the center portion.

In FIG. 42, although the IGBT 130B is composed by including a planar-gate-type n channel vertical IGBT, the IGBT 130B may be composed by including a trench-gate-type n channel vertical IGBT, and the like.

The semiconductor devices ((Q2 and Q5) and (Q3 and Q6)) applicable to the PM to be mounted on the semiconductor apparatus according to the embodiments can also be similarly realized.

SiC based power devices, e.g. SiC DIMOSFET and SiC TMOSFET, or GaN based power devices, e.g. GaN based High Electron Mobility Transistor (HEMT), are applicable as the MOSFETs Q1 to Q6. In some instances, power devices, e.g. Si based MOSFETs and IGBT, are also applicable thereto.

—SiC DIMOSFET—

Figure 43:
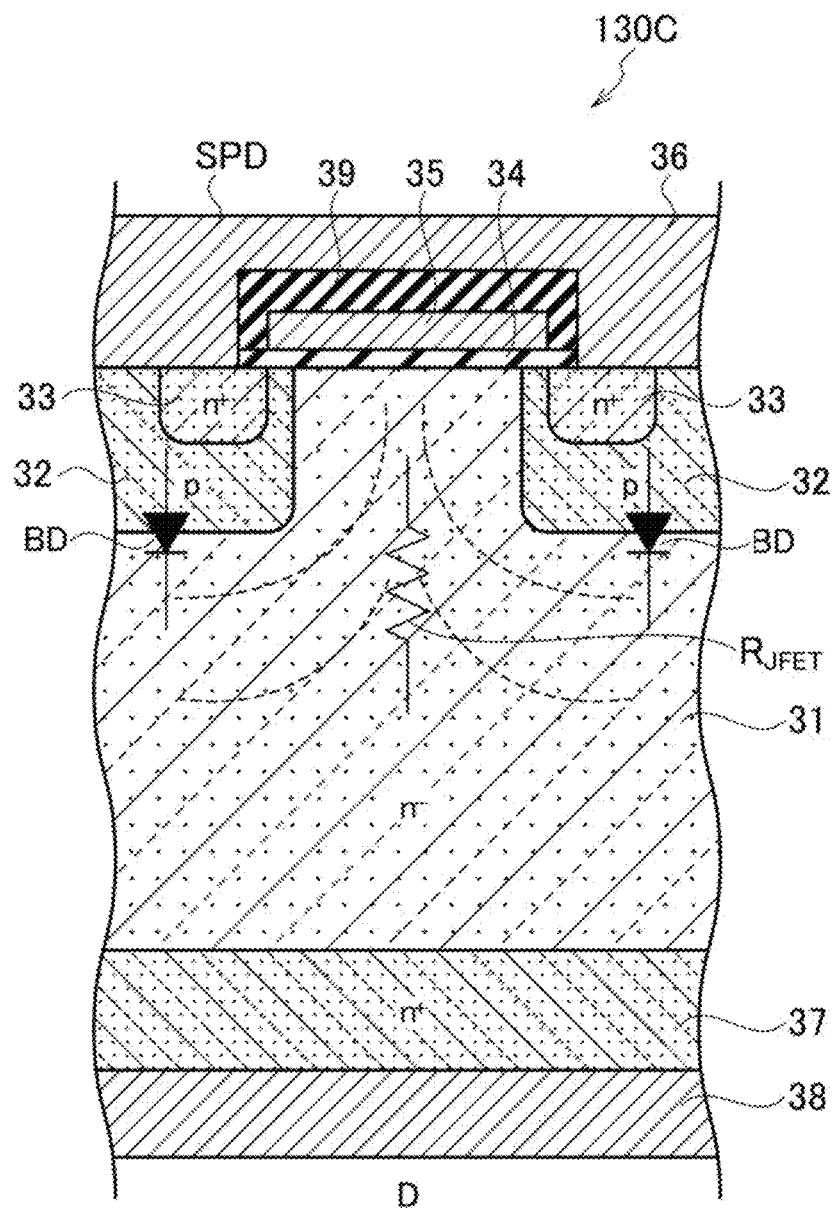
FIG. 43 is a schematic cross-sectional structure diagram of an SiC Double Implanted MOSFET (SiC DIMOSFET), which is an example of a semiconductor device which can be applied to the PM to be mounted on the semiconductor apparatus according to the embodiments.

FIG. 43 shows a schematic cross-sectional structure of an SiC DIMOSFET 130C, which is an example of a semiconductor device 110 which can be applied to the PM to be mounted on the semiconductor apparatus according to the embodiments.

As shown in FIG. 43, the SiC DIMOSFET 130C includes: a semiconductor layer 31 composed by including an n– type high resistivity layer; a p body region 32 formed on a front surface side of the semiconductor layer 31; an n+ source region 33 formed on a front side surface of the p body region 32; a gate insulating film 34 disposed on a front side surface of the semiconductor layer 31 between the p body regions 32; a gate electrode 35 disposed on the gate insulating film 34; a source electrode 36 connected to the source region 33 and the p body region 32; an n+ drain region 37 disposed on a back side surface opposite to the surface of the semiconductor layer 31; and a drain electrode 38 connected to the n+ type drain region 37.

In the SiC DIMOSFET 130C shown in FIG. 43, the p body region 32 and the n+ source region 33 formed on the front side surface of the p body region 32 are formed with double ion implantation (DII), and the source pad electrode SP is connected to the source region 33 and the source electrode 36 connected to the p body region 32.

Moreover, a gate pad electrode GP (not shown) is connected to the gate electrode 35 disposed on the gate insulating film 34. Moreover, as shown in FIG. 43, the gate pad electrode GP and the source pad electrode SP are disposed on an interlayer insulating film 39 for passivation which covers the surface of the SiC DIMOSFET 130C.

As shown in FIG. 43, in the SiC DIMOSFET 130C, since a depletion layer as shown with the dashed lines is formed in the semiconductor layer 31 composed of a n– type high resistivity layer inserted into the p body regions 32, channel resistance $R_{JFET}$ accompanying the junction type FET (JFET) effect is formed. Moreover, as shown in FIG. 43, body diodes BD are respectively formed between the p body regions 32 and the semiconductor layers 31.

—SiC TMOSFET—

Figure 44:
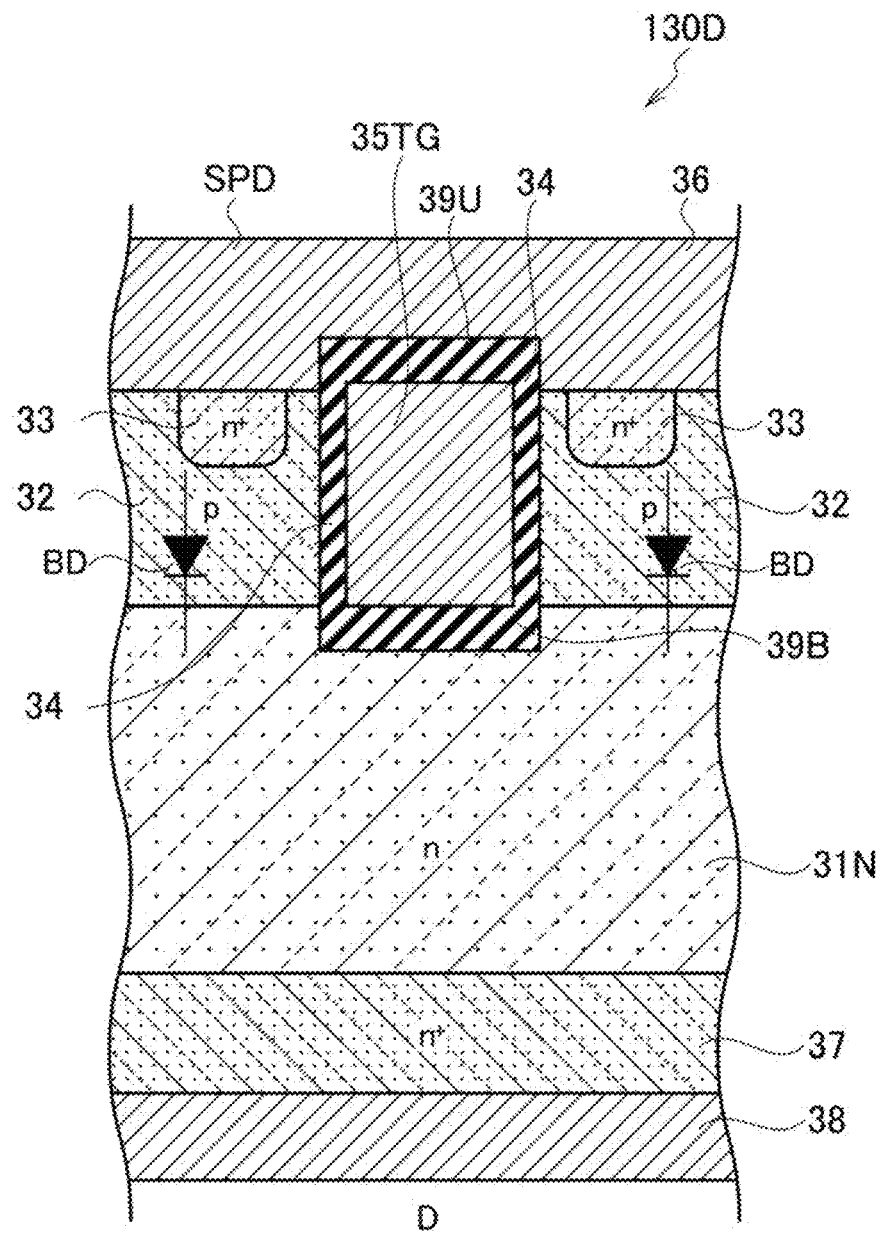
FIG. 44 is a schematic cross-sectional structure diagram of an SiC Trench MOSFET (SiC TMOSFET), which is an example of the semiconductor device which can be applied to the PM to be mounted on the semiconductor apparatus according to the embodiments.

FIG. 44 shows a schematic cross-sectional structure of an SiC TMOSFET, which is an example of a semiconductor device which can be applied to the PM to be mounted on the semiconductor apparatus according to the embodiments.

As shown in FIG. 44, the SiC TMOSFET 130D includes: a semiconductor layer 31N composed by including an n layer; a p body region 32 formed on a front surface side of the semiconductor layer 31N; an n+ source region 33 formed on a front side surface of the p body region 32; a trench gate electrode 35TG passing through the p body region 32, the trench gate electrode 35TG formed in the trench formed up to the semiconductor layer 31N via the gate insulating film 34 and the interlayer insulating films 39U and 39B; a source electrode 36 connected to the source region 33 and the p body region 32; an n+ drain region 37 disposed on a back side surface opposite to the surface of the semiconductor layer 31N; and a drain electrode 38 connected to the n+ type drain region 37.

In FIG. 44, in the SiC TMOSFET 130D, a trench gate electrode 35TG passing through the p body region 32 is formed in the trench formed up to the semiconductor layer 31N via the gate insulating film 34 and the interlayer insulating films 39U and 39B; and the source pad electrode SP is connected to the source region 33 and the source electrode 36 connected to the p body region 32.

Moreover, a gate pad electrode GP (not shown) is connected to the trench gate electrode 35TG disposed on the gate insulating film 34. Moreover, as shown in FIG. 44, the gate pad electrode GP and the source pad electrode SP are disposed on an interlayer insulating film 39U for passivation which covers the surface of the SiC TMOSFET 130D.

In the SiC TMOSFET 130D, channel resistance $R_{JFET}$ accompanying the junction type FET (JFET) effect as the SiC DIMOSFET 130C is not formed. Moreover, body diodes BD are respectively formed between the p body regions 32 and the semiconductor layers 31N, in the same manner as FIG. 43.

Example of Application

Figure 45:
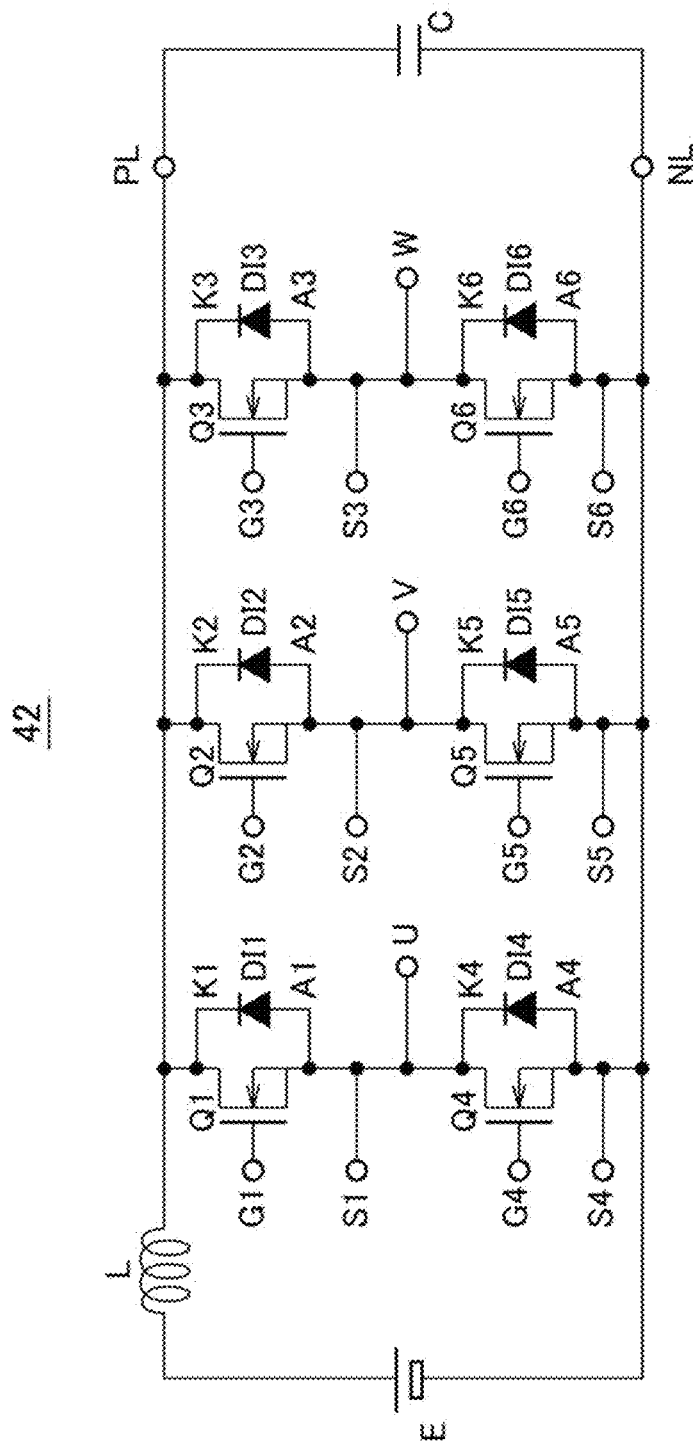
FIG. 45 shows an example of a circuit configuration in which the SiC MOSFET is applied as a semiconductor device, and a snubber capacitor is connected between a power terminal PL and an earth terminal (ground terminal) NL, in a circuit configuration of a three-phase alternating current (AC) inverter composed by including the PM to be mounted on the semiconductor apparatus according to the embodiments.

FIG. 45 shows an example of a circuit configuration in which the SiC MOSFET is applied as a semiconductor device, and a snubber capacitor C is connected between the power terminal PL and the earth terminal (ground terminal) NL, in a three-phase AC inverter 42 composed using the PM to be mounted on the semiconductor apparatus according to the embodiments.

When connecting the PM according to the embodiments to the power source E to execute switching operations, large surge voltage Ldi/dt is produced by an inductance L included in a connection line due to a high switching speed of the SiC MOSFET and IGBT. For example, the surge voltage Ldi/dt is expressed as follows: $di/dt=3\times10^9$ (A/s), where a current change di=300 A, and a time variation accompanying switching dt=100 ns.

Although a value of the surge voltage Ldi/dt changes dependent on a value of the inductance L, the surge voltage Ldi/dt is superimposed on the power source E. Such a surge voltage Ldi/dt can be absorbed by the snubber capacitor C connected between the power terminal PL and the earth terminal (ground terminal) NL.

Concrete Example

Next, there will now be explained the three-phase AC inverter 44 composed using the PM to be mounted on the semiconductor apparatus according to the embodiments to which the SiC MOSFET is applied as the semiconductor device, with reference to FIG. 46.

Figure 46:
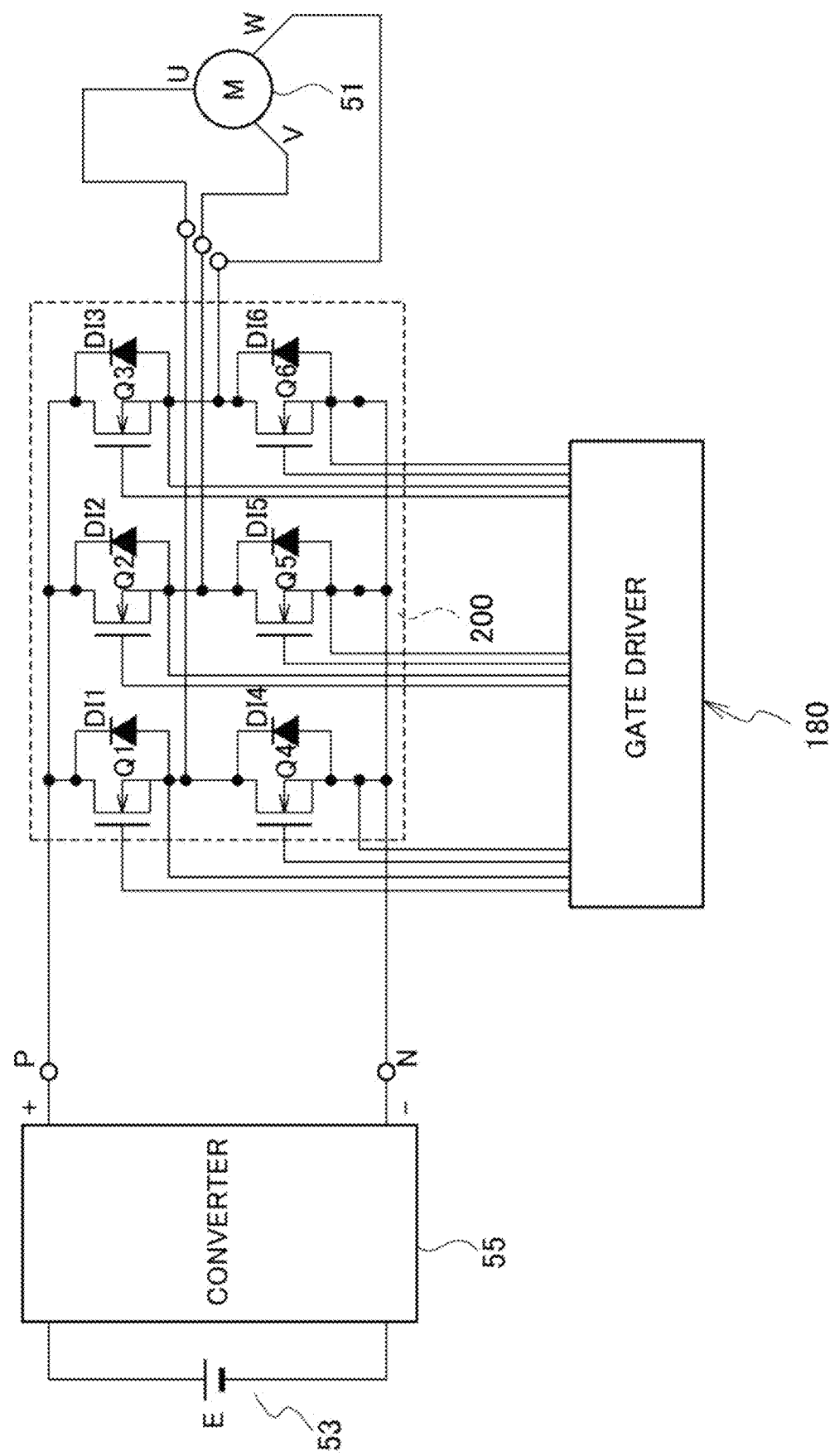
FIG. 46 shows an example of a circuit configuration in which the SiC MOSFET is applied as the semiconductor device, in a circuit configuration of a three-phase AC inverter composed by including the PM to be mounted on the semiconductor apparatus according to the embodiments.

As shown in FIG. 46, the three-phase AC inverter 44 includes: a PM unit 200 connected to a gate driver (GD) 180; a three-phase AC motor unit 51; a power supply or storage battery (E) 53; and a converter 55. U-phase, V-phase, and W-phase inverters are respectively connected to the three-phase AC motor unit 51 so as to correspond to U phase, V phase, and W phase of the three-phase AC motor unit 51, in the PM unit 200.

In this case, the GD 180 is connected to SiC MOSFETs Q1 and Q4, SiC MOSFETs Q2 and Q5, and SiC MOSFETs Q3 and Q6.

The PM unit 200 includes the SiC MOSFETs (Q1 and Q4), (Q2 and Q5), and (Q3 and Q6) having inverter configurations connected between a positive terminal (+) P and a negative terminal (−) N of the converter 55 to which the power supply or storage battery (E) 53 is connected. Moreover, flywheel diodes DI1 to DI6 are respectively connected reversely in parallel between the source and the drain of the SiC MOSFETs Q1 to Q6.

According to the embodiments, there can be provided the air-cooling type semiconductor apparatus, PM, and power supply, each having high heat dissipation performance and realizing light weight.

As the semiconductor device applicable to the PM to be mounted on the semiconductor apparatus according to the embodiments, not only SiC based power devices but also wide-bandgap type power devices, e.g. GaN-based or Si-based power device, can be adopted.

Moreover, it can be applied to not only molded-type PMs by which resin molding is performed but also PMs packaged with case type packages.

Other Embodiments

As explained above, the embodiments have been described, as a disclosure including associated description and drawings to be construed as illustrative, not restrictive. This disclosure makes clear a variety of alternative embodiments, working examples, and operational techniques for those skilled in the art.

Such being the case, the embodiments cover a variety of embodiments, whether described or not.

INDUSTRIAL APPLICABILITY

The power semiconductor apparatus, the PM, and the power supply according to the embodiments can be used for semiconductor module techniques including power supplies, e.g. IGBT modules, diode modules, MOS modules (Si, SiC, GaN, Gallium oxide), etc., and can be applied for wide applicable fields, e.g. inverters for Hybrid Electric Vehicles (HEVs)/Electric Vehicles (EVs), industrial inverters or converters.

What is claimed is:

1. A semiconductor apparatus comprising:
a thermal source comprising a semiconductor device, the semiconductor device generating heat in an operating state;
a thermal diffusion unit that is thermally connected to the thermal source and forms a space at a position opposite to the thermal source by means of a first portion extending from a connecting portion with the thermal source to both sides along a first direction parallel to a connecting surface with the thermal source and second and third portions respectively extending from both ends of the first portion in a second direction opposite to the thermal source;

a first thermal conduction layer attached to a space-side surface of the second portion, and a second thermal conduction layer attached to a space-side surface of the third portion;

a first heat dissipation unit that is attached to the first thermal conduction layer and has a first base unit and a plurality of first fin units arranged so as to extend in the space from the first base unit; and a second heat dissipation unit that is attached to the second thermal conduction layer and has a second base unit and a plurality of second fin units arranged so as to extend in the space from the second base unit.

2. The semiconductor apparatus according to claim 1, wherein air flows in a direction orthogonal to a surface formed by the first to third portions.

3. The semiconductor apparatus according to claim 2, wherein the first and second base units comprise a graphite substrate having an anisotropic thermal conductivity.

4. The semiconductor apparatus according to claim 1, further comprising a thermal contact space unit surrounded with the thermal diffusion unit, the thermal contact space unit spatially containing the plurality of first fin units and the plurality of second fin units.

5. The semiconductor apparatus according to claim 1, wherein the thermal diffusion unit comprises Cu or a vapor chamber.

6. The semiconductor apparatus according to claim 1, wherein the semiconductor device comprises any one selected from a group consisting an Si based or SiC based IGBT, a diode, a MOSFET, and a GaN based FET.

7. The semiconductor apparatus according to claim 1, wherein tips of the first and second plurality of fin units extend into the space to a position directly under a position where the semiconductor device is disposed.

8. The semiconductor apparatus according to claim 1, wherein a length of the first and second plurality of fin units is longer than a distance between the first fin unit and the second fin unit facing each other in the space.

9. The semiconductor apparatus according to claim 1, wherein the first and second thermal conduction layers are soldering layers.

10. The semiconductor apparatus according to claim 1, wherein the first and second base units and the first and second plurality of fin units are composed of a same material.

11. The semiconductor apparatus according to claim 1, wherein the first and second base units and the first and second plurality of fin units are composed of materials different from each other.

\* \* \* \* \*